US011309687B2

(12) United States Patent
Hirose et al.

(10) Patent No.: US 11,309,687 B2
(45) Date of Patent: Apr. 19, 2022

(54) LIGHT-EMITTING DEVICE AND PRODUCTION METHOD FOR SAME

(71) Applicant: HAMAMATSU PHOTONICS K.K., Hamamatsu (JP)

(72) Inventors: Kazuyoshi Hirose, Hamamatsu (JP); Yoshitaka Kurosaka, Hamamatsu (JP); Yuu Takiguchi, Hamamatsu (JP); Takahiro Sugiyama, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 23 days.

(21) Appl. No.: 16/769,828

(22) PCT Filed: Nov. 28, 2018

(86) PCT No.: PCT/JP2018/043813
§ 371 (c)(1),
(2) Date: Jun. 4, 2020

(87) PCT Pub. No.: WO2019/111786
PCT Pub. Date: Jun. 13, 2019

(65) Prior Publication Data
US 2020/0373740 A1 Nov. 26, 2020

(30) Foreign Application Priority Data
Dec. 8, 2017 (JP) .............................. JP2017-236201

(51) Int. Cl.
*H01S 5/22* (2006.01)
*H01S 5/042* (2006.01)
(Continued)

(52) U.S. Cl.
CPC ............ *H01S 5/222* (2013.01); *H01S 5/0427* (2013.01); *H01S 5/06246* (2013.01); *H01S 5/18361* (2013.01)

(58) Field of Classification Search
CPC .... H01S 5/222; H01S 5/0427; H01S 5/06246; H01S 5/18361; H01S 5/11; H01S 5/0287; H01S 5/04256
See application file for complete search history.

(56) References Cited

U.S. PATENT DOCUMENTS 9,991,669 B2 * 6/2018 Hirose ...................... H01S 5/11
10,389,088 B2 * 8/2019 Kurosaka ................ H01S 5/423
(Continued)

FOREIGN PATENT DOCUMENTS

JP  2007-073571 A  3/2007
JP  5373717 B2  12/2013
(Continued)

OTHER PUBLICATIONS

Hirose, Kazuyoshi et al., "Watt-class high-power, high-beam-quality photonic-crystal lasers," Nature Phoronics, vol. 8, 2014, pp. 406-411.

(Continued)

*Primary Examiner* — Tuan N Nguyen
(74) *Attorney, Agent, or Firm* — Faegre Drinker Biddle & Reath LLP

(57) ABSTRACT

The present embodiment relates to a light-emitting device or the like having a structure capable of reducing one power of ±1st-order light with respect to the other power. The light-emitting device includes a substrate, a light-emitting portion, and a phase modulation layer including a base layer and a plurality of modified refractive index regions. Each of the plurality of modified refractive index regions has a three-dimensional shape defined by a first surface facing the substrate, a second surface positioned on a side opposite to the substrate with respect to the first surface, and a side surface. In the three-dimensional shape, at least one of the (Continued)

first surface, the second surface, and the side surface has a portion inclined with respect to a main surface.

15 Claims, 60 Drawing Sheets

(51) Int. Cl.
*H01S 5/062* (2006.01)
*H01S 5/183* (2006.01)

(56) References Cited

U.S. PATENT DOCUMENTS

2012/0002692 A1* 1/2012 Noda .................. H01S 5/11
372/43.01
2014/0211822 A1 7/2014 Fattal et al.

FOREIGN PATENT DOCUMENTS

WO WO-2014/175447 A1 10/2014
WO WO-2016/148075 A1 9/2016

OTHER PUBLICATIONS

Kurosaka, Y. et al., "Effects of non-lasing band in two-dimensional photonic-crystal lasers clarified using omnidirectional band structure," Optics Express, vol. 20, 2012, pp. 21773-21783.

Kurosaka, Yoshitaka et al., "Phase-modulating lasers toward on-chip integration," Scientific Reports, Jul. 26, 2016, vol. 6, p. 30138.

Nishimoto, Masaya et al., "Design of photonic-crystal surface-emitting lasers with circularly-polarized beam," Optics Express, vol. 25, 2017, p. 6104-p. 6111.

Nishimoto, Masaya et al., "Fabrication of photonic crystal lasers by MBE air-hole retained growth," Applied Physics Express, Aug. 19, 2014, vol. 7, p. 092703-1-p. 092703-3.

Peng, C. et al., "Coupled-wave analysis for photonic-crystal surface-emitting lasers on air holes with arbitrary sidewalls," Optics Express, vol. 19, No. 24, 2011, p. 24672-p. 24686.

Sakai, K. et al., "Coupled-Wave Theory for Square-Lattice Photonic Crystal Lasers With TE Polarization," IEEE J.Q. E., vol. 46, 2010, p. 788-p. 795.

Suzuki, Katsuyoshi et al., "Three-dimensional photonic crystals created by single-step multi-directional plasma etching," Optics Express, vol. 22, 2014, p. 17099-p. 17106.

Takahashi, Shigeki et al., "Direct creation of three-dimensional photonic crystals by a top-down approach," Nature Materials, 2009, vol. 8, p. 721-p. 725.

International Preliminary Report on Patentability dated Jun. 18, 2020 for PCT/JP2018/043813.

* cited by examiner

Fig.6
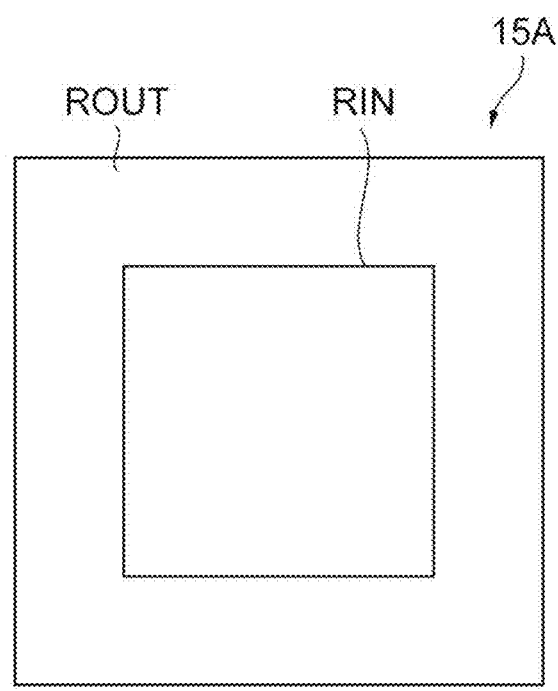
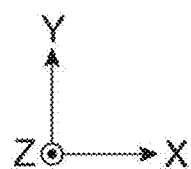

Fig.9A

| A2 | A1 |
|----|----|
| A3 | A4 |

ORIGINAL

Fig.9B

| A4          | A3          |
| A2 ROTATION | A1 ROTATION |
| A1          | A2          |
| A3 ROTATION | A4 ROTATION |

OBTAINED BEAM PATTERN

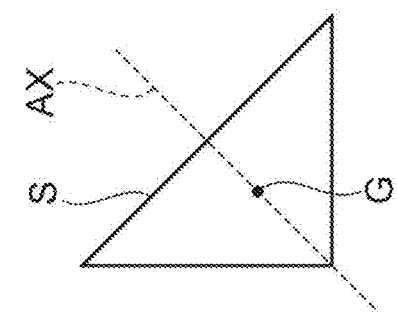
Fig.18A
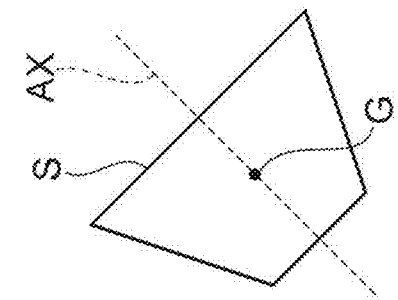
Fig.18B
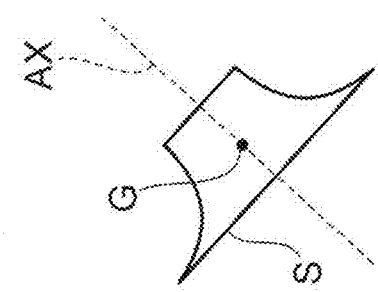
Fig.18C
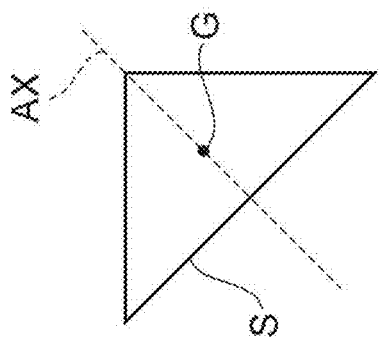
Fig.18D
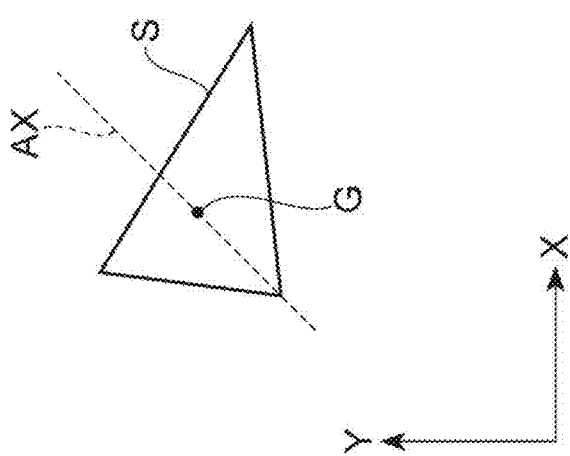
Fig.18E
Fig.18F
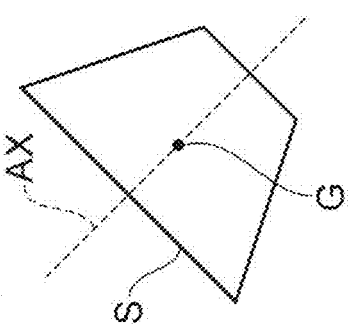
Fig.18G
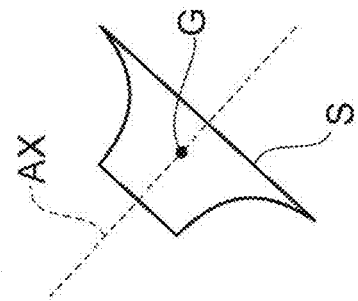
Fig.18H

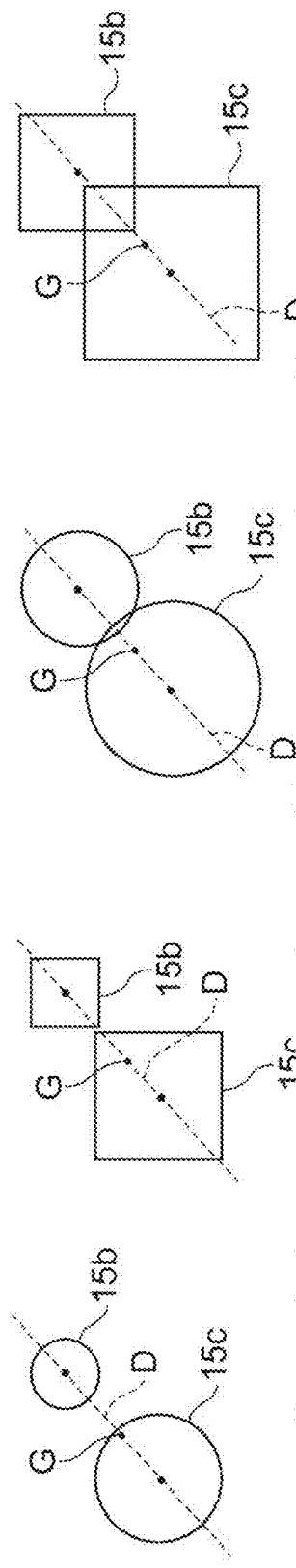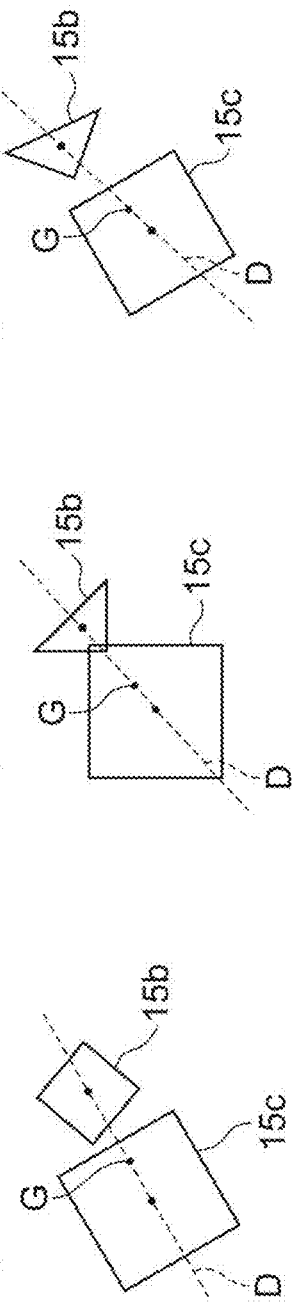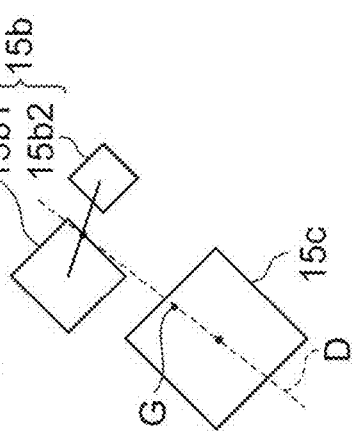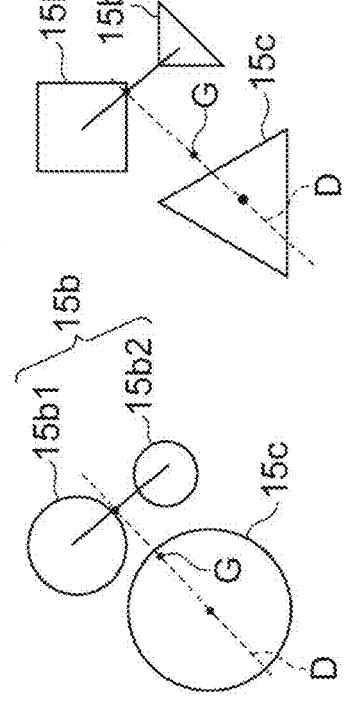

Fig.30

| LAYER NUMBER | CONDUCTIVITY TYPE | LAYER STRUCTURE | FILM THICKNESS (nm) | REFRACTIVE INDEX |
|---|---|---|---|---|
| 1 | P TYPE | GaAs CONTACT LAYER | 100 | 3.55 |
| 2 | P TYPE | AlGaAs CLADDING LAYER | 700 | 3.12 |
| 3 | I TYPE | PHASE MODULATION LAYER (GaAs/CAVITY, CAVITY FF = 15%) | 250 | 3.30 |
| 4 | I TYPE | InGaAs/AlGaAs ACTIVE LAYER | 225 | 3.46 |
| 5 | N TYPE | AlGaAs CLADDING LAYER | 2000 | 3.27 |

Fig.32

| LAYER NUMBER | CONDUCTIVITY TYPE | LAYER STRUCTURE | FILM THICKNESS (nm) | REFRACTIVE INDEX |
|---|---|---|---|---|
| 1 | P TYPE | GaInAsP(Eg=1.15eV) CONTACT LAYER | 100 | 3.35 |
| 2 | P TYPE | InP CLADDING LAYER | 1000 | 3.21 |
| 3 | I TYPE | PHASE MODULATION LAYER (GaInAsP (Eg = 1.0 eV)/CAVITY, CAVITY FF = 15%) | 300 | 3.20 |
| 4 | I TYPE | GaInAsP ACTIVE LAYER | 275 | 3.42 |
| 5 | N TYPE | InP CLADDING LAYER | 2000 | 3.21 |

Fig.34

| LAYER NUMBER | CONDUCTIVITY TYPE | LAYER STRUCTURE | FILM THICKNESS (nm) | REFRACTIVE INDEX |
|---|---|---|---|---|
| 1 | P TYPE | GaN CONTACT LAYER | 100 | 2.55 |
| 2 | P TYPE | AlGaN CLADDING LAYER | 600 | 2.53 |
| 3 | P TYPE | AlGaN CARRIER BARRIER LAYER | 20 | 2.48 |
| 4 | I TYPE | InGaN ACTIVE LAYER | 130 | 2.59 |
| 5 | N TYPE | GaN GUIDE LAYER | 150 | 2.55 |
| 6 | N TYPE | PHASE MODULATION LAYER (GaN/CAVITY, CAVITY FF = 15%) | 100 | 2.39 |
| 7 | N TYPE | AlGaN CLADDING LAYER | 2000 | 2.54 |

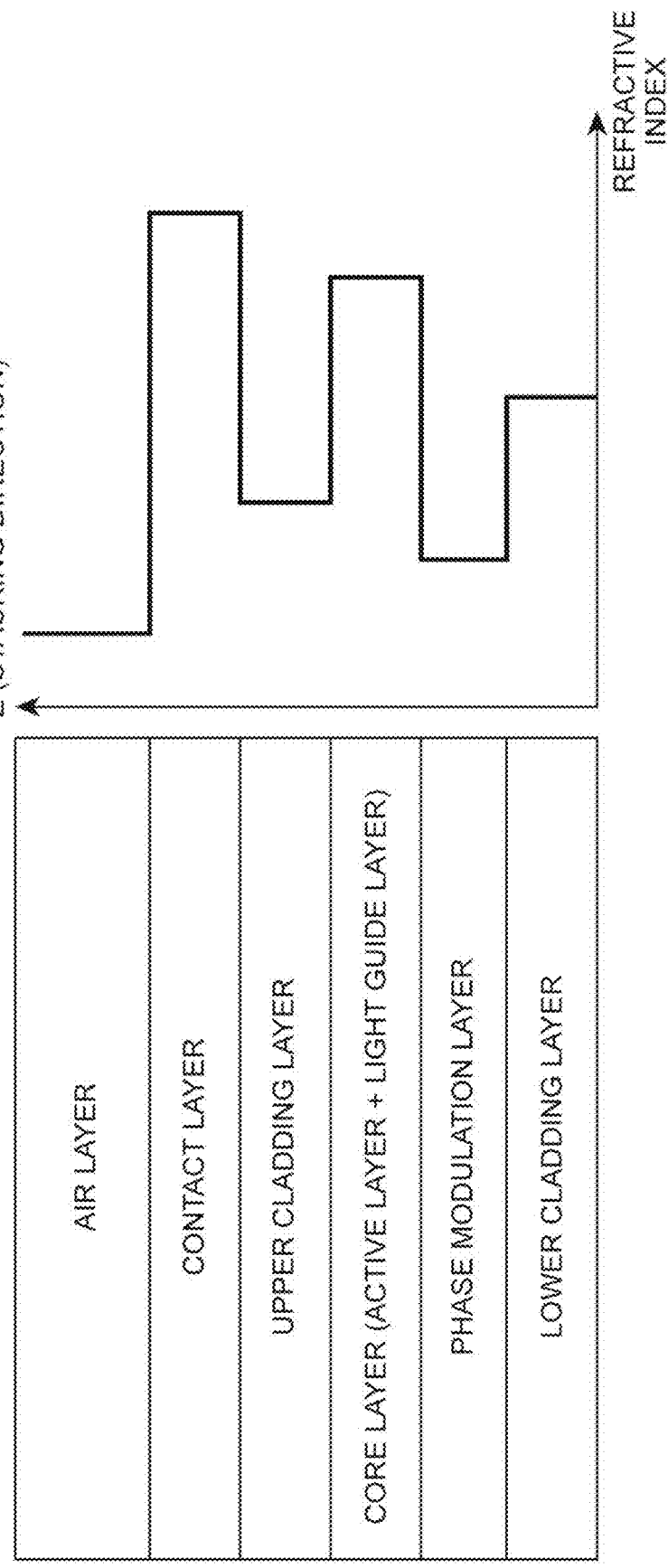

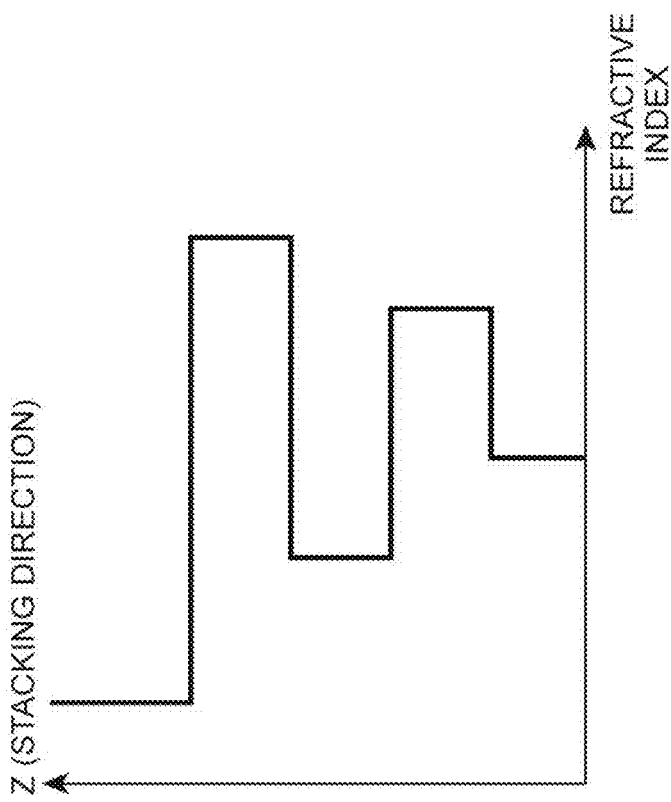
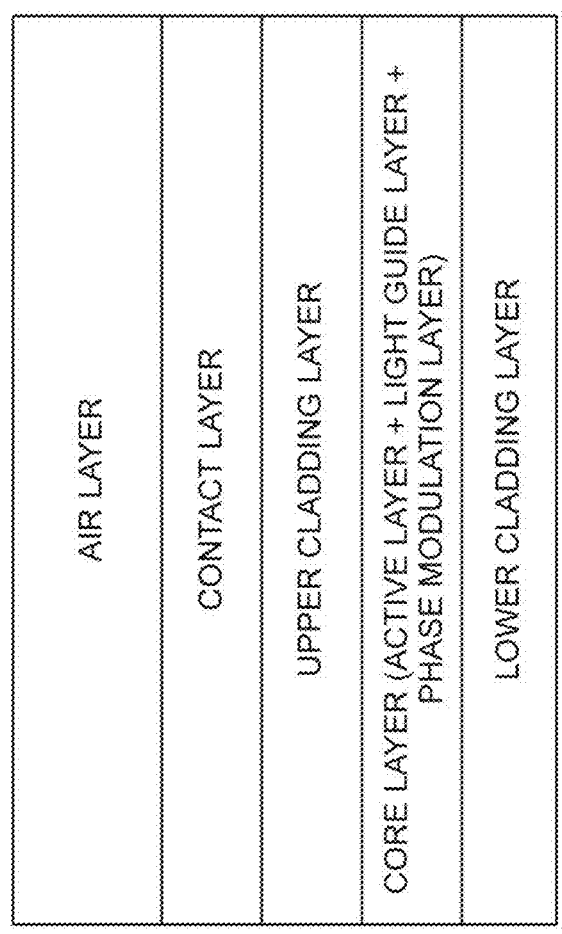
Fig.37A
Fig.37B

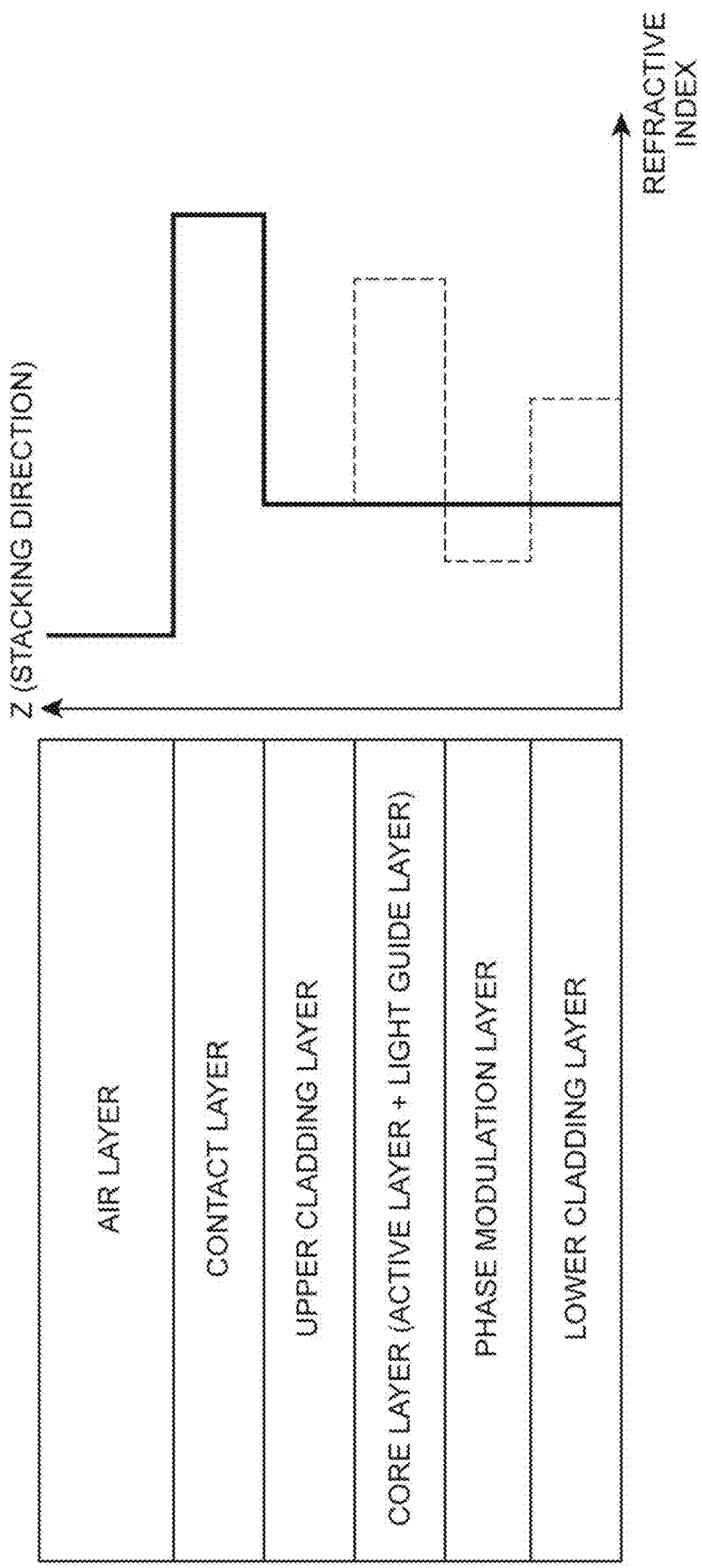

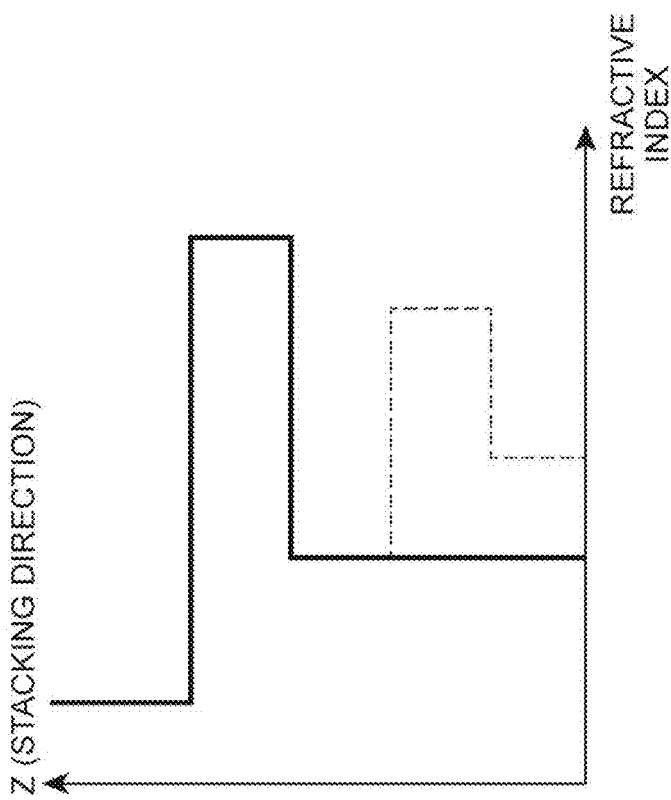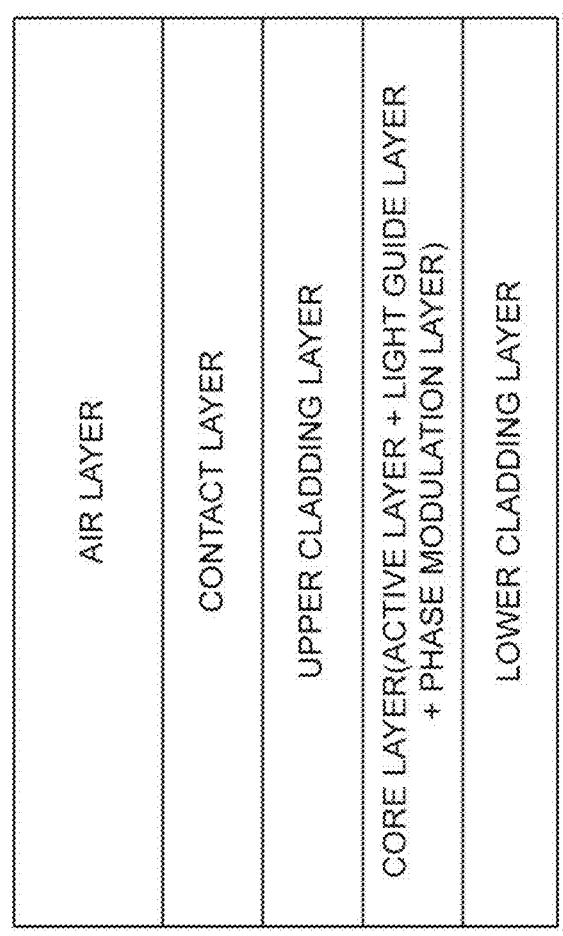

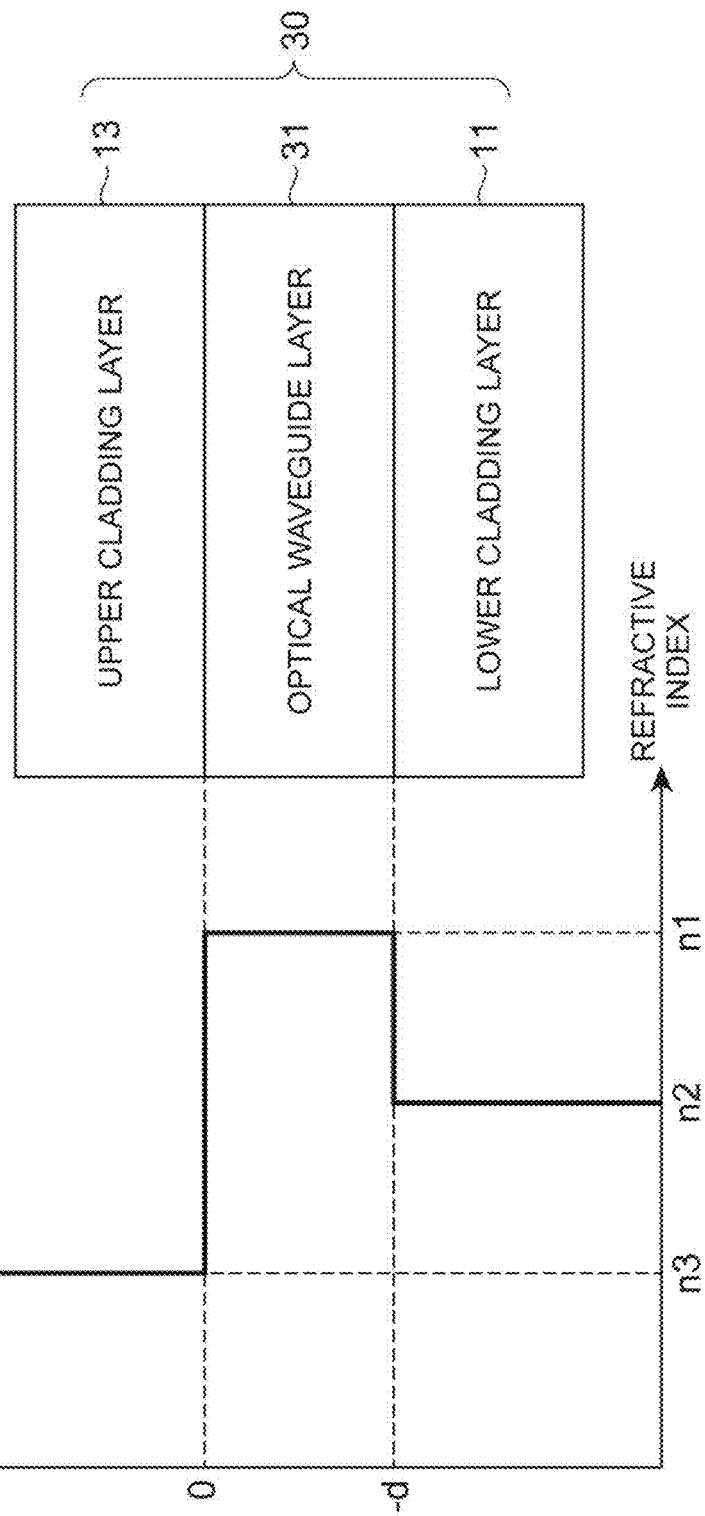

Fig.43

| LAYER NUMBER | CONDUCTIVITY TYPE | LAYER STRUCTURE | FILM THICKNESS (nm) | REFRACTIVE INDEX |
|---|---|---|---|---|
| 1 | − | AIR | ∞ | 1.00 |
| 2 | P TYPE | GaAs CONTACT LAYER | 100 | 3.55 |
| 3 | P TYPE | AlGaAs CLADDING LAYER | 700 | 3.12 |
| 4 | I TYPE | CORE LAYER (PHASE MODULATION + QUANTUM WELL + GUIDE LAYER) | 475 | 3.38 |
| 5 | N TYPE | AlGaAs CLADDING LAYER | 2000 | 3.27 |

Fig.44A

| WAVELENGTH | 940nm |
|---|---|
| $n_1$ | 3.38 |
| $n_2$ | 3.27 |
| $n_3$ | 3.12 |
| $a'$ | 1.40 |
| $n_{clad}$ | 3.12 |

Fig.44B

| ORDER | $V_1$ | FILM THICKNESS (nm) |
|---|---|---|
| 0 | 0.869 | 157 |
| 1 | 4.01 | 723 |

*Fig.46A*

| WAVELENGTH | 940nm |
|---|---|
| $n_4$ | 3.55 |
| $n_5$ | 3.12 |
| $n_6$ | 1.00 |
| a' | 3.04 |
| $n_{clad}$ | 3.27 |

*Fig.46B*

| b | $V_2$ | FILM THICKNESS (nm) |
|---|---|---|
| 0.335 | 2.17 | 192 |

Fig.49

| LAYER NUMBER | CONDUCTIVITY TYPE | LAYER STRUCTURE | FILM THICKNESS (nm) | REFRACTIVE INDEX |
|---|---|---|---|---|
| 1 | — | AIR | ∞ | 1.00 |
| 2 | P TYPE | GaInAsP(Eg=1.15eV) CONTACT LAYER | 100 | 3.35 |
| 3 | P TYPE | InP CLADDING LAYER | 1000 | 3.21 |
| 4 | I TYPE | PHASE MODULATION LAYER (GaInAsP (Eg = 1.0 eV)/CAVITY, CAVITY FF = 15%) | 300 | 3.20 |
| 5 | I TYPE | CORE LAYER (QUANTUM WELL + GUIDE LAYER) | 275 | 3.42 |
| 6 | N TYPE | InP CLADDING LAYER | ∞ | 3.21 |

*Fig.50A*

| WAVELENGTH | 1300nm |
|---|---|
| $n_1$ | 3.42 |
| $n_2$ | 3.21 |
| $n_3$ | 3.20 |
| $a'$ | 0.0267 |
| $n_{clad}$ | 3.21 |

*Fig.50B*

| b | $V_2$ | FILM THICKNESS (nm) |
|---|---|---|
| 0 | 0.162 | 28 |
| 0 | 3.30 | 579 |

*Fig.52A*

| WAVELENGTH | 1300nm |
|---|---|
| $n_4$ | 3.35 |
| $n_5$ | 3.21 |
| $n_6$ | 1.00 |
| a' | 10.1 |
| $n_{clad}$ | 3.21 |

*Fig.52B*

| b | $V_2$ | FILM THICKNESS (nm) |
|---|---|---|
| 0 | 1.27 | 273 |

Fig.55

| LAYER NUMBER | CONDUCTIVITY TYPE | LAYER STRUCTURE | FILM THICKNESS (nm) | REFRACTIVE INDEX |
|---|---|---|---|---|
| 1 | – | AIR | ∞ | 1.00 |
| 2 | P TYPE | GaN CONTACT LAYER | 100 | 2.55 |
| 3 | P TYPE | AlGaN CLADDING LAYER | 600 | 2.53 |
| 4 | I/N TYPE | CORE LAYER (QUANTUM WELL + GUIDE LAYER) | 300 | 2.57 |
| 5 | N TYPE | PHASE MODULATION LAYER (GaN/CAVITY, CAVITY FF = 15%) | 100 | 2.39 |
| 6 | N TYPE | AlGaN CLADDING LAYER | ∞ | 2.54 |

*Fig.56A*

| WAVELENGTH | 405nm |
|---|---|
| $n_1$ | 2.57 |
| $n_2$ | 2.53 |
| $n_3$ | 2.39 |
| a' | 3.59 |
| $n_{clad}$ | 2.54 |

*Fig.56B*

| b | $V_1$ | FILM THICKNESS (nm) |
|---|---|---|
| 0.224 | 1.86 | 273 |
| 0.224 | 5.43 | 795 |

Fig.58A

| WAVELENGTH | 405nm |
|---|---|
| n4 | 2.55 |
| n5 | 2.53 |
| n6 | 1.00 |
| a' | 40.8 |
| nclad | 2.54 |

Fig.58B

| b | V2 | FILM THICKNESS (nm) |
|---|---|---|
| 0.33 | 2.51 | 445 |

LIGHT-EMITTING DEVICE AND PRODUCTION METHOD FOR SAME

TECHNICAL FIELD

The present invention relates to a light-emitting device and a production method for the same.

BACKGROUND ART

Patent Document 1 describes a technique relating to a semiconductor light-emitting element as a light-emitting device. The semiconductor light-emitting element includes an active layer, a pair of cladding layers sandwiching the active layer, and a phase modulation layer optically coupled to the active layer. The phase modulation layer has a base layer and a plurality of modified refractive index regions each of which has a refractive index different from a refractive index of the base layer. When an XYZ orthogonal coordinate system with a thickness direction of the phase modulation layer as a Z-axis direction is set, and a virtual square lattice with a lattice interval a is set in an X-Y plane corresponding to a design plane of the phase modulation layer, each of the modified refractive index regions is disposed so that each position of gravity center is shifted by a distance r from a lattice point in the virtual square lattice (the lattice point associated with any of the modified refractive index regions). The distance r satisfies $0<r\leq 0.3a$.

CITATION LIST

Patent Literature

Patent Document 1: PCT International Application Publication No. 2016/148075

SUMMARY OF INVENTION

Technical Problem

As a result of examining the conventional light-emitting devices, the inventors have found out the following problems. That is, the light-emitting device that outputs an arbitrary optical image by controlling a phase spectrum and an intensity spectrum of light has been studied. One of the structures of such a light-emitting device is a structure including a phase modulation layer provided on a substrate. The phase modulation layer has a base layer and a plurality of modified refractive index regions each of which has a refractive index different from a refractive index of the base layer. When a virtual square lattice is set on a plane (design plane) orthogonal to the thickness direction of this phase modulation layer, each of the modified refractive index regions is arranged such that each position of gravity centers is shifted from a position of a corresponding lattice point of the virtual square lattice according to an optical image that needs to be output. Such a light-emitting device is called static-integrable phase modulating (S-iPM) laser, and outputs the optical image of an arbitrary shape in a direction inclined with respect to a direction perpendicular to a main surface of the substrate.

From such a light-emitting device, 1st-order light and −1st-order light modulated in a direction opposite to the 1st-order light are outputted. The 1st-order light forms a desired output optical image in a first direction inclined with respect to a direction (normal direction) perpendicular to the main surface of the substrate. The −1st-order light forms an optical image, which is rotationally symmetric with the output optical image, in a second direction that is symmetrical to the first direction with respect to an axis that intersects the main surface of the substrate and extends in the normal direction of the main surface. However, there is a case where any one light between the 1st-order light and the −1st-order light is unnecessary depending on the application. In such a case, it is desirable to reduce unnecessary light between the 1st-order light and the −1st-order light to the required light.

The invention has been made to solve the above problems, and an object thereof is to provide a light-emitting device capable of reducing one of 1st-order light and −1st-order light with respect to the other light, and a production method for the same.

Solution to Problem

A light-emitting device according to the invention is a light-emitting device that outputs light to form an optical image in at least any one direction of a normal direction of a main surface of a substrate and an inclination direction inclined with respect to the normal direction, and includes a structure for solving the above-described problems. That is, the light-emitting device includes: a substrate having the main surface; a light-emitting portion provided on the substrate; and a phase modulation layer provided on the substrate in a state of being optically coupled to the light-emitting portion. The phase modulation layer has a base layer and a plurality of modified refractive index regions each of which has a refractive index different from a refractive index of the base layer. On the design plane of the phase modulation layer orthogonal to the normal direction, the plurality of modified refractive index regions are arranged at predetermined positions in the base layer according to an arrangement pattern for formation of the optical image. In particular, each of the plurality of modified refractive index regions has a three-dimensional shape defined by a first surface opposing the main surface; a second surface positioned on a side opposite to the main surface with respect to the first surface, and a side surface connecting the first surface and the second surface. In this three-dimensional shape, at least one of the first surface, the second surface, and the side surface includes a portion inclined with respect to the main surface. Incidentally, in the present specification, "a surface or a part thereof inclined with respect to the main surface" means a surface or a part thereof that satisfies a positional relationship excluding both a state parallel to the main surface and a state perpendicular to the main surface from positional relationships with the main surface.

In addition, a production method for a light-emitting device according to the invention is a production method for a light-emitting device having the above structure, and as an example, includes: a first step of providing a base layer on a substrate; and a second step of forming a plurality of holes or depressions that are to serve as a plurality of modified refractive index regions in the base layer by dry etching. In particular, in the second step, the dry etching is performed by applying an etching reaction gas to the base layer from a direction inclined with respect to a normal direction. According to this production method, side surfaces of the plurality of holes or depressions are inclined with respect to the main surface. Therefore, it is possible to easily realize a configuration in which at least a part of an interface between each of the plurality of modified refractive index regions and each layer in the periphery thereof is inclined with respect to the main surface or the normal direction of the main surface.

Advantageous Effects of Invention

With the light-emitting device and the production method for the same according to the invention, one of the 1st-order light and −1st-order light can be reduced with respect to the other light.

BRIEF DESCRIPTION OF DRAWINGS

FIG. 6 is a plan view illustrating an example in which a refractive index substantially periodic structure of FIG. 4 is applied only within a specific region of the phase modulation layer.

FIGS. 9A and 9B are views for describing points to be noted when the phase distribution is obtained from a result of Fourier transform of the optical image and the arrangement of the modified refractive index regions is determined.

FIGS. 18A to 18H are plan views illustrating examples of a shape of a modified refractive index region in an X-Y plane.

FIGS. 22A to 22K are plan views illustrating other examples of the shape of the modified refractive index region in the X-Y plane.

FIG. 30 is a table illustrating a layer structure when a semiconductor light-emitting element is made of a GaAs-based compound semiconductor (emission wavelength: 940 nm band).

FIG. 32 is a table illustrating a layer structure when a semiconductor light-emitting element is made of an InP-based compound semiconductor (emission wavelength: 1300 nm band).

FIG. 34 is a table illustrating a layer structure when a semiconductor light-emitting element is made of a nitride-based compound semiconductor (emission wavelength: 405 nm band).

FIGS. 36A and 36B are a cross-sectional view and a refractive index profile for describing a case where a waveguide structure is approximated by a six-layer slab waveguide.

FIGS. 37A and 37B are a cross-sectional view and a refractive index profile for describing a case where a waveguide structure is approximated by a five-layer slab waveguide.

FIGS. 39A and 39B are a cross-sectional view and a refractive index profile illustrating a three-layer slab structure related to a contact layer in the six-layer slab waveguide.

FIGS. 41A and 41B are a cross-sectional view and a refractive index profile illustrating a three-layer slab structure related to a contact layer in the five-layer slab waveguide.

FIG. 42A is a cross-sectional view illustrating a three-layer slab structure including the cladding layer 11, an optical waveguide layer 31, and a cladding layer 13, and FIG. 42B is a refractive index profile thereof.

FIG. 43 is a table illustrating an example of a five-layer slab structure when a semiconductor light-emitting element is made of a GaAs-based compound semiconductor.

FIG. 44A is a table illustrating refractive indices $n_1$, $n_2$, and $n_3$, an asymmetric parameter a', and a refractive index $n_{clad}$ of the cladding layer 11 used for calculation, and FIG. 44B is a table illustrating calculation results of a lower limit value and an upper limit value.

FIG. 46 is a table illustrating refractive indices $n_4$, $n_5$, and $n_6$, the asymmetric parameter a', and the refractive index $n_{clad}$ of the cladding layer 11 used for calculation, and FIG. 46B is a table illustrating a calculation result of an upper limit value.

FIG. 49 is a table illustrating an example of a six-layer slab structure when a semiconductor light-emitting element is made of an InP-based compound semiconductor.

FIG. 50A is a table illustrating the refractive indices $n_1$, $n_2$, and $n_3$, the asymmetric parameter a', and the refractive index $n_{clad}$ of the cladding layer 11 used for calculation, and FIG. 50B is a table illustrating calculation results of a lower limit value and an upper limit value.

FIG. 52A is a table illustrating the refractive indices $n_4$, $n_5$, and $n_6$, the asymmetric parameter a', and the refractive index $n_{clad}$ of the cladding layer 11 used for calculation, and FIG. 52B is a table illustrating a calculation result of an upper limit value.

FIG. 55 is a table illustrating an example of a six-layer slab structure when a semiconductor light-emitting element is made of a nitride-based compound semiconductor.

FIG. 56A is a table illustrating the refractive indices $n_1$, $n_2$, and $n_3$, the asymmetric parameter a', and the refractive index $n_{clad}$ of the cladding layer 11 used for calculation, and FIG. 56B is a table illustrating calculation results of a lower limit value and an upper limit value.

FIG. 58A is a table illustrating the refractive indices $n_4$, $n_5$, and $n_6$, the asymmetric parameter a', and the refractive index $n_{clad}$ of the cladding layer 11 used for calculation, and FIG. 58B is a table illustrating a calculation result of an upper limit value.

DESCRIPTION OF EMBODIMENTS

Figure 1:
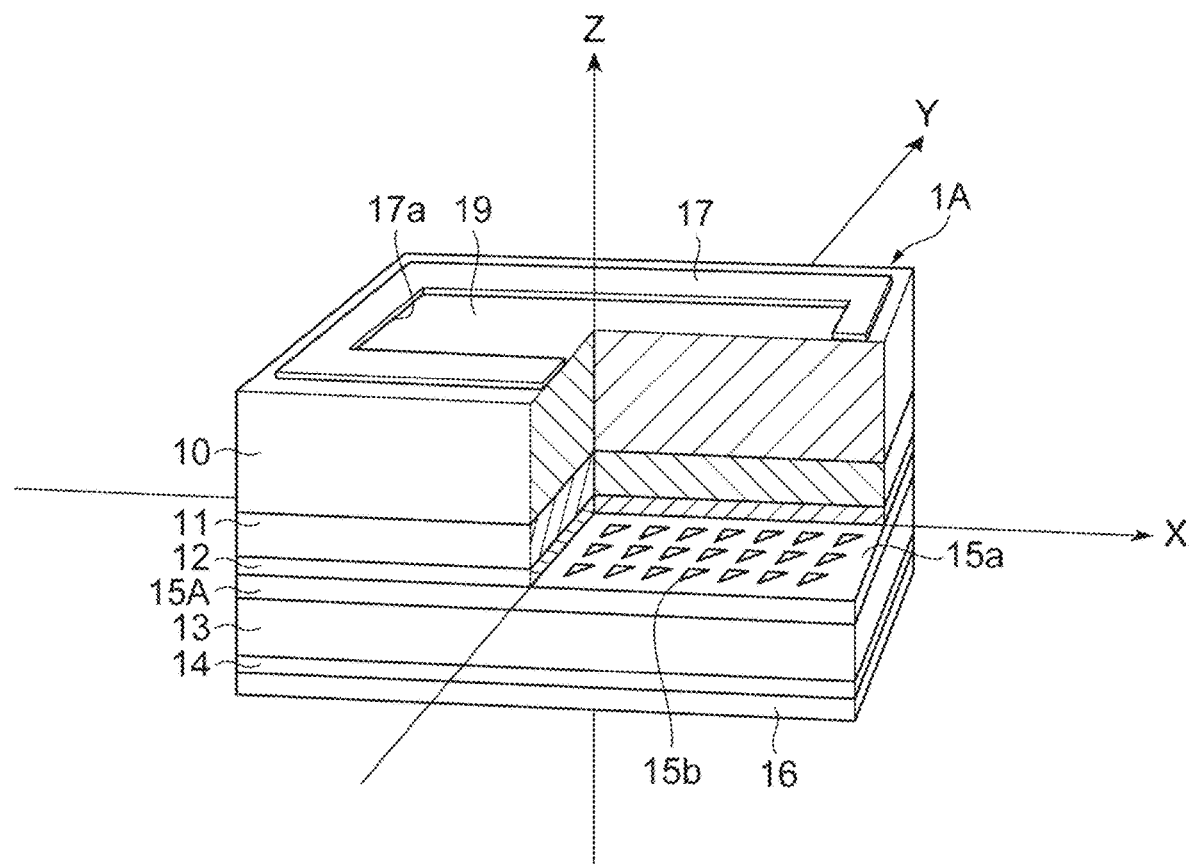
FIG. 1 is a perspective view illustrating a configuration of a semiconductor light-emitting element as a light-emitting device according to a first embodiment of the invention.

Description of Embodiments of Invention of Present Application

First, the content of embodiments of the invention of the present application will be individually listed and described.

(1) A light-emitting device according to the present embodiment is a light-emitting device that outputs light to form an optical image in at least any one direction of a normal direction of a main surface and an inclination direction inclined with respect to the normal direction, and includes a structure for attenuation of one light between 1st-order light and −1st-order light with respect to the other light. That is, as one aspect, the light-emitting device includes: a substrate having the main surface; a light-emitting portion provided on the substrate; and a phase modulation layer provided on the substrate in a state of being optically coupled to the light-emitting portion. The phase modulation layer has a base layer and a plurality of modified refractive index regions each of which has a refractive index different from a refractive index of the base layer. On the design plane of the phase modulation layer orthogonal to the normal direction, the plurality of modified refractive index regions are arranged at predetermined positions in the base layer according to an arrangement pattern for formation of the optical image.

In particular, at least a part of an interface between each of the plurality of modified refractive index regions and each layer in the periphery thereof is inclined with respect to the main surface in the light-emitting device. Specifically, each of the plurality of modified refractive index regions has a three-dimensional shape defined by a first surface opposing the main surface, a second surface positioned on a side opposite to the main surface with respect to the first surface, and a side surface connecting the first surface and the second surface. In this case, in the three-dimensional shape of each of the plurality of modified refractive index regions, at least one of the first surface, the second surface, and the side surface includes a portion inclined with respect to the main surface. This inclined portion may be the entire target surface or a partial region. Incidentally, the "portion inclined to the main surface (the whole surface or a part of the surface)" includes neither a portion orthogonal to the main surface or the normal direction nor a portion parallel to the main surface and the normal direction of the main surface. In other words, when the main surface is used as a reference, both the portion parallel to the main surface and the portion perpendicular to the main surface are excluded from the "portion inclined with respect to the main surface".

As described above, when at least a part of the interface between each of the modified refractive index regions and each layer in the periphery thereof is inclined with respect to the main surface and the normal direction of the main surface, light traveling in the phase modulation layer along a plane parallel to the main surface (traveling plane) is scattered or reflected in a direction intersecting the traveling plane in at least a part of the interface. At this time, either a difference in magnitude of scattering in different directions or a difference in magnitude of reflection in different directions occurs between the two beams of light (the 1st-order light and the −1st-order light) traveling in opposite directions on the traveling plane. That is, the 1st-order light (or the −1st-order light) is intensively scattered (or reflected) toward the substrate, and the −1st-order light (or the 1st-order light) is strongly scattered (or reflected) toward the opposite side of the substrate. Since light containing the 1st-order light as a main component and light containing the −1st-order light as a main component have different optical paths until outputted to the outside of the device, light with a longer optical path is more attenuated than light with a shorter optical path. Therefore, one light between the 1st-order light and the −1 order light can be reduced with respect to the other light according to the light-emitting device. Incidentally, the 1st-order light and the −1st-order light are considered to have two components, that is, the component derived from light traveling in opposite directions on the traveling plane (plane parallel to the main surface) in the phase modulation layer and a component caused by light traveling in a single direction (caused by a difference between an ideal phase distribution and a phase distribution generated for an actual light wave due to a phase modulation scheme (method for determining a position of the modified refractive index region) or a small phase modulation amount (shift amount of the modified refractive index region)). However, the former component (one of the light components traveling in opposite directions) is suppressed in the present specification.

(2) As one aspect of the present embodiment, each of the plurality of modified refractive index regions may be a closed space defined by the base layer and one or more layers in contact with the base layer (for example, a cladding layer, an active layer, or the like). Incidentally, an inert gas such as argon, nitrogen, and hydrogen, or air may be sealed in the closed space that is to serve as the modified refractive index region. On a design plane of the phase modulation layer, each of the plurality of modified refractive index regions preferably has a planar shape in which a width along a first direction on the design plane gradually decreases along a second direction intersecting the first direction. In this case, when another semiconductor layer (for example, a cladding layer) is regrown on the phase modulation layer, an interface between the semiconductor layer and the modified refractive index region is inclined with respect to the main surface of the substrate. Therefore, it is possible to easily realize a configuration in which at least a part of the interface between each of the plurality of modified refractive index regions and each layer in the periphery thereof is inclined with respect to the main surface. In addition, as one aspect of the present embodiment, when each of the plurality of modified refractive index regions is a closed space, at least a part of the first surface may be inclined with respect to the second surface. In a state where a positional relationship between the first surface and the second surface is satisfied, the side surface may include a portion (inclined portion) inclined with respect to the main surface.

(3) As an example of the arrangement of the plurality of modified refractive index regions, for example, a gravity-center position of each of the plurality of modified refractive index regions is arranged on a straight line that passes through a corresponding lattice point of a virtual square lattice and is inclined with respect to the square lattice when the virtual square lattice is set on a plane perpendicular to a thickness direction (coinciding with the normal direction) of the phase modulation layer (the design plane of the phase modulation layer). At this time, a distance between the gravity center of each of the modified refractive index regions and the corresponding lattice point is individually set in accordance with an optical image. According to such a structure, light that forms an optical image of an arbitrary shape can be outputted in an inclination direction that is inclined with respect to the normal direction of the main surface of the substrate similarly to the above-described structure described in Patent Document 1 (structure in which the gravity center of each of the modified refractive index regions has a rotational angle according to the optical image about each lattice point).

More specifically, as one aspect of the present embodiment, each of the plurality of modified refractive index regions is arranged on the design plane of the phase modulation layer so as to have one-to-one correspondence to any lattice point of the virtual square lattice. However, it is unnecessary to assign the modified refractive index regions corresponding to all the lattice points. Thus, lattice points that are associated with any modified refractive index regions among the lattice points forming the virtual square lattice are referred to as "valid lattice points". Among the plurality of valid lattice points defined in this manner, a line segment connecting an arbitrary specific lattice point and a gravity center of a specific modified refractive index region associated with the specific lattice point is preferably parallel to each of line segments connecting each of a plurality of peripheral lattice points adjacent to the specific lattice point at the shortest distance and each of gravity centers of a plurality of peripheral modified refractive index regions respectively associated with the plurality of peripheral lattice points.

Further, as one aspect of the present embodiment, a line segment connecting an arbitrary specific lattice point and a gravity center of a specific modified refractive index region associated with the specific lattice point among the plurality of valid lattice points may be parallel to each of line segments connecting remaining valid lattice points excluding the specific lattice point and remaining modified refractive index regions respectively associated with the remaining valid lattice points. In this case, it is easy to design arrangement of the gravity centers of the respective modified refractive index regions. In addition, a tilt angle (an angle formed by any of line segments parallel to the square lattice among line segments starting from a lattice point and the straight line passing through the lattice point) is preferably an angle other than 0°, 90°, 180°, and 270°. In addition, the tilt angle may be 45°, 135°, 225°, or 315°. With this angle setting, four fundamental waves traveling along the square lattice (when setting an X-axis and a Y-axis along the square lattice, light traveling in the positive direction of the X-axis, light traveling in the negative direction of the X-axis, light traveling in the positive direction of the Y-axis, and light traveling in the negative direction of the Y-axis) can equally contribute to the optical image. Incidentally, the straight line corresponds to the X-axis or the Y-axis of the square lattice when the tilt angle is 0°, 90°, 180°, or 270°. For example, when the tilt angle is 0° or 180° and the straight line extends along the X-axis, two traveling waves opposing each other in the Y-axis direction are not subjected to phase modulation among the four fundamental waves, and thus, do not contribute to signal light. In addition, when the tilt angle is 90° or 270° and the straight line extends along the Y-axis, two traveling waves oppising each other in the X-axis direction do not contribute to the signal light. Thus, when the tilt angle is 0°, 90°, 180°, or 270°, the generation efficiency of the signal light is degraded.

(4) As one aspect of the present embodiment, the light-emitting portion is preferably an active layer provided on the substrate. In this case, the light-emitting portion and the phase modulation layer can be easily optically coupled.

(5) In the production method for a light-emitting device according to the present embodiment, a light-emitting device having the above-described structure is produced. Specifically, as one aspect, the production method includes: a first step of providing a base layer on a substrate; and a second step of forming a plurality of holes or depressions that are to serve as a plurality of modified refractive index regions in the base layer by dry etching. In particular, in the second step, the dry etching is performed by applying an etching reaction gas to the base layer from a direction inclined with respect to a normal direction of a main surface of the substrate. According to this production method, side surfaces of the plurality of holes or depressions are inclined with respect to the normal direction of the main surface of the substrate. Therefore, it is possible to easily realize a configuration in which at least a part of an interface between each of the plurality of modified refractive index regions and each layer in the periphery thereof is inclined with respect to the main surface or the normal direction of the main surface.

(6) In addition, as one aspect, the production method for a light-emitting device according to the present embodiment may include: a first step of providing a base layer on a substrate; a second step of forming a plurality of holes or depressions that are to serve as a plurality of modified refractive index regions in the base layer by dry etching; and a third step of forming a cap layer on the base layer, the cap layer covering opening portions of the plurality of holes or depressions formed in the base layer. In this case, in the third step, a material gas for formation of the cap layer is preferably applied to the base layer from a direction inclined with respect to the normal direction of the main surface of the substrate. According to this production method, in the third step, a surface of the cap layer covering the opening portions of the plurality of holes or depressions is inclined with respect to the main surface of the substrate. Therefore, it is possible to easily realize a configuration in which at least a part of an interface between each of the plurality of modified refractive index regions and each layer in the periphery thereof is inclined with respect to the main surface or the normal direction of the main surface.

(7) As one aspect of the present embodiment, the direction in which the etching reaction gas for formation of the plurality of holes or the depressions is supplied may be different from the direction in which the material gas is supplied.

As described above, each aspect listed in [Description of Embodiments of Invention of Present Application] can be applied to each of the remaining aspects or to all the combinations of these remaining aspects.

Details of Embodiments of Invention of Present Application

Hereinafter, specific structures of a light-emitting device and a production method for the same according to the present embodiments will be described in detail with reference to the accompanying drawings. Incidentally, the invention is not limited to these examples, but is illustrated by the claims, and equivalence of and any modification within the scope of the claims are intended to be included therein. In addition, the same elements in the description of the drawings will be denoted by the same reference signs, and redundant descriptions will be omitted.

Hereinafter, embodiments of the light-emitting device and the production method for the same according to the invention will be described in detail with reference to the accompanying drawings.

Incidentally, in the description of the drawings, the same elements will be denoted by the same reference signs, and redundant descriptions thereof will be omitted.

First Embodiment

FIG. 1 is a perspective view illustrating a configuration of a semiconductor light-emitting element 1A as a light emitting device according to a first embodiment of the invention. Incidentally, an XYZ orthogonal coordinate system having an axis, which passes through a center of the semiconductor light-emitting element 1A and extends in a thickness direction of the semiconductor light-emitting element 1A, as a Z-axis is defined. The semiconductor light-emitting element 1A is a S-iPM laser that forms a standing wave along an X-Y plane and outputs a phase-controlled plane wave in a Z-axis direction, and outputs a two-dimensional optical image having an arbitrary shape in a direction perpendicular to a main surface 10a of a semiconductor substrate 10 (that is, in the Z-axis direction) or in a direction inclined thereto as will be described later.

Figure 2:
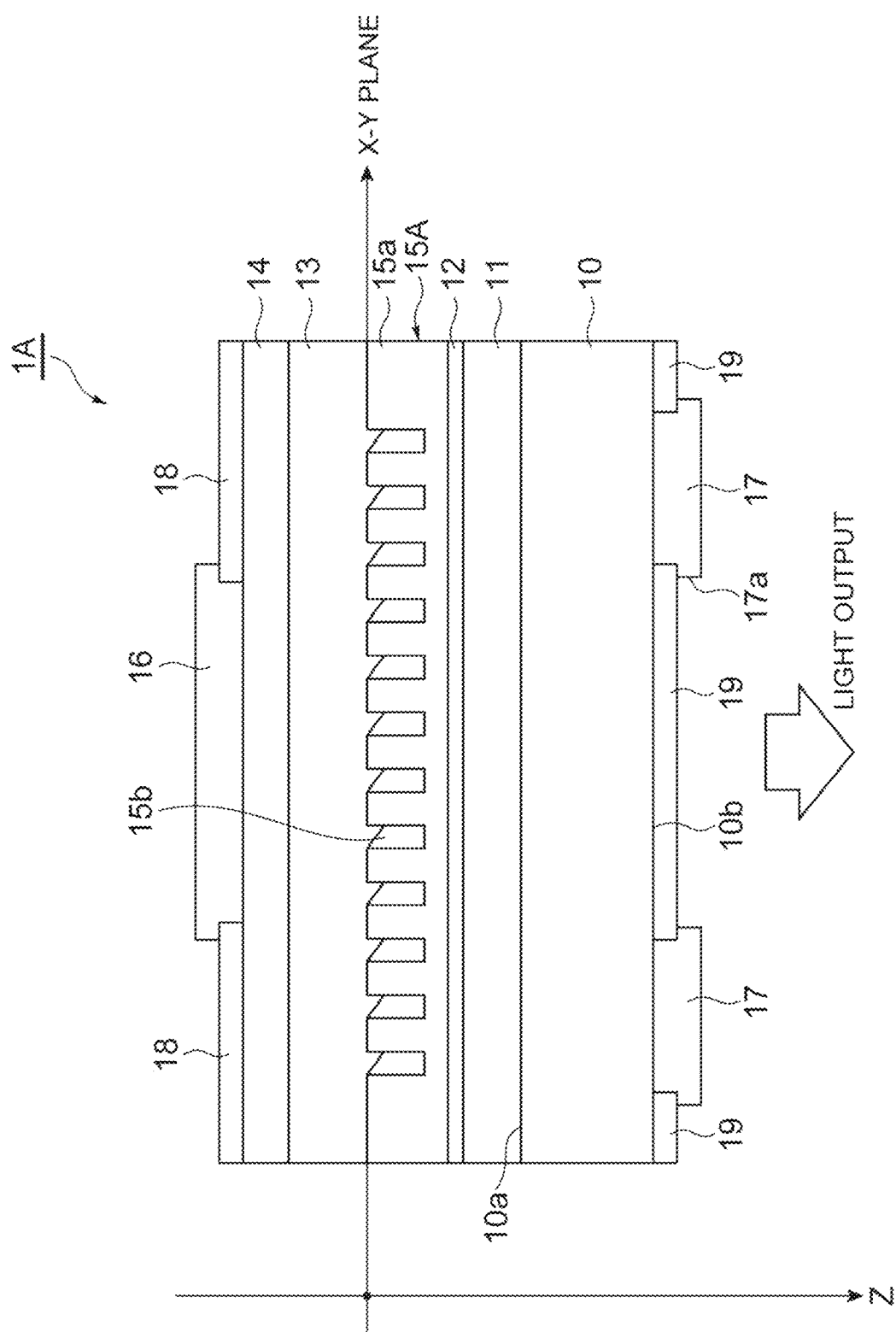
FIG. 2 is a view schematically illustrating a stacked structure of the semiconductor light-emitting element.

FIG. 2 is a view schematically illustrating a stacked structure of the semiconductor light-emitting element 1A. As illustrated in FIGS. 1 and 2, the semiconductor light-emitting element 1A includes: an active layer 12 serving as a light-emitting portion provided on the main surface 10a of the semiconductor substrate 10; a pair of cladding layers 11 and 13 provided on the main surface 10a and sandwiching the active layer 12; and a contact layer 14 provided on the cladding layer 13. The semiconductor substrate 10 and the respective layers 11 to 14 are made of a compound semiconductor, for example, a GaAs-based semiconductor, an InP-based semiconductor, or a nitride-based semiconductor. An energy band gap of the cladding layer 11 and an energy band gap of the cladding layer 13 are larger than an energy band gap of the active layer 12. Thickness directions of the semiconductor substrate 10 and the respective layers 11 to 14 coincide with the Z-axis direction. Incidentally, a light guide layer may include a carrier barrier layer configured to efficiently confine carriers in the active layer 12.

The semiconductor light-emitting element 1A further includes a phase modulation layer 15A optically coupled to the active layer 12. In the present embodiment, the phase modulation layer 15A is provided between the active layer 12 and the cladding layer 13. The light guide layer may be provided between the cladding layers 11 and 13 if necessary. The thickness direction of the phase modulation layer 15A coincides with the Z-axis direction.

Figure 3:
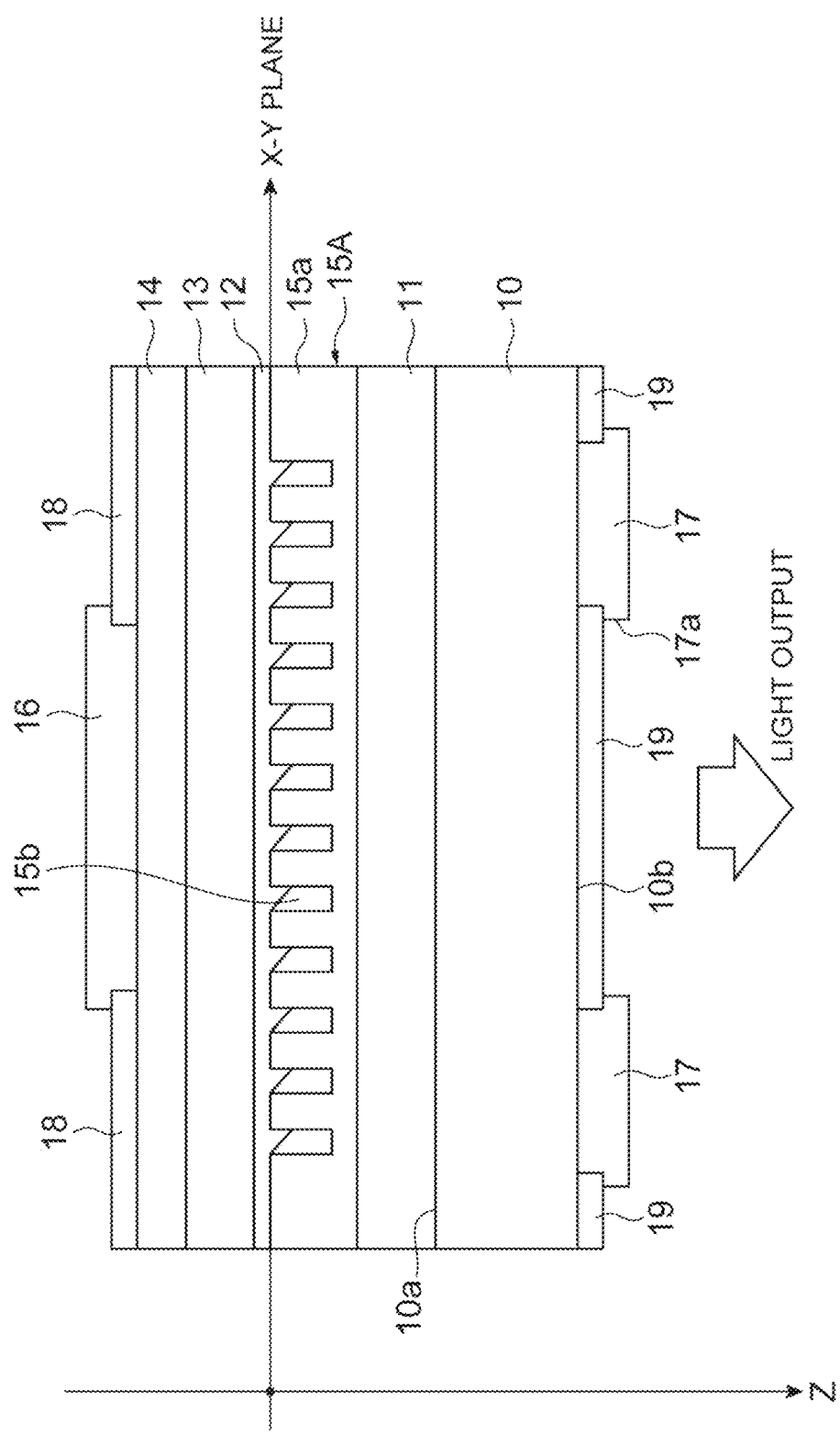
FIG. 3 is a view illustrating a case where a phase modulation layer is provided between a cladding layer 11 and an active layer 12.

As illustrated in FIG. 3, the phase modulation layer 15A may be provided between the cladding layer 11 and the active layer 12. The light guide layer may be provided between the cladding layers 11 and 13 if necessary.

As illustrated in FIG. 2, the phase modulation layer 15A includes a base layer 15a and a plurality of modified refractive index regions 15b existing in the base layer 15a. The base layer 15a is made of a first refractive index medium, and each of the plurality of modified refractive index regions 15b is made of a second refractive index medium having a refractive index different from that of the first refractive index medium. The modified refractive index region 15b of the present embodiment is defined by a depression provided in the base layer 15a. An inert gas such as argon, nitrogen, and hydrogen or air may be sealed in the depression. Incidentally, the modified refractive index region 15b may be a hole provided in the base layer 15a. In addition, the plurality of modified refractive index regions 15b include a substantially periodic structure. When an effective refractive index of the phase modulation layer 15A is n, a wavelength $\lambda_0$ (=a×n, a is a lattice interval) selected by the phase modulation layer 15A is included within an emission wavelength range of the active layer 12. The phase modulation layer 15A can select the wavelength $\lambda_0$ out of the emission wavelength of the active layer 12 and output light of the selected wavelength to the outside. Light inputted into the phase modulation layer 15A forms a predetermined mode corresponding to the arrangement of the modified refractive index regions 15b in the phase modulation layer 15A, and is outputted to the outside from a rear surface of the semiconductor light-emitting element 1A as a laser beam having a desired pattern.

Each of the modified refractive index regions 15b has a refractive index interface with the base layer 15a and a refractive index interface with the cladding layer 13. Then, at least a part of the refractive index interface between each of the modified refractive index regions 15b and each layer in the periphery thereof (at least a part of a surface that defines a three-dimensional shape of each of the modified refractive index regions 15b) is inclined with respect to the main surface 10a (a surface parallel to the X-Y plane) and a normal direction (Z-axis direction) of the main surface 10a.

In the present embodiment, a bottom surface (a first surface facing the main surface 10a) and a side surface of each of the modified refractive index regions 15b form the refractive index interface with the base layer 15a. An upper surface of each of the modified refractive index regions 15b (a second surface positioned on a side opposite to the main surface 10a with respect to the first surface) forms the refractive index interface with the cladding layer 13. The bottom surface of each of the modified refractive index regions 15b is perpendicular to the thickness direction of the phase modulation layer 15A (parallel to the X-Y plane). In addition, the side surface of each of the modified refractive index regions 15b extends along the direction (Z-axis direction) perpendicular to the main surface 10a. On the other hand, a part or the whole of the upper surface of each of the modified refractive index regions 15b (that is, the refractive index interface with the cladding layer 13) is inclined with respect to the main surface 10a (parallel to the X-Y plane) and the direction (Z-axis direction) perpendicular to the main surface 10a. Inclination directions of the upper surface are aligned with each other in the plurality of modified refractive index regions 15b. Such a shape of the upper surface is realized when a part of the cladding layer 13 enters the depression of the modified refractive index region 15b or a part of the modified refractive index region 15b enters the cladding layer 13.

The semiconductor light-emitting element 1A further includes an electrode 16 provided on the contact layer 14 and an electrode 17 provided on a rear surface 10b of the semiconductor substrate 10. The electrode 16 is in ohmic contact with the contact layer 14, and the electrode 17 is in ohmic contact with the semiconductor substrate 10. Further, the electrode 17 has an opening 17a. The electrode 16 is provided in a central region of the contact layer 14. A portion other than the electrode 16 on the contact layer 14 is covered with a protective film 18 (see FIG. 2). Incidentally, the contact layer 14 that is not in contact with the electrode 16 may be removed. A portion of the rear surface 10b of the semiconductor substrate 10 other than the electrode 17 (including the inside of the opening 17a) is covered with an anti-reflection film 19. The anti-reflection film 19 in a region other than the opening 17a may be removed.

When a drive current is supplied between the electrode 16 and the electrode 17, recoupling between electrons and holes occurs in the active layer 12, and light is generated in the active layer 12. The electrons and holes contributing to the light emission and the generated light are efficiently confined between the lower cladding layer 11 and the upper cladding layer 13.

The light outputted from the active layer 12 enters the inside of the phase modulation layer 15A, and forms the predetermined mode corresponding to a lattice structure formed inside the phase modulation layer 15A. Laser light outputted from the phase modulation layer 15A is directly outputted from the rear surface 10b to the outside of the semiconductor light-emitting element 1A through the opening 17a or is reflected by the electrode 16 and then is outputted from the rear surface 10b to the outside of the semiconductor light-emitting element 1A through the opening 17a. At this time, 0th-order light included in the laser light is outputted in the direction (normal direction) perpendicular to the main surface 10a. On the other hand, the signal light (1st-order light and −1st-order light) included in the laser light is outputted in a two-dimensional arbitrary direction including the direction perpendicular to the main surface 10a and the direction inclined thereto. It is the signal light that forms a desired optical image.

As an example, the semiconductor substrate 10 is a GaAs substrate, and each of the cladding layer 11, the active layer 12, the cladding layer 13, the contact layer 14, and the phase modulation layer 15A is a compound semiconductor layer constituted by elements contained in the group III element and the group V element. Specifically, for example, the cladding layer 11 is made of AlGaAs. The active layer 12 has a multiple quantum well structure (barrier layer: AlGaAs/well layer: InGaAs). In the phase modulation layer 15A, the base layer 15a is made of GaAs, and the modified refractive index regions 15b is a depression or a hole. The cladding layer 13 is made of AlGaAs, and the contact layer 14 is made of GaAs.

In AlGaAs, an energy band gap and a refractive index can be easily changed by changing a composition ratio of Al. In $Al_xGa_{1-x}As$, when a composition ratio x of Al having a relatively small atomic radius is decreased (increased), the energy band gap having a positive correlation with the composition ratio decreases (increases). In addition, when In having a large atomic radius is mixed with GaAs to form InGaAs, the energy band gap decreases. That is, the Al composition ratio of the cladding layers 11 or 13 is larger than the Al composition ratio of the barrier layer (AlGaAs) of the active layer 12. The Al composition ratio of the cladding layers 11 or 13 is set to, for example, 0.2 to 1.0 (for example, 0.4). The Al composition ratio of the barrier layer of the active layer 12 is set to, for example, 0 to 0.3 (for example, 0.15).

Incidentally, noise light having a mesh-like dark portion is superimposed on a beam pattern outputted from the semiconductor light-emitting element 1A and corresponding to an optical image in some cases. According to studies of the inventors, the noise light having the mesh-like dark portion is caused by a higher-order mode in the stacking direction inside the semiconductor light-emitting element 1A. Here, a fundamental mode in the stacking direction means a mode having an intensity distribution in which one peak exists over a region including the active layer 12 and sandwiched between the cladding layers 11 and 13. In addition, the higher-order mode means a mode having an intensity distribution in which two or more peaks exist. Incidentally, the peak of the intensity distribution in the fundamental mode is formed in the vicinity of the active layer 12, whereas the peak in the intensity distribution in the higher-order mode is formed also in the cladding layer 11, the cladding layer 13, the contact layer 14, and the like. In addition, there are a guided mode and a leakage mode as modes in the stacking direction, but the leakage mode does not exist stably. Therefore, only the guided mode will be focused in the following description. In addition, the guided mode includes a TE mode in which an electric field vector exists in a direction along the X-Y plane and a TM mode in which an electric field vector exists in a direction perpendicular to the X-Y plane, but only the TE mode will be focused on herein. When the refractive index of the cladding layer 13 between the active layer 12 and the contact layer is higher than the refractive index of the cladding layer 11 between the active layer 12 and the semiconductor substrate, the higher-order mode as described above is significantly generated. Normally, the refractive indexes of the active layer 12 and the contact layer 14 are much higher than the refractive indexes of the cladding layers 11 and 13. Therefore, when the refractive index of the cladding layer 13 is higher than the refractive index of the cladding layer 11, light is confined also in the cladding layer 13, thereby forming the guided mode. This results in generation of the higher-order mode.

In the semiconductor light-emitting element 1A of the present embodiment, the refractive index of the cladding layer 13 is equal to or lower than the refractive index of the cladding layer 11. As a result, the generation of the higher-order mode as described above can be suppressed, and the noise light having the mesh-like dark portion superimposed on the beam pattern can be reduced.

Here, a preferable thickness of an optical waveguide layer including the active layer 12 will be described. Assuming that an optical waveguide layer includes only the active layer 12 (the optical waveguide layer does not include the cladding layer 11, the cladding layer 13, and the phase modulation layer 15A) in a case where the refractive index of the phase modulation layer 15A is lower than the refractive index of the cladding layer 11 as a premise, and a three-layer slab waveguide structure including such an optical waveguide layer and two upper and lower layers adjacent to the optical waveguide layer is considered. On the other hand, assuming that an optical waveguide layer includes the phase modulation layer 15A and the active layer 12 (does not include the cladding layer 11 and the cladding layer 13) in a case where the refractive index of the phase modulation layer 15A is equal to or higher than the refractive index of the cladding layer 11, and a three-layer slab waveguide structure including such an optical waveguide layer and two upper and lower layers adjacent to the optical waveguide layer is considered. Incidentally, a guided mode in a layer thickness direction is the TE mode. At this time, a normalized waveguide width $V_1$ of the optical waveguide layer and a normalized propagation constant b of the TE mode are defined by the following Formula (1).

$$V_1 = \frac{1}{\sqrt{1-b}} \left[ \tan^{-1} \sqrt{\frac{b}{1-b}} + \tan^{-1} \sqrt{\frac{b+a'}{1-b}} + N_1 \pi \right] \quad (1)$$

However, when a guided mode is formed in the optical waveguide layer (the mode order is $N_1$), an equivalent refractive index of the TE mode needs to be higher than the refractive index of the cladding layer 11 in order for the guided mode not to leak to the semiconductor substrate 10 through the cladding layer 11, and the normalized propagation constant b needs to satisfy the following Formula (2).

$$b \geq \frac{n_{clad}^2 - n_2^2}{n_1^2 - n_2^2} \quad (2)$$

At this time, there is a single mode guided through the optical waveguide layer if the normalized waveguide width $V_1$ that satisfies Formulas (1) and (2) falls within a range having only one solution. Here, a' and b respectively represent an asymmetric parameter and the normalized propagation constant in the three-layer slab waveguide, and are real numbers that satisfy the following Formulas (3) and (4), respectively. Incidentally, in Formulas (3) and (4), $n_{clad}$ is a refractive index of the cladding layer 11, $n_1$ is a refractive index of an optical waveguide layer including the active layer 12, $n_2$ is a refractive index of a layer having a higher refractive index between layers adjacent to the optical waveguide layer, $n_3$ is a refractive index of a layer having a lower refractive index between the layers adjacent to the optical waveguide layer, and $n_{eff}$ is an equivalent refractive index of the TE mode for the three-layer slab waveguide structure including the optical waveguide layer and two upper and lower layers adjacent to the optical waveguide layer.

$$a' = \frac{n_2^2 - n_3^2}{n_1^2 - n_2^2} \quad (3)$$

$$b = \frac{n_{eff}^2 - n_2^2}{n_1^2 - n_2^2} \quad (4)$$

According to the studies of the inventors, it has been found that a higher-order mode is also generated in the optical waveguide layer (high refractive index layer) including the active layer 12. Then, the inventors have found that the higher-order mode can be suppressed by appropriately controlling the thickness and the refractive index of the optical waveguide layer. That is, as a value of the normalized waveguide width $V_1$ of the optical waveguide layer satisfies the above conditions, the generation of the higher-order mode is further suppressed, and the noise light having the mesh-like dark portion superimposed on the beam pattern can be further reduced.

A preferable thickness of the contact layer 14 is as follows. That is, in a three-layer slab waveguide structure including the contact layer 14 and two upper and lower layers adjacent to the contact layer 14, a normalized waveguide width $V_2$ and a normalized propagation constant b of the TE mode are defined by the following Formula (5).

$$V_2 = \frac{1}{\sqrt{1-b}} \left[ \tan^{-1} \sqrt{\frac{b}{1-b}} + \tan^{-1} \sqrt{\frac{b+a'}{1-b}} + N_2 \pi \right] \quad (5)$$

However, when a guided mode is formed in the contact layer (the mode order is $N_2$), an equivalent refractive index of the TE mode needs to be higher than the refractive index of the cladding layer 11 in order for the guided mode not to leak to the semiconductor substrate 10 through the cladding layer 11, and the normalized propagation constant b needs to satisfy the following Formula (6).

$$b \geq \frac{n_{clad}^2 - n_5^2}{n_4^2 - n_5^2} \quad (6)$$

At this time, if the normalized waveguide width $V_2$ that satisfies Formulas (5) and (6) falls within a range having no solution, there is no mode guided through the contact layer 14 even including the fundamental mode.

Here, a' and b respectively represent an asymmetric parameter and the normalized propagation constant in the three-layer slab waveguide, and are real numbers that satisfy the following Formulas (7) and (8), respectively. Incidentally, in Formulas (7) and (8), $n_4$ is a refractive index of the contact layer 14, $n_5$ is a refractive index of a layer having a higher refractive index between the layers adjacent to the contact layer 14, $n_6$ is a refractive index of a layer having a lower refractive index between the layers adjacent to the contact layer 14, and $n_{eff}$ is an equivalent refractive index of the TE mode for the three-layer slab waveguide structure including the contact layer 14 and the two adjacent upper and lower layers.

$$a' = \frac{n_5^2 - n_6^2}{n_4^2 - n_5^2} \quad (7)$$

$$b = \frac{n_{eff}^2 - n_5^2}{n_4^2 - n_5^2} \quad (8)$$

As described above, the generation of the guided mode due to the contact layer 14 is suppressed by appropriately controlling the thickness of the contact layer 14, and the generation of the higher-order mode in the semiconductor light-emitting element can be further suppressed.

As another example, the semiconductor substrate 10 is an InP substrate, and each of the cladding layer 11, the active layer 12, the phase modulation layer 15A, the cladding layer 13, and the contact layer 14 is made of, for example, an InP-based compound semiconductor. Specifically, for example, the cladding layer 11 is made of InP. The active layer 12 has a multiple quantum well structure (barrier layer: GaInAsP/well layer: GaInAsP). In the phase modulation layer 15A, the base layer 15a is made of GaInAsP, and the modified refractive index region 15b is a depression (may be a hole). The cladding layer 13 is made of InP. The contact layer 14 is made of GaInAsP.

In addition, as still another example, the semiconductor substrate 10 is a GaN substrate, and each of the cladding layer 11, the active layer 12, the phase modulation layer 15A, the cladding layer 13, and the contact layer 14 is made of, for example, a nitride-based compound semiconductor. Specifically, for example, the cladding layer 11 is made of AlGaN. The active layer 12 has a multiple quantum well structure (barrier layer: InGaN/well layer: InGaN). In the phase modulation layer 15A, the base layer 15a is made of GaN, and the modified refractive index region 15b is a depression (may be a hole). The cladding layer 13 is made of AlGaN. The contact layer 14 is made of GaN.

A conductivity type which is the same as that of the semiconductor substrate 10 is given to the cladding layer 11, and a conductivity type opposite to that of the semiconductor substrate 10 is given to the cladding layer 13 and the contact layer 14. For example, the semiconductor substrate 10 and the cladding layer 11 are an n-type and the cladding layer 13 and the contact layer 14 are a p-type. When provided between the active layer 12 and the cladding layer 11, the phase modulation layer 15A has the same conductivity type as the semiconductor substrate 10. On the other hand, when provided between the active layer 12 and the cladding layer 13, the phase modulation layer 15A has a conductivity type opposite to that of the semiconductor substrate 10. Incidentally, an impurity concentration is, for example, $1\times10^{17}$ to $1\times10^{21}/cm^3$. The active layer 12 is intrinsic (i-type) which is not intentionally doped with any impurity, and an impurity concentration thereof is $1\times10^{15}/cm^3$ or less. In addition, an impurity concentration of the phase modulation layer 15A may be intrinsic (i-type) in a case where it is necessary to suppress the influence of loss caused by light absorption via the impurity level, or the like.

The thickness of the semiconductor substrate 10 is, for example, 150 µm. The thickness of the cladding layer 11 is, for example, 2000 nm. The thickness of the active layer 12 is, for example, 175 nm. The thickness of the phase modulation layer 15A is, for example, 280 nm. The depth of the modified refractive index region 15b is, for example, 200 nm. The thickness of the cladding layer 13 is, for example, 2000 nm. The thickness of the contact layer 14 is, for example, 150 nm.

The anti-reflection film 19 is made of a dielectric single layer film such as silicon nitride (for example, SiN) and silicon oxide (for example, $SiO_2$), or a dielectric multilayer film. For example, it is possible to use a film, obtained by stacking two or more types of dielectric layers selected from a dielectric layer group consisting of titanium oxide ($TiO_2$), silicon dioxide ($SiO_2$), silicon monoxide (SiO), niobium oxide ($Nb_2O_5$), tantalum pentoxide ($Ta_2O_5$), magnesium fluoride ($MgF_2$), titanium oxide ($TiO_2$), aluminum oxide ($Al_2O_3$), cerium oxide ($CeO_2$), indium oxide ($In_2O_3$), zirconium oxide ($ZrO_2$), and the like, as the dielectric multilayer film. For example, a film having a thickness of λ/4 as an optical film thickness for light of a wavelength λ is stacked. In addition, the protective film 18 is an insulating film such as silicon nitride (for example, SiN) and silicon oxide (for example, $SiO_2$). When the semiconductor substrate 10 and the contact layer 14 are made of a GaAs-based semiconductor, the electrode 16 can be made of a material containing at least one of Cr, Ti, and Pt and Au, and has, for example, a stacked structure of a Cr layer and an Au layer. The electrode 17 can be made of a material containing at least one of AuGe and Ni and Au, and has, for example, a stacked structure of an AuGe layer and an Au layer. Incidentally, the materials of the electrodes 16 and 17 are not limited to these ranges as long as ohmic junction can be realized.

Figure 4:
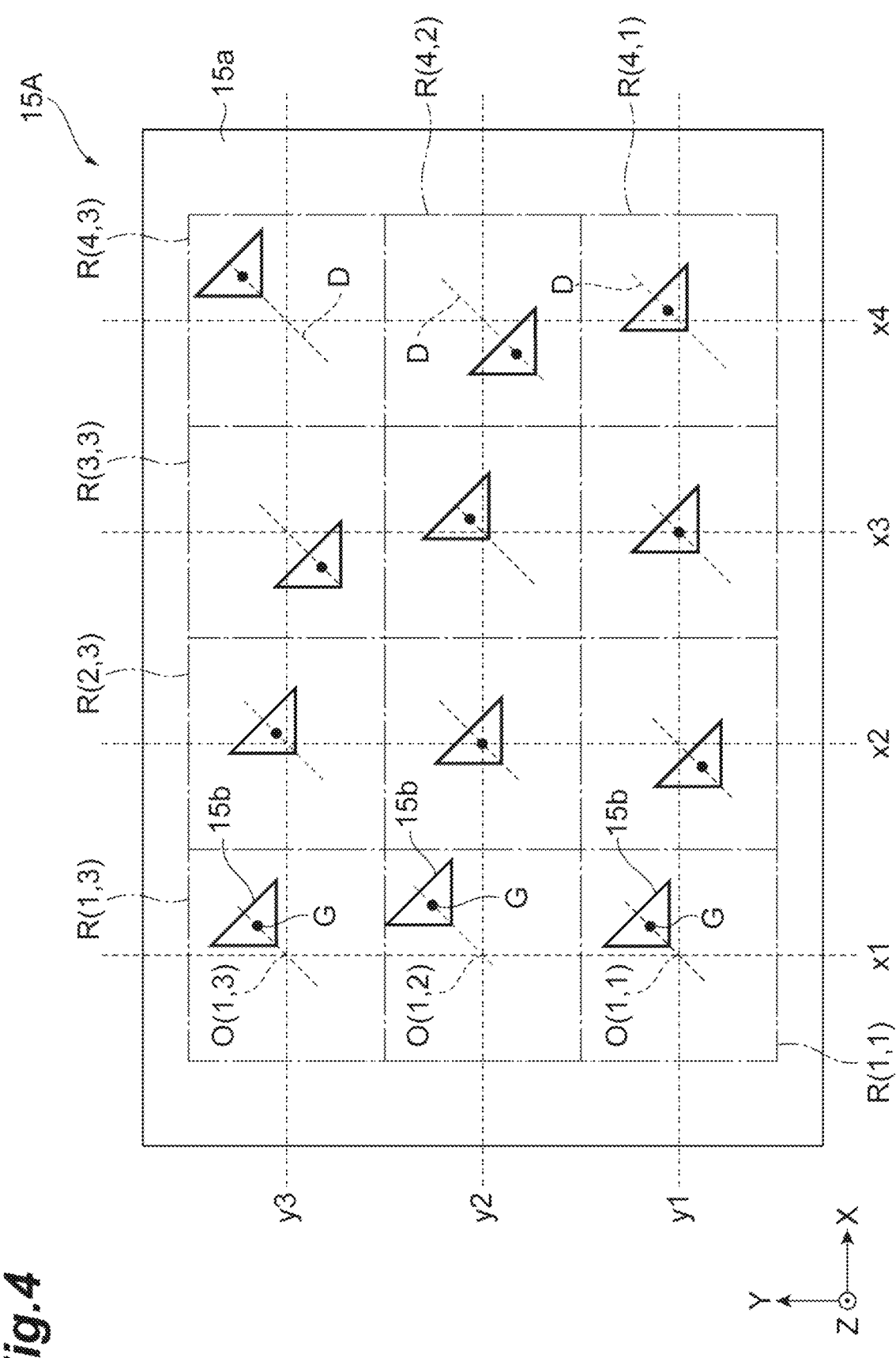
FIG. 4 is a plan view of the phase modulation layer.

FIG. 4 is a plan view of the phase modulation layer 15A. As described above, the phase modulation layer 15A includes the base layer 15a and the modified refractive index region 15b. The base layer 15a is made of the first refractive index medium, and the modified refractive index region 15b is made of the second refractive index medium having the refractive index different from that of the first refractive index medium. Here, a virtual square lattice is set on the phase modulation layer 15A on a design plane of the phase modulation layer 15A that coincides with the X-Y plane. One side of the square lattice is parallel to the X-axis and the other side is parallel to the Y-axis. At this time, unit constituent regions R each of which has a square shape with a lattice point O of the square lattice as the center thereof can be set two-dimensionally over a plurality of columns along the X-axis and a plurality of rows along the Y-axis. At this time, unit constituent regions R each of which has a square shape with a lattice point O of the square lattice as the center thereof can be set two-dimensionally over a plurality of columns (x1 to x4) arranged in parallel along the X-axis and a plurality of rows (y1 to y3) arranged in parallel along the Y-axis. If a coordinate of each of the unit constituent regions R is given as a gravity-center position of each of the unit constituent regions R, this gravity-center position coincides with the lattice point O of the virtual square lattice. The modified refractive index regions 15b are provided one by one in each of the unit constituent regions R. The lattice point O may be positioned outside the modified refractive index region 15b or may be included in the modified refractive index region 15b.

Incidentally, a planar shape of each of the plurality of modified refractive index regions 15b is a shape in which a width in a certain direction on the X-Y plane gradually decreases along a direction intersecting the direction. FIG. 4 illustrates a triangular shape as an example of the above shape. That is, the shape in which the width gradually decreases from a certain side to a vertex opposing the side is used. This triangle is, for example, an isosceles triangle. As illustrated in FIGS. 2 and 3, the refractive index interface defined by the modified refractive index region 15b and at least one of the cladding layer 11 and the active layer 12 is inclined with respect to the main surface 10a (X-Y plane) and the direction perpendicular to the main surface 10a (Z-axis direction) in the present embodiment. This inclination direction coincides with a direction from a certain side to a vertex opposing the side. This direction is aligned with each other among the plurality of modified refractive index regions 15b. In one example, an angle between this direction and the X-axis direction is 450 or 135°.

Incidentally, a ratio of the area SA of the modified refractive index region 15b occupying within one unit constituent region R is referred to as a filling factor (FF). When a lattice interval of the square lattice is a, the filling factor FF of the modified refractive index region 15b is given as $SA/a^2$. SA represents the area of the modified refractive index region 15b in the X-Y plane, and $SA=LA \cdot h/2$ is given using a length LA of a certain side and a distance h between the side and a vertex opposing the side, for example, in the case of the triangular shape. The lattice interval a of the square lattice is a degree obtained by dividing a wavelength by an equivalent refractive index, and is set to about 300 nm, for example.

Figure 5:
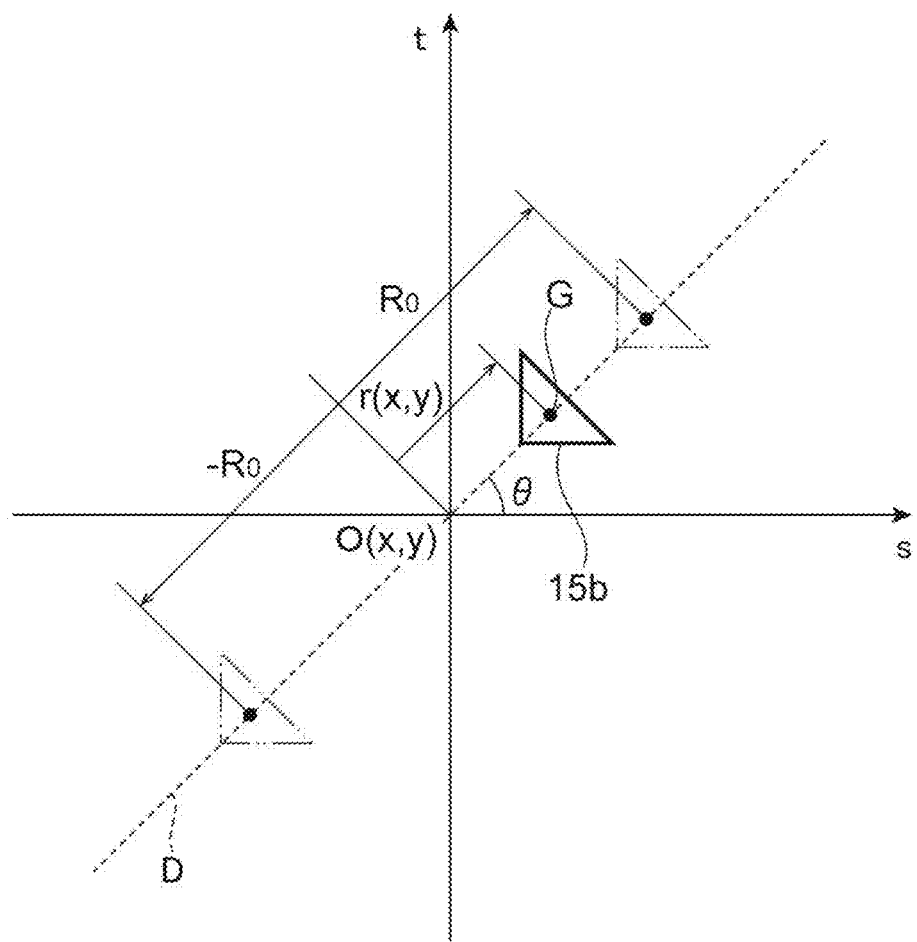
FIG. 5 is a view illustrating a positional relationship of modified refractive index regions in the phase modulation layer.

FIG. 5 is a view illustrating a positional relationship of the modified refractive index regions 15b in the phase modulation layer 15A. As illustrated in FIG. 5, the gravity center G of each of the modified refractive index regions 15b is arranged on a straight line D. The straight line D is a straight line that passes through the corresponding lattice point O(x, y) of the unit constituent region R(x, y) and is inclined with respect to each side of the square lattice. In other words, the straight line D is a straight line that is inclined with respect to both an s-axis (parallel to the X-axis) and a t-axis (parallel to the Y-axis) that define the unit constituent region R(x, y). A tilt angle of the straight line D with respect to the s-axis (the tilt angle based on a part of the s-axis starting from a lattice point) is θ. The tilt angle θ is constant in the phase modulation layer 15A (may be partially constant in the phase modulation layer 15A). In addition, the tilt angle θ satisfies 0°<θ<90°, and in one example, θ=45°. Alternatively, the tilt angle θ satisfies 180°<θ<270°, and in one example, θ=225°. When the tilt angle θ satisfies 0°<θ<90° or 180°<θ<270°, the straight line D extends from the first quadrant to the third quadrant of the coordinate plane defined by the s-axis and the t-axis. Alternatively, the tilt angle θ satisfies 90°<θ<180°, and in one example, θ=135°. Alternatively, the tilt angle θ satisfies 270°<θ<360°, and in one example, θ=315°. When the tilt angle θ satisfies 90°<θ<180° or 270°<θ<360°, the straight line D extends from the second quadrant to the fourth quadrant of the coordinate plane defined by the s-axis and the t-axis. In this manner, the tilt angle θ is an angle excluding 0°, 90°, 180°, and 270°. Here, a distance between the lattice point O(x, y) and the gravity center G is denoted by r(x, y). Here, x represents a position of an x-th lattice point on the X-axis, and y represents a position of a y-th lattice point on the Y-axis. When the distance r(x, y) is a positive value, the gravity center G is positioned in the first quadrant (or the second quadrant). When the distance r(x, y) is a negative value, the gravity center G is positioned in the third quadrant (or the fourth quadrant). When the distance r(x, y) is zero, the lattice point O and the gravity center G coincide with each other.

The distance r(x, y) between the gravity center G of each of the modified refractive index regions 15b and the corresponding lattice point O(x, y) of the unit constituent region R(x, y) illustrated in FIG. 5 is set for each of the modified refractive index regions 15b according to an output beam pattern (optical image). That is, the distribution of the distance r(x, y) has a specific value for each position determined by values of x (x1 to x4 in the example of FIG. 4) and y (y1 to y3 in the example of FIG. 4), but is not necessarily expressed by a specific function. The distribution of the distance r(x, y) is determined by extracting the phase distribution from the complex amplitude distribution obtained by inverse Fourier transform of the output beam pattern. That is, the distance r(x, y) is set to zero when the phase P(x, y) in the unit constituent region R(x, y) is $P_0$, the distance r(x, y) is set to the maximum value $R_0$ when the phase P(x, y) is $\pi+P_0$, and the distance r(x, y) is set to the minimum value $-R_0$ when the phase P(x, y) is $-\pi+P_0$ as will be described later. Then, for the intermediate phase P(x, y) thereof, the distance r(x, y) is such that $r(x, y)=\{P(x, y)-P_0\} \times R_0/\pi$. Here, the initial phase $P_0$ can be arbitrarily set. When the lattice interval of the square lattice is a, the maximum value $R_0$ of r(x, y) is, for example, in the range of the following Formula (9).

$$0 \leq R_0 \leq \frac{a}{\sqrt{2}} \qquad (9)$$

Incidentally, reproducibility of the beam pattern is improved by applying an iterative algorithm such as the Gerchberg-Saxton (GS) method which is generally used in hologram generation calculation at the time of obtaining the complex amplitude distribution from the output beam pattern.

FIG. 6 is a plan view illustrating an example in which a refractive index substantially periodic structure of FIG. 4 is applied only within a specific region of the phase modulation layer. In the example illustrated in FIG. 6, the substantially periodic structure configured to output a desired beam pattern is formed inside a square inner region RIN similarly to the example illustrated in FIG. 4. On the other hand, a perfect circular modified refractive index region of which gravity-center position coincides with a lattice point position of the square lattice is arranged in an outer region ROUT surrounding the inner region RIN. Lattice intervals of the square lattices that are virtually set are the same (=a) in both the inner region RIN and the outer region ROUT. In this structure, light is distributed also in the outer region ROUT so that it is possible to suppress the occurrence of high-frequency noise (so-called window function noise) caused by an abrupt change in light intensity in the peripheral portion of the inner region RIN. In addition, light leakage in a direction parallel to the X-Y plane can be suppressed, and reduction in threshold current can be expected.

Figure 7:
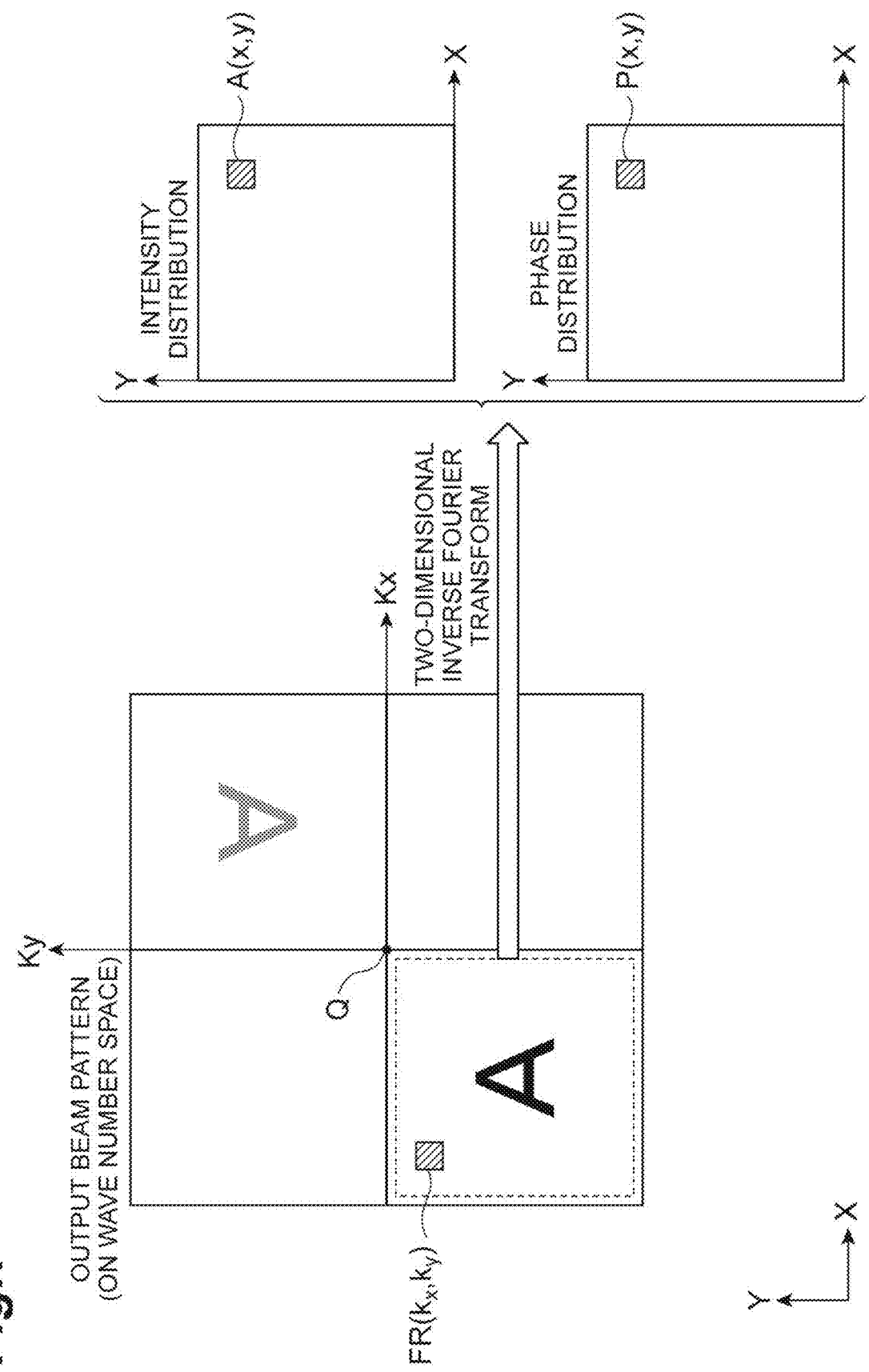
FIG. 7 is a view for describing a relationship between an optical image obtained by forming an output beam pattern of the semiconductor light-emitting element and a phase distribution in the phase modulation layer.

FIG. 7 is a view for describing a relationship between an output beam pattern (optical image) from the semiconductor light-emitting element 1A and distance distribution in the phase modulation layer 15A. Although details will be described later, a Kx-Ky plane obtained by converting a beam projection region, which is a projection range of the output beam pattern, into a wave number space will be considered. A Kx-axis and a Ky-axis defining this Kx-Ky plane are orthogonal to each other, and correspond to angles with respect to a normal direction when a projection direction of the output beam patterns is swung in the in-plane direction of the main surface 10a from the normal direction (Z-axis direction) of the main surface 10a (details will be described later). It is assumed that a specific region including the output beam pattern is constituted by M2 (an integer of one or more)×N2 (an integer of one or more) image regions FR each having a square shape on the Kx-Ky plane. In addition, it is assumed that the virtual square lattice set on the X-Y plane on the design plane (X-Y plane) of the phase modulation layer 15A is constituted by M1 (an integer of one or more)×N1 (an integer of one or more) unit constituent regions R. Incidentally, the integer M2 does not need to coincide with the integer M1. Likewise, the integer N2 does not need to coincide with the integer N1. At this time, a complex amplitude F(x, y) in the unit constituent region R(x, y), which is obtained by two-dimensional inverse Fourier transform of each image region FR($k_x$, $k_y$) on the Kx-Ky plane, specified by the coordinate component $k_x$ (an integer of from 0 to M2−1) in the Kx-axis direction and the coordinate component $k_y$ (an integer of from 0 to N2−1) in the Ky-axis direction, to the unit constituent region R(x, y) specified by the coordinate component x (an integer of from 1 to M1) in the X-axis direction and the coordinate component y (an integer of from 1 to N1) in the Y-axis direction, is defined by an amplitude term A(x, y) and a phase term P(x, y). In addition, as illustrated in FIG. 7, the distribution of the amplitude term A(x, y) at the complex amplitude F(x, y) of the unit constituent region R(x, y) corresponds to the amplitude distribution on the X-Y plane in a range of coordinate components of x=1 to M1 and y=1 to N1. In addition, the distribution of the phase term P(x, y) at the complex amplitude F(x, y) in the unit constituent region R corresponds to phase distribution on the X-Y plane in the range of x=1 to M1 and y=1 to N1. The distance r(x, y) in the unit constituent region R(x, y) is obtained from P(x, y), and the distribution of the distance r(x, y) of the unit constituent region R(x, y) corresponds to the distance distribution on the X-Y plane in the range of coordinate components of x=1 to M1 and y=1 to N1.

Incidentally, the center Q of the output beam pattern on the Kx-Ky plane is positioned on an axis perpendicular to the main surface 10a, and four quadrants with the center Q as the origin are illustrated in FIG. 7. Although a case where an optical image is obtained in the first quadrant and the third quadrant is illustrated in FIG. 7 as an example, it is also possible to obtain images in the second quadrant and the fourth quadrant, or in all the quadrants. In the present embodiment, a pattern point-symmetric with respect to the origin can be obtained as illustrated in FIG. 7. FIG. 7 illustrates a case where, for example, a character "A" in the third quadrant and a pattern obtained by rotating the character "A" by 180° in the first quadrant are obtained. Incidentally, rotationally-symmetric optical images (for example, a cross, a circle, a double circle, or the like) are observed as one optical image in an overlapping manner.

The output beam pattern (optical image) from the semiconductor light-emitting element 1A becomes an optical image corresponding to the designed optical image (original image) expressed by at least one of a spot, a spot group consisting of three or more points, a straight line, a cross, a line drawing, a lattice pattern, a photograph, a stripe pattern, computer graphics (CG), and a character. Here, the distribution of the distance r(x, y) of the modified refractive index region 15b of the phase modulation layer 15A is determined by the following procedure in order to obtain a desired optical image of an output beam pattern.

Figure 8:
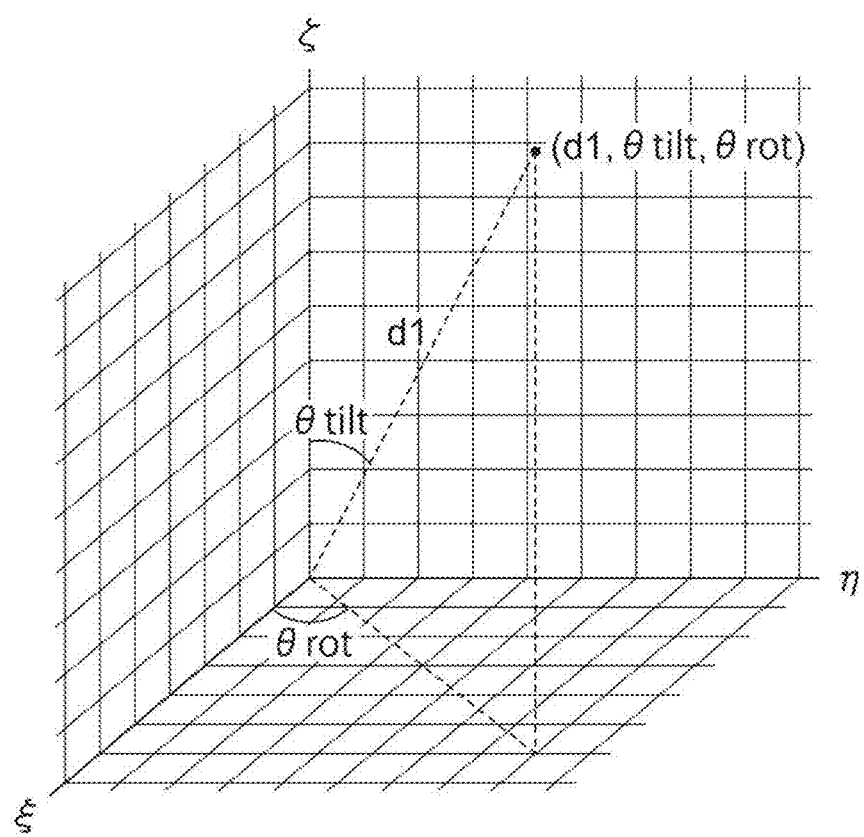
FIG. 8 is a view for describing coordinate conversion from a spherical coordinate to a coordinate in an XYZ orthogonal coordinate system.

First, as a first precondition, a virtual square lattice constituted by M1 (an integer of one or more)×N1 (an integer of one or more) unit constituent regions R each having a square shape is set on the X-Y plane in the XYZ orthogonal coordinate system. Next, as a second precondition, coordinates (ξ, η, ζ) in the XYZ orthogonal coordinate system are assumed to satisfy a relationship expressed by the following Formulas (10) to (12) with respect to spherical coordinates (d1, $θ_{tilt}$, $θ_{rot}$) defined by a radius length d1, a tilt angle fit from the Z-axis, and a rotational angle $θ_{rot}$ from the X-axis specified on the X-Y plane as illustrated in FIG. 8. Incidentally, FIG. 8 is a view for describing coordinate transformation from spherical coordinates (d1, $θ_{tilt}$, $θ_{rot}$) to coordinates (ξ, η, ζ) in the XYZ orthogonal coordinate system, and a designed optical image on a predetermined plane set in the XYZ orthogonal coordinate system, which is the real space, is expressed by the coordinates (ξ, η, ζ). When the beam pattern corresponding to the optical image outputted from the semiconductor light-emitting element is a set of bright spots directed in directions defined by the angles $θ_{tilt}$ and $θ_{rot}$, the angles $θ_{tilt}$ and $θ_{rot}$ are converted to a coordinate value $k_x$, which is a normalized wave number defined by the following Formula (13), on a Kx-axis corresponding to the X-axis and a coordinate value $k_y$ which is a normalized wave number defined by the following Formula (14), on a Ky-axis corresponds to the Y-axis and orthogonal to the Kx-axis. The normalized wave number means a wave number normalized assuming that a wave number corresponding to the lattice interval of the virtual square lattice is 1.0. At this time, in the wave number space defined by the Kx-axis and the Ky-axis, a specific wave number range including the beam pattern corresponding to the optical image is constituted by M2 (an integer of one or more)×N2 (an integer of one or more) image regions FR each having a square shape. Incidentally, the integer M2 does not need to coincide with the integer M1. Likewise, the integer N2 does not need to coincide with the integer N1. In addition, Formulas (13) and (14) are described in, for example, the following Document (1).

(1) Y. Kurosaka et al., "Effects of non-lasing band in two-dimensional photonic-crystal lasers clarified using omnidirectional band structure," Opt. Express 20, 21773-21783 (2012)

$$\xi = d1\sin\theta_{tilt}\cos\theta_{rot} \quad (10)$$

$$\eta = d1\sin\theta_{tilt}\sin\theta_{rot} \quad (11)$$

$$\zeta = d1\cos\theta_{tilt} \quad (12)$$

$$k_x = \frac{a}{\lambda}\sin\theta_{tilt}\cos\theta_{rot} \quad (13)$$

$$k_y = \frac{a}{\lambda}\sin\theta_{tilt}\sin\theta_{rot} \quad (14)$$

a: Lattice constant of virtual square lattice
λ: Oscillation wavelength

As a third precondition, in the wave number space, a complex amplitude $F(x, y)$, which is obtained by two-dimensional inverse Fourier transform of each image region $FR(k_x, k_y)$, specified by the coordinate component $k_x$ (an integer of from 0 to M2-1) in the Kx-axis direction and the coordinate component $k_y$ (an integer of from 0 to N2-1) in the Ky-axis direction to the unit constituent region R(x, y) on the X-Y plane specified by the coordinate component x (an integer of from 1 to M1) in the X-axis direction and the coordinate component y (an integer of from 1 to N1) in the Y-axis direction, is given by the following Formula (15) with j as an imaginary unit. In addition, this complex amplitude $F(x, y)$ is defined by the following Formula (16) when an amplitude term is $A(x, y)$ and a phase term is $P(x, y)$. In addition, as a fourth precondition, the unit constituent region R(x, y) is defined by an s-axis and a t-axis which are parallel to the X-axis and the Y-axis, respectively, and orthogonal to each other in the lattice point O(x, y) that is the center of the unit constituent region R(x, y).

$$F(x, y) = \sum_{k_x=0}^{M2-1}\sum_{k_y=0}^{N2-1} FR(k_x, k_y)\exp\left[j2\pi\left(\frac{k_x}{M2}x + \frac{k_y}{N2}y\right)\right] \quad (15)$$

$$F(x, y) = A(x, y) \times \exp[jP(x, y)] \quad (16)$$

Under the above first to fourth preconditions, the phase modulation layer 15A is configured to satisfy the following conditions. That is, the corresponding modified refractive index region 15b is arranged in the unit constituent region R(x, y) such that the distance r(x, y) from the lattice point O(x, y) to the gravity center G of the corresponding modified refractive index region 15b satisfies a relationship of $$r(x,y)=C\times(P(x,y)-P_0)$$

(here, C is a proportional constant, for example, $R_0/\pi$ and $P_0$ is an arbitrary constant, for example, 0). That is, the distance r(x, y) is set to zero when the phase P(x, y) in certain coordinates R(x, y) is $P_0$, is set to the maximum value $R_0$ when the phase P(x, y) is $\pi+P_0$, and is set to the minimum value $-R_0$ when the phase P(x, y) is $-\pi+P_0$. When it is desired to obtain a desired optical image, the optical image is preferably subjected to inverse Fourier transform to apply the distribution of the distance r(x, y) corresponding to the phase P(x, y) of the complex amplitude to the plurality of modified refractive index regions 15b. The phase P(x, y) and the distance r(x, y) may be proportional to each other.

Incidentally, a far-field image after the inverse Fourier transform of the laser beam can take various shapes such as a single spot shape or a plurality of spot shapes, an annular shape, a linear shape, a character shape, a double annular shape, and a Laguerre Gaussian beam shape. Since a beam direction can be also controlled, a laser processing machine that electrically performs high-speed scanning can be realized by arraying the semiconductor light-emitting elements 1A one-dimensionally or two-dimensionally. Incidentally, the beam pattern is represented by angle information in the far field, and thus, the inverse Fourier transform may be performed after once converting the pattern to the angle information and then, converting the angle information to the wave number space in the case of a bit map image or the like in which the target beam pattern is represented by two-dimensional position information.

As a method for obtaining the amplitude distribution and the phase distribution from the complex amplitude distribution obtained by the inverse Fourier transform, for example, the amplitude distribution A(x, y) can be calculated by using the abs function of numerical analysis software "MATLAB" of MathWorks, Inc., and the phase distribution P(x, y) can be calculated by using the angle function of MATLAB.

Here, a description will be given regarding points to be noted in the case of performing calculation using general discrete Fourier transform (or fast Fourier transform) when the distance r(x, y) of the respective modified refractive index regions 15b is determined by obtaining the phase distribution P(x, y) based on a result of the inverse Fourier transform of the optical image. The output beam pattern calculated from the complex amplitude distribution obtained by the inverse Fourier transform of FIG. 9A, which is the desired optical image, is given as illustrated in FIG. 9B. When divided into four quadrants A1, A2, A3, and A4 as illustrated in FIGS. 9A and 9B, a pattern in which a pattern, obtained by rotating a pattern of the first quadrant of FIG. 9A by 180°, and a pattern of the third quadrant in FIG. 9A overlap with each other appears in the first quadrant of the output beam pattern in FIG. 9B. A pattern in which a pattern, obtained by rotating a pattern of the second quadrant of FIG. 9A by 180°, and a pattern of the fourth quadrant of FIG. 9A overlap with each other appears in the second quadrant of the beam pattern. A pattern in which a pattern, obtained by rotating the pattern of the third quadrant of FIG. 9A by 180°, and the pattern of the first quadrant of FIG. 9A overlap with each other appears in the third quadrant of the beam pattern. A pattern in which a pattern, obtained by rotating the pattern of the fourth quadrant of FIG. 9A by 180°, and the pattern of the second quadrant of FIG. 9A overlap with each other appears in the fourth quadrant of the beam pattern. At this time, the pattern rotated by 180° is a pattern based on −1st-order light component.

Therefore, when a beam pattern having a value only in the first quadrant is used as the optical image (original optical image) before being subjected to the Fourier transform, the first quadrant of the original optical image appears in the third quadrant of the obtained beam pattern, and a pattern obtained by rotating the first quadrant of the original optical image by 180° appears in the first quadrant of the obtained beam pattern.

Incidentally, a material system, a film thickness, and a layer configuration can be variously changed as long as it is configured to include the active layer 12 and the phase modulation layer 15A in the above structure. Here, a scaling rule holds regarding a so-called square lattice photonic crystal laser in which perturbation from the virtual square lattice is zero. That is, when a wavelength becomes constant α times, the same standing wave state can be obtained by multiplying the entire square lattice structure by α. Similarly, it is possible to determine the structure of the phase modulation layer 15A according to the scaling rule depending on the wavelength even in the present embodiment. Therefore, it is also possible to realize the semiconductor light-emitting element 1A that outputs visible light by using the active layer 12 that emits light such as blue, green, and red, and applying the scaling rule depending on the wavelength.

When producing the semiconductor light-emitting element 1A, each compound semiconductor layer is formed by a metal organic chemical vapor deposition (MOCVD) method or a molecular beam epitaxy method (MBE). In the production of the semiconductor light-emitting element 1A using AlGaAs, a growth temperature of AlGaAs can be set at 500° C. to 850° C. Trimethylaluminium (TMA) is used as an Al raw material at the time of growth, trimethyl gallium (TMG) and triethyl gallium (TEG) are used as gallium raw materials, $AsH_3$ (arsine) is used as an As raw material, disilane ($Si_2H_6$) is used as a raw material of an N-type impurity, and diethylzinc (DEZn) is used as a raw material of a P-type impurity. In the growth of GaAs, TMG and arsine are used, but TMA is not used. InGaAs is produced using TMG, trimethylindium (TMI), and arsine. An insulating film is formed by sputtering a target with a constituent material thereof as a raw material or by a plasma CVD (PCVD) method.

Figure 10A:
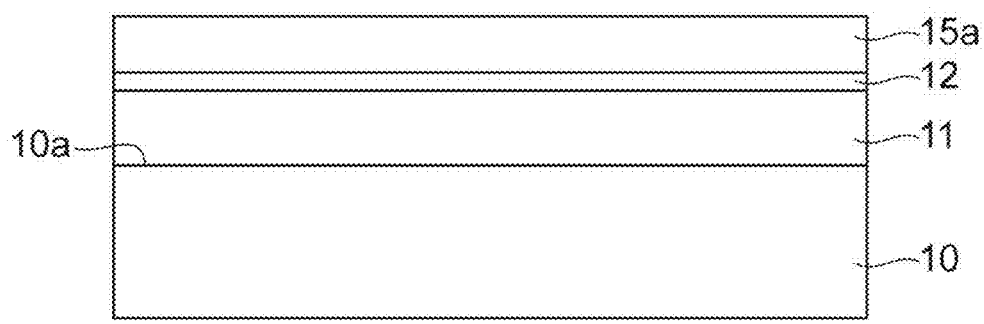
FIGS. 10A to 10C are views illustrating each step in a production method for the semiconductor light-emitting element.
Figure 10B:
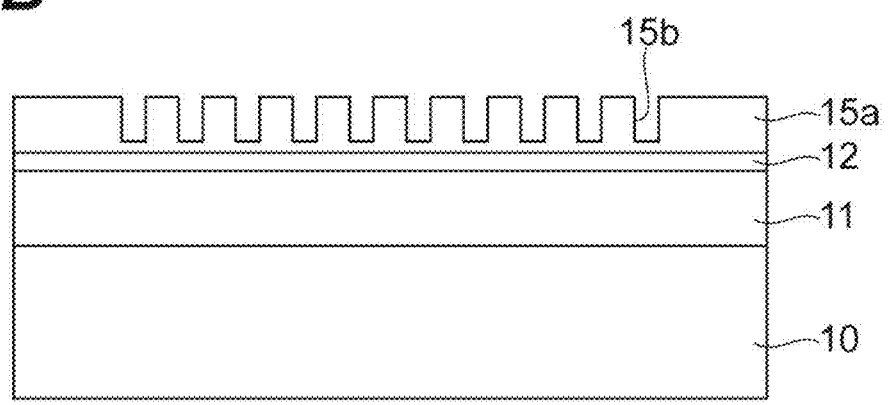
Figure 10C:
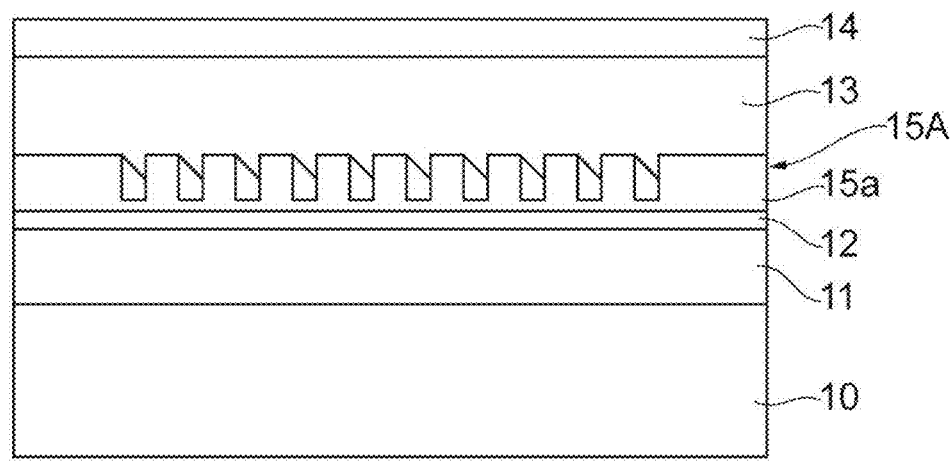

In FIGS. 10A to 10C. are views illustrating the respective steps in a production method for the semiconductor light-emitting element 1A. First, as illustrated in FIG. 10A, the cladding layer 11, the active layer 12, and the base layer 15a are sequentially provided on the main surface 10a of the semiconductor substrate 10, for example, by an epitaxial growth method using the metal organic chemical vapor deposition (MOCVD) method.

Subsequently, another resist is applied to the base layer 15a, and a two-dimensional fine pattern is drawn on the resist by an electron beam drawing apparatus. The two-dimensional fine pattern is formed on the resist by developing the resist on which the pattern has been drawn. Thereafter, the two-dimensional fine pattern is transferred to the base layer 15a by dry etching using the resist as a mask. As a result, a plurality of depressions (which may be holes) that are to serve as the modified refractive index regions 15b are formed as illustrated in FIG. 10B. Each planar shape of the plurality of depressions is a shape in which a width in a certain direction gradually decreases along a direction intersecting the direction (for example, a triangular shape, see FIG. 4) as described above. Incidentally, a step of forming a SiN layer or a $SiO_2$ layer on the base layer 15a by a PCVD method before forming a resist, a step of forming a resist mask on these formed layers (SiN layer and $SiO_2$ layer), a step of transferring a fine pattern to the SiN layer or the $SiO_2$ layer by reactive ion etching (RIE), and a step of removing the resist and then performing dry etching may be sequentially performed. In this case, the resistance to dry etching can be enhanced.

Subsequently, the cladding layer 13 and the contact layer 14 are sequentially provided by the MOCVD method as illustrated in FIG. 10C. When the cladding layer 13 grows, the plurality of depressions serving as the modified refractive index regions 15b are closed by the cladding layer 13. At this time, a part of the cladding layer 13 enters the depression, but the degree of the entrance changes in the depression due to the planar shape of the depression. That is, the degree of entrance of the cladding layer 13 changes between a portion where the width of the depression is wide and a portion where the width of the depression is narrow. Therefore, the refractive index interface between the cladding layer 13 and the modified refractive index region 15b is inclined with respect to the interface between the base layer 15a and the cladding layer 13. Since the interface between the base layer 15a and the cladding layer 13 is parallel to the main surface 10a, the refractive index interface between the cladding layer 13 and the modified refractive index region 15b is inclined with respect to the main surface 10a and the direction perpendicular to the main surface 10a. Although FIG. 10C illustrates an example in which a part of the cladding layer 13 enters the depression, conversely, the depression may enter the cladding layer 13. Incidentally, such a method is described in the following Document (2).

(2) Kazuyoshi Hirose et al., "Watt-class high-power, high-beam-quality photonic-crystal lasers", Nature Phoronics 8, pp. 406-411 (2014)

Thereafter, the electrodes 16 and 17 illustrated in FIG. 2 are formed by a vapor deposition method, a sputtering method, or the like. In addition, the protective film 18 and the anti-reflection film 19 are formed by a sputtering method, a PCVD method, or the like if necessary. The semiconductor light-emitting element 1A of the present embodiment is produced through the above steps. Incidentally, the phase modulation layer 15A is formed on the cladding layer 11 before the formation of the active layer 12 in the case where the phase modulation layer 15A is provided between the active layer 12 and the cladding layer 11.

Incidentally, if unit vectors of orthogonal coordinates are x and y in the case of the square lattice with the lattice interval a, basic translation vectors are $a_1=ax$ and $a_2=ay$, and basic reciprocal lattice vectors are $b_1=(2\pi/a)x$, and $b_2=(2\pi/a)y$ for the translation vectors $a_1$ and $a_2$. In a case where a wave number vector of a wave existing in the lattice is $k=nb_1+mb_2$ (n and m are arbitrary integers), a wave number k exists at a Γ point. If a magnitude of the wave number vector is equal to a magnitude of the basic reciprocal lattice vector in such a case, a resonance mode (a standing wave in the X-Y plane) with the lattice interval a equal to the wavelength λ is obtained. In the present embodiment, oscillation in such a resonance mode (standing wave state) is obtained. Considering a TE mode in which an electric field is present in a plane parallel to the square lattice at this time, there are four modes of the standing wave state where the lattice interval and the wavelength are equal as described above due to the symmetry of the square lattice. In the present embodiment, a desired beam pattern can be similarly obtained in any mode of oscillation in any of these four standing wave states.

In the semiconductor light-emitting element 1A, the standing wave in the phase modulation layer 15A is scattered by the modified refractive index region 15b having a predetermined shape, and the wavefront obtained in the vertical direction (Z-axis direction) is phase-modulated. A desired beam pattern is obtained. Thus, the desired beam pattern can be obtained even without a polarizing plate. This beam pattern can be not only a pair of single peak beams (spots) but also a character shape or two or more spot groups having the same shape as described above or a vector beam or the like in which phase or intensity distribution is spatially non-uniform.

It is preferable that the refractive index of the base layer 15a be 3.0 to 3.5 and the refractive index of the modified refractive index region 15b be 1.0 to 3.4. In addition, an average radius of the depression (modified refractive index region 15b) of the base layer 15a is, for example, 20 nm to 120 nm in the case of a 940 nm band. As a size of this modified refractive index region 15b changes, the diffraction intensity in the Z-axis direction changes. This diffraction efficiency is proportional to an optical coupling coefficient x1 represented by a first-order coefficient at the time of Fourier transform of the shape of the modified refractive index region 15b. The optical coupling coefficient is described in, for example, the following Document (3).

(3) K. Sakai et al., "Coupled-Wave Theory for Square-Lattice Photonic Crystal Lasers With TE Polarization", IEEE J.Q. E. 46, 788-795(2010)

Effects obtained by the semiconductor light-emitting element 1A of the present embodiment having the above configuration will be described. In the semiconductor light-emitting element 1A of the present embodiment, the phase modulation layer 15A optically coupled to the active layer 12 includes the base layer 15a and the plurality of modified refractive index regions 15b having the refractive index different from that of the base layer 15a. In addition, the gravity centers G of the corresponding modified refractive index regions 15b are arranged on the straight line D that passes through the lattice point O(x, y) and is inclined with respect to each side of the square lattice (parallel to the s-axis and the t-axis defining the unit constituent region R(x, y)) in the unit constituent region R(x, y) including the lattice point O(x, y) of the virtual square lattice set on the design plane of the phase modulation layer 15A. Then, the distance r(x, y) between the gravity center G of the modified refractive index region 15b and the corresponding lattice point O(x, y) is individually set for each lattice point according to an optical image. In such a case, the phase of the beam changes according to the distance between the lattice point O(x, y) and the gravity center G. Therefore, it is possible to control the phase of the beam to be outputted from each of the modified refractive index regions 15b by only changing the position of the gravity center G, and to control the beam pattern to be formed as a whole in a desired shape. That is, the semiconductor light-emitting element 1A is the S-iPM laser. Further, with the above-described structure, it is possible to output light that forms an optical image of an arbitrary shape in the direction inclined with respect to the direction (normal direction) perpendicular to the main surface 10a of the semiconductor substrate 10 as in a conventional structure (rotation scheme) in which the gravity center G of each of the modified refractive index regions 15b has a rotational angle according to an optical image about each lattice point O(x, y).

Figure 11A:
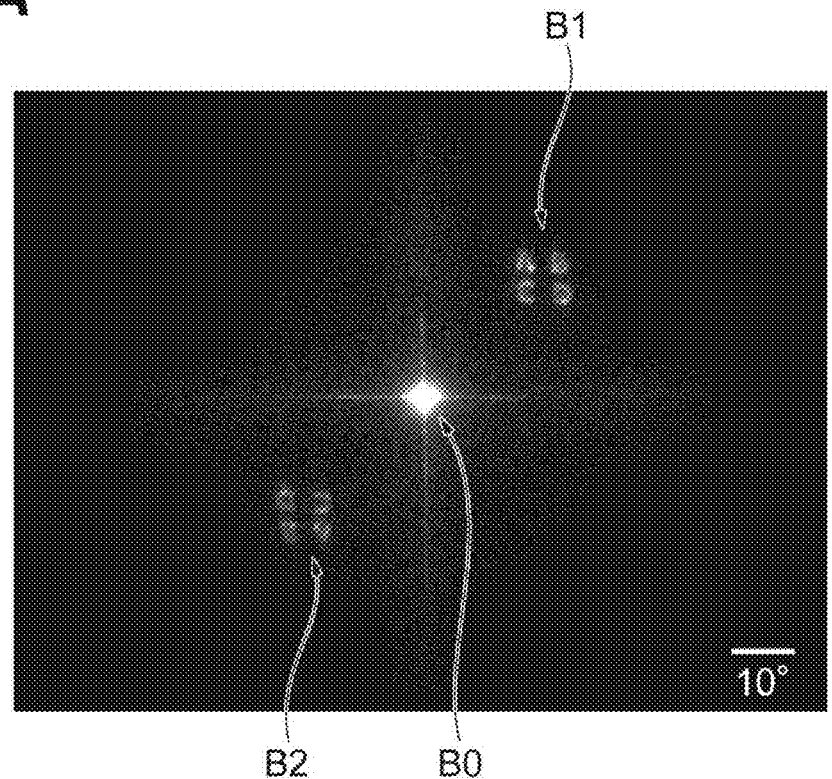
FIG. 11A is a view illustrating an example of a beam pattern (optical image) outputted from the semiconductor light-emitting element.
Figure 11B:
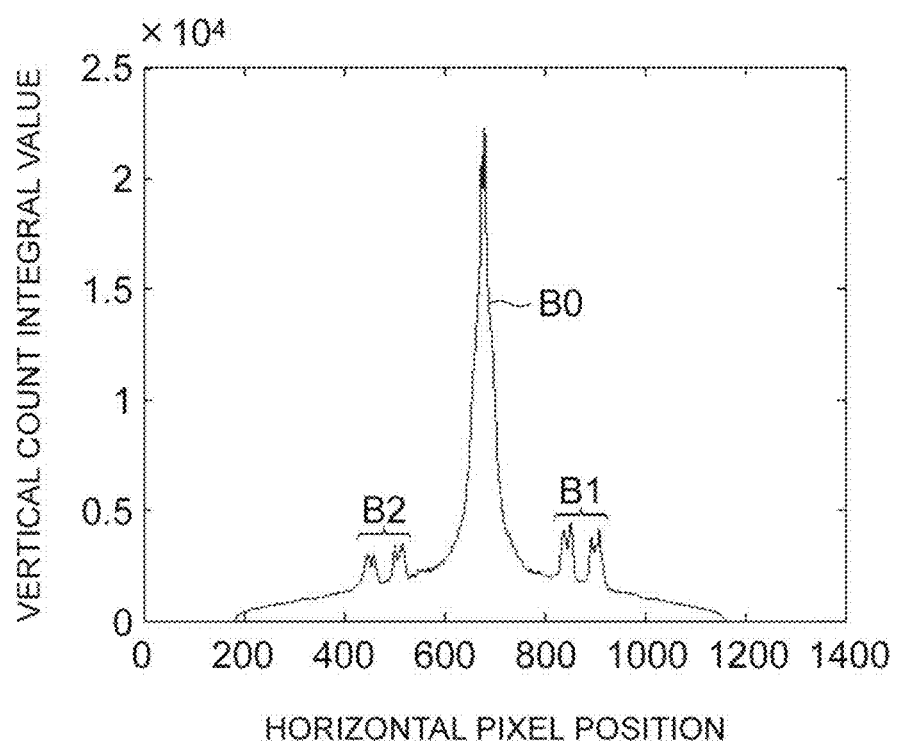
FIG. 11B is a graph illustrating a light intensity distribution in a cross section including an axis perpendicular to a light-emitting surface and intersecting the light-emitting surface of the semiconductor light-emitting element.
Figure 12A:
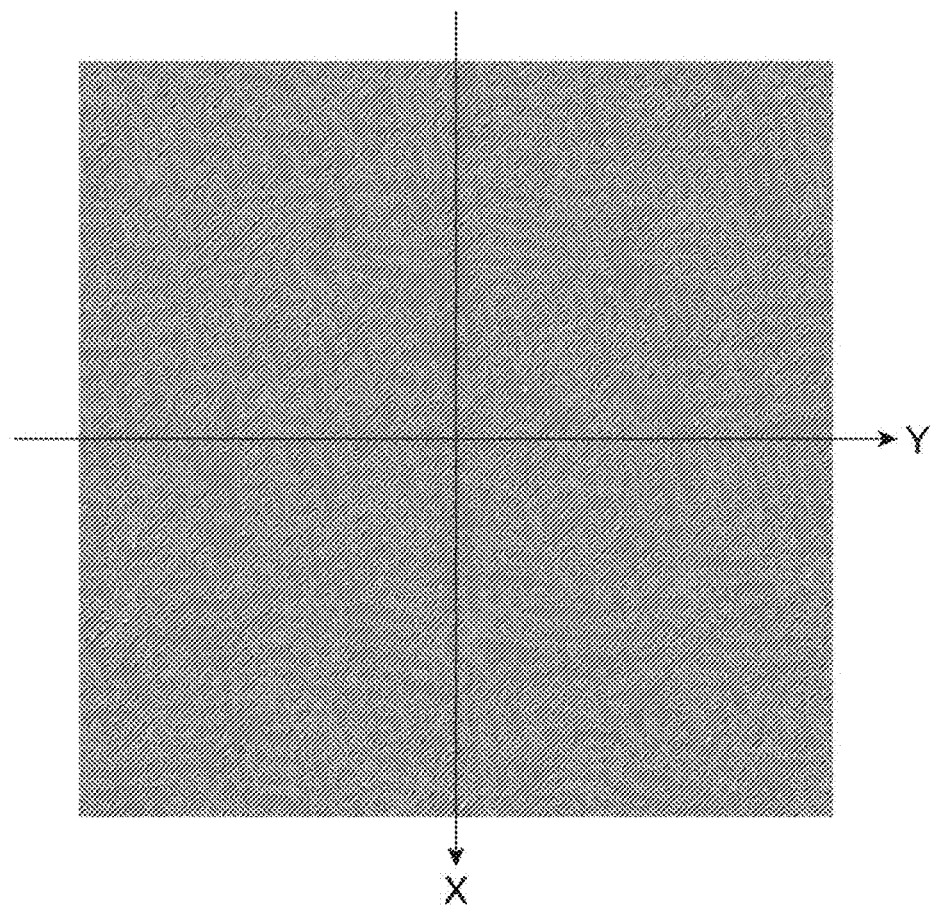
FIG. 12A is a view illustrating a phase distribution corresponding to the beam pattern illustrated in FIG. 11A.
Figure 12B:
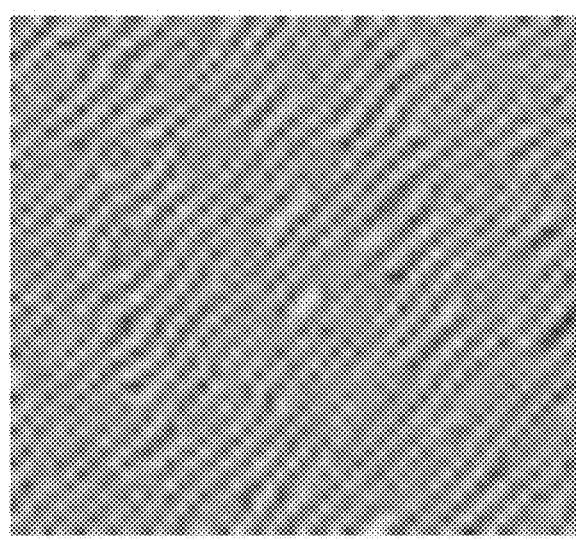
FIG. 12B is a partially enlarged view of FIG. 12A.

Here, FIG. 11A illustrates an example of a beam pattern (optical image) outputted from the semiconductor light-emitting element 1A. A center of FIG. 11A corresponds to an axis that intersects a light-emitting surface of the semiconductor light-emitting element 1A and is perpendicular to the light-emitting surface. In addition, FIG. 11B is a graph illustrating a light intensity distribution in a cross section including the axis. FIG. 11B is a far-field image, acquired using an FFP optical system (A3267-12 manufactured by Hamamatsu Photonics K.K.), a camera (ORCA-05G manufactured by Hamamatsu Photonics K.K.), and a beam profiler (Lepas-12 manufactured by Hamamatsu Photonics K.K.) which is an image obtained by integrating vertical counts of image data of 1344 dots×1024 dots and plotting the resultant. Incidentally, a maximum count number in FIG. 11A is normalized to 255, and 0th-order light B0 at the center is saturated to clearly illustrate an intensity ratio of ±1st-order light. A difference in intensity between the 1st-order light and the −1st-order light can be easily understood based on FIG. 11B. In addition, FIG. 12A is a view illustrating a phase distribution corresponding to the beam pattern illustrated in FIG. 11A. FIG. 12B is a partially enlarged view of FIG. 12A. In FIGS. 12A and 12B, a phase at each location in the phase modulation layer 15A is indicated by shading, and a darker portion is close to the phase angle of 0° and a lighter portion is close to the phase angle of 360°. However, a center value of the phase angle can be arbitrarily set, and thus, the phase angle is not necessarily set within the range of 0° to 360°. As illustrated in FIG. 11A and FIG. 11B, the semiconductor light-emitting element 1A outputs the 1st-order light including a first optical image portion B1 outputted in a first direction inclined with respect to the axis, and −1st-order light including a second optical image portion B2 that is rotationally symmetric with the first optical image portion B1 with respect to the axis and outputted in a second direction that is symmetric with the first direction with respect to the axis. Typically, the first optical image portion B1 appears in the first quadrant in the X-Y plane, and the second optical image portion B2 appears in the third quadrant in the X-Y plane. However, there is a case where any one light between the 1st-order light and the −1st-order light is unnecessary depending on the application. In such a case, it is desirable to reduce unnecessary light between the 1st-order light and the −1st-order light to the required light.

Figure 13:
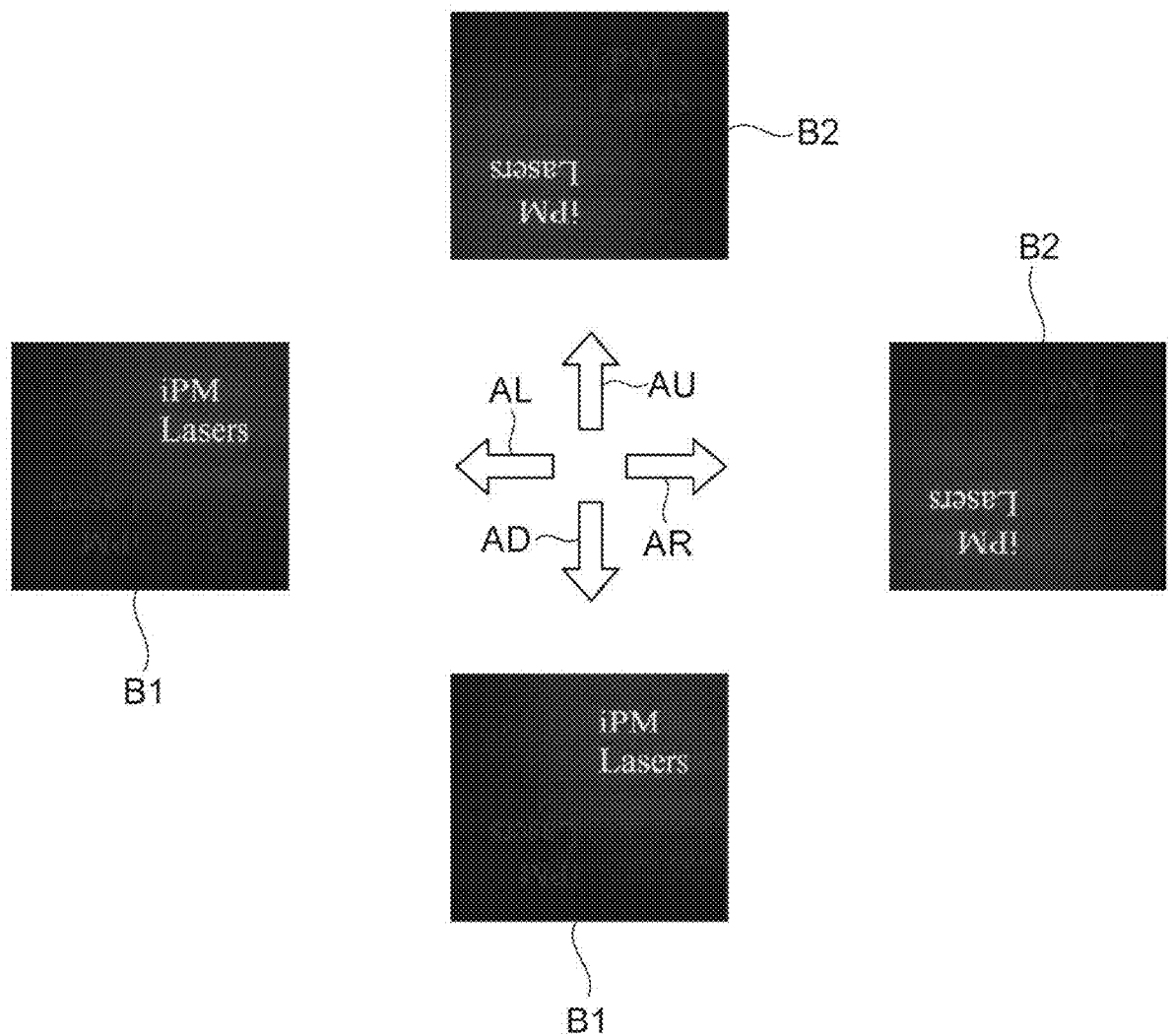
FIG. 13 is a view conceptually illustrating an example of a beam pattern of a traveling wave in each direction. In this example, a tilt angle of a straight line D with respect to an X-axis and a Y-axis is 45°.

FIG. 13 is a view conceptually illustrating an example of a beam pattern of a traveling wave in each direction. In this example, the tilt angle of the straight line D with respect to the s-axis and the t-axis is set to 45°, and the maximum value $R_0$ of the distance r(x, y) between the gravity center G of each of the modified refractive index regions 15b and the corresponding lattice point O(x, y) in the unit constituent region R(x, y) is set as in the following Formula (17).

$$R_0 = \frac{a}{\sqrt{2}} \quad (17)$$

In the phase modulation layer of the square lattice type S-iPM laser, basic traveling waves AU, AD, AR, and AL are generated along the X-Y plane. The traveling waves AU and AD are beams of light traveling along sides extending in the Y-axis direction among sides of the square lattice. The traveling wave AU travels in the positive direction of the Y-axis, and the traveling wave AD travels in the negative direction of the Y-axis. In addition, the traveling waves AR and AL are beams of light traveling along sides extending in the X-axis direction among the sides of the square lattice. The traveling wave AR travels in the positive direction of the X-axis, and the traveling wave AL travels in the negative direction of the X-axis. In this case, beam patterns in opposite directions are obtained from the traveling waves traveling in opposite directions. For example, a beam pattern BU including only the second optical image portion B2 is obtained from the traveling wave AU, and a beam pattern BD including only the first optical image portion B1 is obtained from the traveling wave AD. Similarly, a beam pattern BR including only the second optical image portion B2 is obtained from the traveling wave AR, and a beam pattern BL including only the first optical image portion B1 is obtained from the traveling wave AL. In other words, one of the traveling waves traveling in opposite directions becomes the 1st-order light and the other becomes the −1st-order light.

According to the phase modulation layer 15A of the present embodiment, a difference occurs between the respective light quantities of the 1st-order light and the −1st-order light for the single traveling wave. For example, when the tilt angle θ is 45°, 135, 225°, or 315°, an ideal phase distribution is obtained as the shift amount $R_0$ approaches an upper limit value of the above Formula (9). As a result, the 0th-order light is reduced, and one of the 1st-order light and the −1st-order light is selectively reduced in each of the traveling waves AU, AD, AR, and AL. Thus, in principle, it is possible to provide a difference between the light quantities of the 1st-order light and the −1st-order light by selectively reducing one of the traveling waves traveling in opposite directions.

Here, a description will be given regarding a reason why it is possible to selectively reduce either the 1st-order light or the −1 order light in the scheme of the present embodiment in which the modified refractive index region 15b moves on the straight line D that passes through the lattice point O(x, y) and is inclined with respect to each side of the square lattice illustrated in FIG. 5. For a design phase p(x, y) at a certain position, the traveling wave AU in the positive direction of the t-axis (parallel to the Y-axis) illustrated in FIGS. 12A and 12B is considered as an example of the four traveling waves. At this time, a shift from the lattice point O is r·sin θ·{φ(x, y) −φ$_0$}/π for the traveling wave AU based on the geometrical relationship, and thus, a phase difference is (2π/a) r·sin θ·{φ(x, y) −φ$_0$}/π. Here, it is assumed that the tilt angle θ is 450 and the phase angle φ$_0$ is 0° for simplicity. When the influence of a size of the modified refractive index region 15b is small and can be ignored, the phase distribution ((x, y) for the traveling wave AU is given by the following Formula (18).

$$\Phi(x, y) = \exp\left\{j\left(\frac{\sqrt{2}\,r}{a}\right)\phi(x, y)\right\} \quad (18)$$

The contribution of this phase distribution ((x, y) to the 0th-order light and ±1st-order light is given with components of n=0 and n S±1 in the case of being expanded by exp{nΦ(x, y)} (n: integer). Meanwhile, when a Laurent series expansion of a function f(z) expressed by the following Formula (19) and satisfying the condition of the following Formula (20) is performed, a mathematical formula such as the following Formula (21) is established.

$$f(z) = z^c \quad (19)$$
$$0 < |c| < 1$$

$$c = \frac{\sqrt{2}\,r}{a} \quad (20)$$
$$z = \exp\{j\phi(x, y)\}$$

-continued $$z^c = \sum_{n=-\infty}^{\infty} e^{j\pi(c-n)} \cdot \mathrm{sinc}[\pi(c-n)] \cdot z^n \quad (21)$$

Here, sinc(x)=x/sin(x). When this mathematical formula is used, the phase distribution ((x, y) can be expanded in series, and the respective light quantities of the 0th-order light and ±1st-order light can be described. At this time, when paying attention to the fact that an absolute value of an exponent term exp{jπ(c−n)} of the above Formula (21) is 1, a magnitude of a 0th-order light component of the phase distribution ((x, y) is expressed by the following Formula (22), a magnitude of a 1st-order light component is expressed by the following Formula (23), and a magnitude of a −1st-order light component is expressed by the following Formula (24).

$$\mathrm{sinc}\left(\frac{\sqrt{2}\,\pi r}{a}\right) \quad (22)$$

$$\mathrm{sinc}\cdot\pi\left(-1 + \frac{\sqrt{2}\,r}{a}\right) \quad (23)$$

$$\mathrm{sinc}\cdot\pi\left(1 + \frac{\sqrt{2}\,r}{a}\right) \quad (24)$$

Then, the 0th-order light and −1st-order light components appear in addition to the 1st-order light component in the above Formulas (22) to (24) except for a condition defined by the following Formula (25). However, the magnitudes of the ±1st-order light components are not equal to each other.

$$r = \frac{a}{\sqrt{2}} \quad (25)$$

Although the traveling wave AU in the t-axis direction (Y-axis positive direction) has been considered as one example of the four traveling waves in the above description, the same relationship is established for the other three waves (traveling waves AD, AR, and AL), and the difference occurs between the magnitudes of the ±1st-order light components. With the above discussion, in principle, it is possible to provide the difference between light quantities of the ±1st-order light components according to the scheme of the present embodiment in which the modified refractive index region 15b moves on the straight line D that passes through the lattice point O and is inclined from the square lattice. Therefore, in principle, it is possible to selectively extract only a desired optical image (the first optical image portion B1 or the second optical image portion B2) by reducing the −1st-order light or the 1st-order light. Even in FIG. 11B described above, it can be understood that the difference in intensity occurs between the 1st-order light and the −1st-order light.

Figure 14:
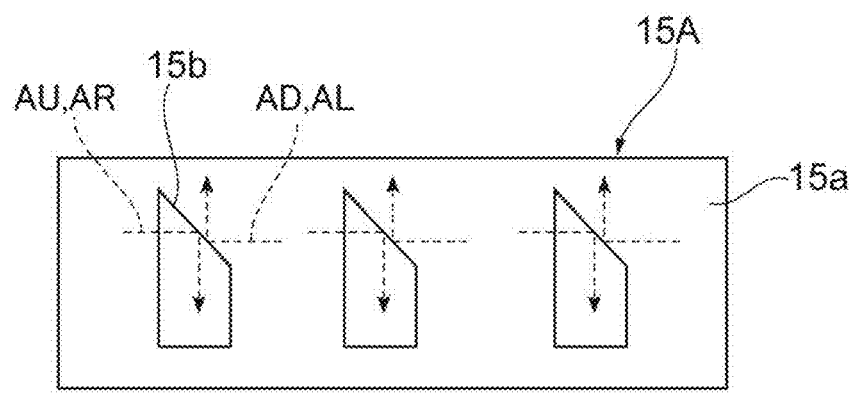
FIG. 14 is a view illustrating how a traveling wave traveling in a plane of the phase modulation layer is scattered or reflected.

In the semiconductor light-emitting element 1A of the present embodiment, the interface between the modified refractive index region 15b and its upper layer (the cladding layer 13 or the active layer 12) is inclined with respect to the main surface 10a. As a result, as illustrated in FIG. 14, the traveling waves AU, AD, AR, and AL traveling in the phase modulation layer 15A in parallel to the main surface 10a are scattered or reflected in a direction (for example, the Z-axis direction) intersecting the design plane (the plane parallel to the X-Y plane) of the phase modulation layer 15A at the interface between the modified refractive index region 15b and its upper layer. At this time, the two traveling waves AU and AD traveling in opposite directions along the main surface 10a in the phase modulation layer 15A are scattered or reflected in directions different from each other, thereby being separated from each other. Similarly, the two traveling waves AR and AL traveling in opposite directions in the plane of the phase modulation layer 15A are scattered or reflected in directions different from each other, thereby being separated from each other.

That is, the traveling waves AU and AR as the 1st-order light (or the −1st-order light) are scattered or reflected toward the semiconductor substrate 10, and the traveling waves AD and AL as the −1st-order light (or the 1st-order light) are scattered or reflected toward the side opposite to the semiconductor substrate 10 (the electrode 16 side). Therefore, an optical path before being outputted to the outside of the device differs between the 1st-order light and the −1st-order light. The traveling waves AU and AR are scattered or reflected toward the semiconductor substrate 10, and thus, directly pass through the semiconductor substrate 10 and are outputted to the outside, and optical paths thereof become short. On the other hand, the traveling waves AD and AL are scattered or reflected toward the side opposite to the semiconductor substrate 10, and thus, optical paths thereof become longer than those of the traveling waves AU and AR by the amount reflected by the electrode 16 and reaching the semiconductor substrate 10. Therefore, the traveling waves AD and AL are attenuated more than the traveling waves AU and AR due to the influence such as action of light absorption in the semiconductor, incomplete reflection at the electrode 16, and scattering accompanying light propagation. Therefore, one of the 1st-order light and the −1st-order light can be reduced with respect to the other light according to the semiconductor light-emitting element 1A of the present embodiment. Even in FIG. 11B corresponding to the experimental result, it can be understood that the difference in intensity occurs between the 1st-order light and the −1st-order light.

Incidentally, the interface between the modified refractive index region 15b and its upper layer is inclined with respect to the main surface 10a in the present embodiment, but this is an example. The above-described effects can be suitably obtained when at least a part of the interface between the plurality of modified refractive index regions 15b and a layer in the periphery thereof is inclined with respect to the main surface 10a.

In addition, one light can be reduced by the attenuation in the semiconductor light-emitting element 1A in the above description, but the semiconductor light-emitting element 1A, or the light-emitting device including the semiconductor light-emitting element 1A may further include a configuration configured to attenuate one light (for example, a light absorption layer provided between the phase modulation layer 15A and the semiconductor substrate 10, a light absorption member provided outside the semiconductor light-emitting element 1A, or the like). In addition, it may be configured such that one light is outputted from a surface opposite to that of the other light (that is, a surface on the cladding layer 13 side with respect to the active layer 12).

Further, the plurality of modified refractive index regions 15b may be depressions, and a planar shape of each of the plurality of modified refractive index regions 15b may be a shape in which a width in a certain direction gradually decreases along a direction intersecting the direction as in the present embodiment. As a result, when another semiconductor layer (for example, the cladding layer 13) is regrown on the phase modulation layer 15A, the interface between the semiconductor layer and the modified refractive index region 15b is inclined with respect to the main surface 10a. Therefore, it is possible to easily realize the configuration in which at least a part of the interface between each of the plurality of modified refractive index regions 15b and each layer in the periphery thereof is inclined with respect to the main surface 10a.

As in the present embodiment, the tilt angle $\theta$ of the straight line D with respect to the square lattice may be constant at all the lattice points set in the phase modulation layer 15A. As a result, it is possible to easily design the arrangement of the gravity centers G of the modified refractive index regions 15b. In addition, the tilt angle $\theta$ may be 45°, 135°, 225°, or 3150 in this case. As a result, two orthogonal waves (for example, the traveling waves AD and AR) traveling along the square lattice can evenly contribute to formation of a desired optical image. Further, when the tilt angle $\theta$ is 45°, 135°, 225° or 315°, directions of electromagnetic fields on the straight line D are aligned in one direction by selecting an appropriate band edge mode, so that linearly polarized light can be obtained. Examples of such a mode include modes A and B illustrated in FIG. 3 of the following Document (4).

(4) C. Peng, et al., "Coupled-wave analysis for photonic-crystal surface-emitting lasers on air holes with arbitrary sidewalls," Optics Express Vol. 19, No. 24, pp. 24672-24686 (2011).

Incidentally, when the tilt angle $\theta$ is 0°, 90°, 180° or 270°, a pair of traveling waves traveling in the Y-axis direction or the X-axis direction among the four traveling waves AU, AD, AR, and AL does not contribute to the 1st-order light (signal light), and thus, it is difficult to increase the efficiency of signal light.

In addition, the light-emitting portion may be the active layer 12 provided on the semiconductor substrate 10 as in the present embodiment. As a result, it is possible to optically couple the light-emitting portion and the phase modulation layer 15A in an easy manner.

Second Embodiment

Figure 15:
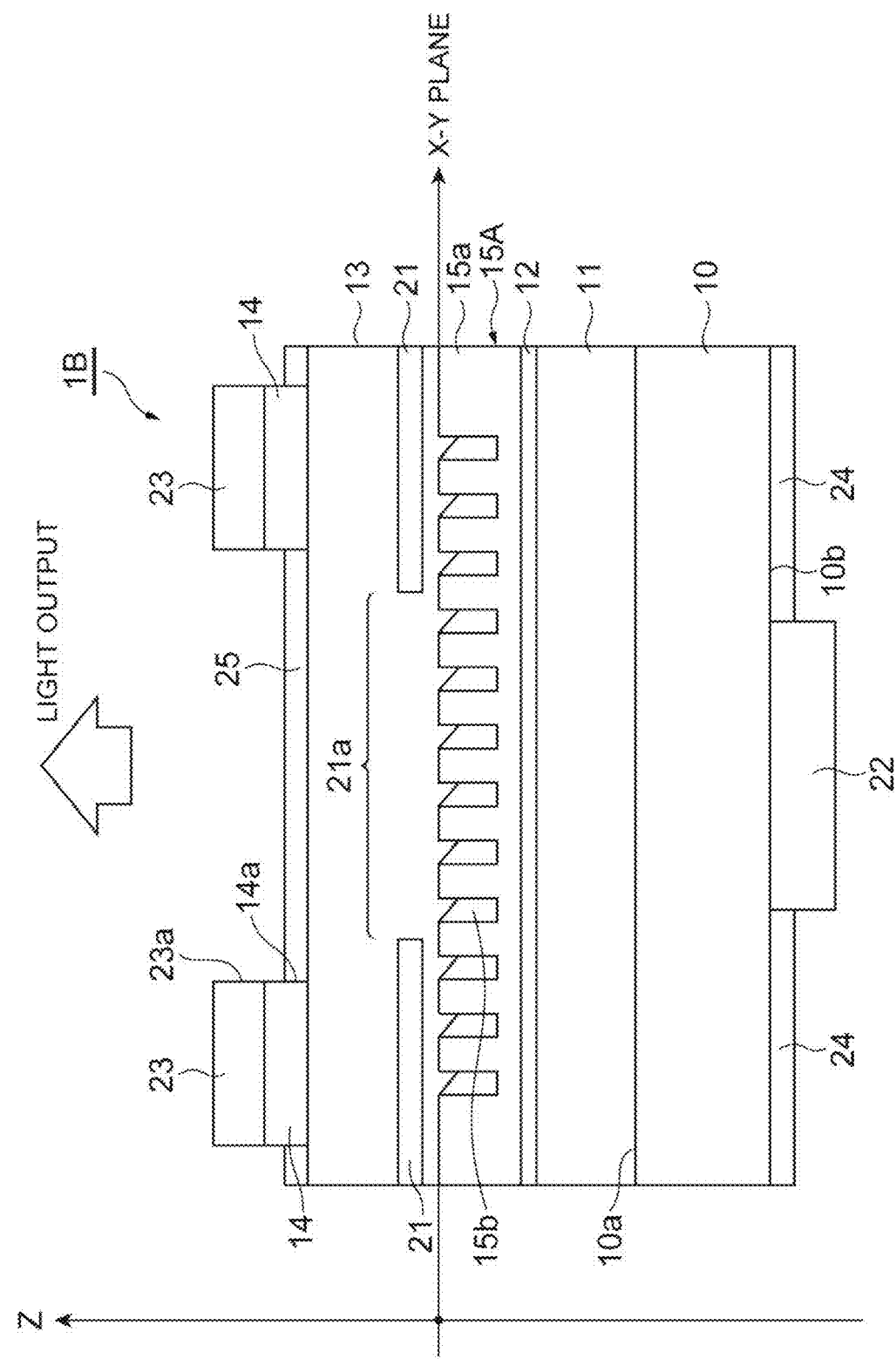
FIG. 15 is a view illustrating a cross-sectional structure of a semiconductor light-emitting element as a light-emitting device according to a second embodiment.

FIG. 15 is a view illustrating a cross-sectional structure of a semiconductor light-emitting element 1B as a light-emitting device according to a second embodiment. This semiconductor light-emitting element 1B is a laser light source that forms a standing wave along the X-Y plane and outputs a phase-controlled plane wave in the Z-axis direction, and outputs light that forms a two-dimensional optical image having an arbitrary shape in directions including a direction (normal direction) perpendicular to the main surface 10a of the semiconductor substrate 10 and an inclination direction inclined with respect to the normal direction similarly to the first embodiment. However, the semiconductor light-emitting element 1B of the present embodiment outputs a beam pattern (optical image) from a front surface on the cladding layer 13 side with respect to the active layer 12 while the semiconductor light-emitting element 1A of the first embodiment outputs the beam pattern (optical image) transmitted through the semiconductor substrate 10 from the rear surface.

The semiconductor light-emitting element 1B includes the cladding layer 11, the active layer 12, the cladding layer 13, the contact layer 14, the phase modulation layer 15A, and a current confinement layer 21. The cladding layer 11 is provided on the semiconductor substrate 10. The active layer 12 is provided on the cladding layer 11. The cladding layer 13 is provided on the active layer 12. The contact layer 14 is provided on the cladding layer 13. The phase modulation layer 15A is provided between the active layer 12 and the cladding layer 13. The current confinement layer 21 is provided in the cladding layer 13. Configurations (preferable materials, band gaps, refractive indices, or the like) of the respective layers 11 to 14 and 15A are the same as those in the first embodiment.

Figure 16:
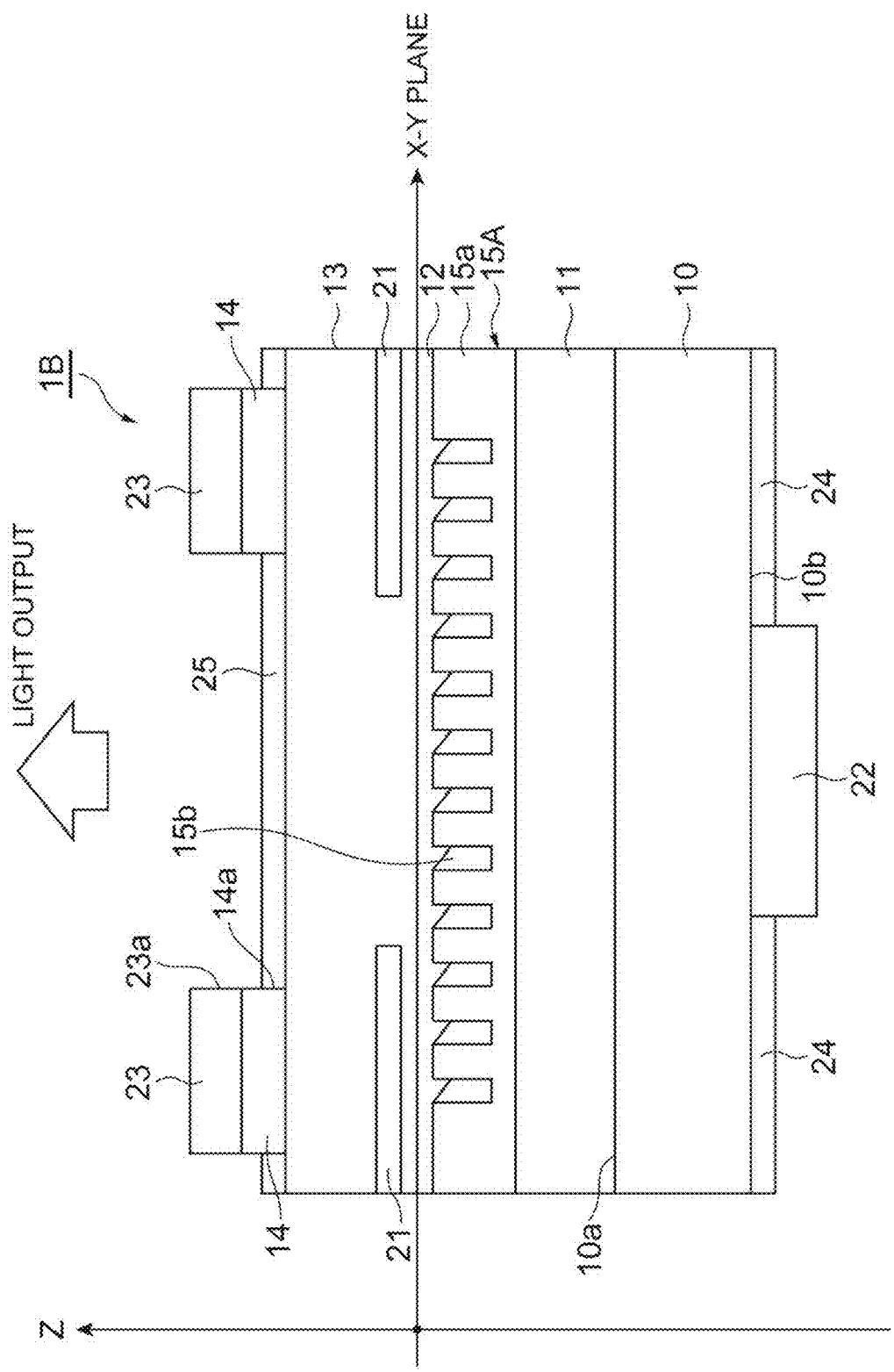
FIG. 16 is a view illustrating a case where a phase modulation layer is provided between the cladding layer 11 and the active layer 12.

A structure of the phase modulation layer 15A is the same as the structure of the phase modulation layer 15A described in the first embodiment (see FIGS. 4 and 5). The light guide layer may be provided between the cladding layers 11 and 13 if necessary. As illustrated in FIG. 16, the phase modulation layer 15A may be provided between the cladding layer 11 and the active layer 12. Incidentally, a light guide layer may include a carrier barrier layer configured to efficiently confine carriers in the active layer 12.

Figure 17:
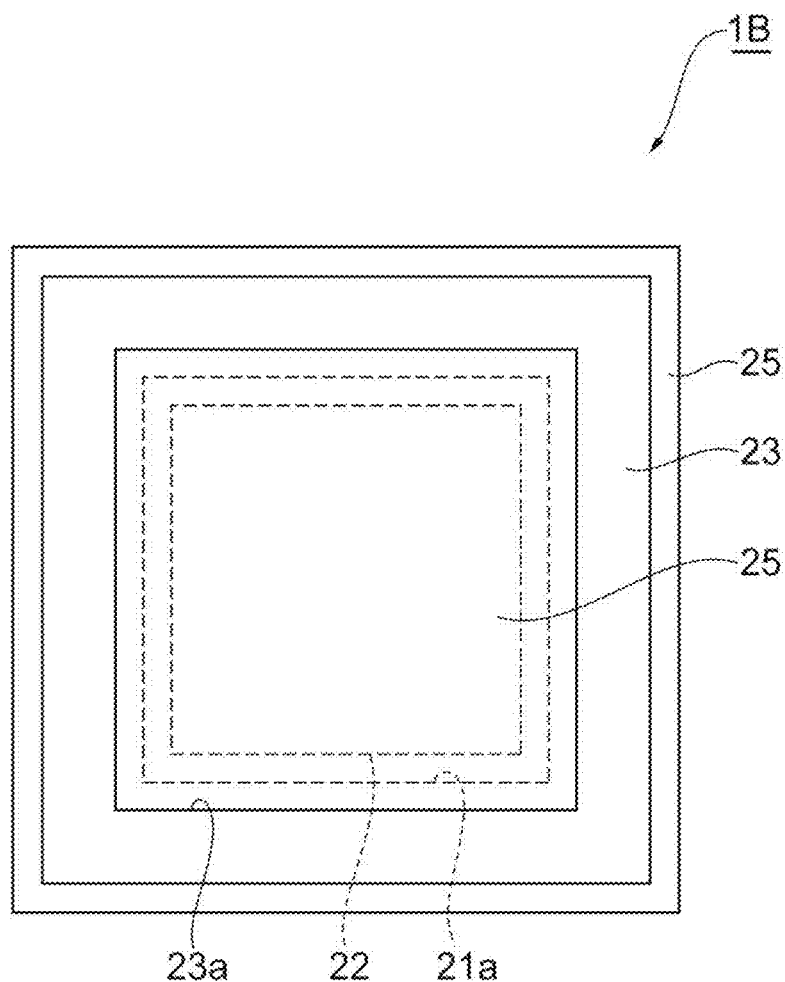
FIG. 17 is a plan view of the semiconductor light-emitting element as viewed from a front surface side.

The semiconductor light-emitting element 1B further includes an electrode 23 provided on the contact layer 14 and an electrode 22 provided on a rear surface 10b of the semiconductor substrate 10. The electrode 23 is in ohmic contact with the contact layer 14, and the electrode 22 is in ohmic contact with the semiconductor substrate 10. FIG. 17 is a plan view of the semiconductor light-emitting element 1B as viewed from the electrode 23 side (front surface side). As illustrated in FIG. 17, the electrode 23 has a frame-like (annular) planar shape (having an opening 23a). Incidentally, the electrode 23 having a square frame shape is illustrated in FIG. 17, but various shapes such as an annular shape can be adopted as the planar shape of the electrode 23. In addition, a shape of the electrode 22 indicated by a broken line in FIG. 17 is similar to a shape of the opening 23a of the electrode 23, and is, for example, a square or a circle. An inner diameter of the opening 23a of the electrode 23 (a length of one side when the shape of the opening 23a is a square) is, for example, 20 μm to 50 μm.

FIG. 15 will be referred to again. The contact layer 14 of the embodiment has the same planar shape as the electrode 23. That is, a central portion of the contact layer 14 is removed by etching to form an opening 14a. The contact layer 14 has a frame-like (annular) planar shape. Light outputted from the semiconductor light-emitting element 1B passes through the opening 14a of the contact layer 14 and the opening 23a of the electrode 23. As the light is caused to pass through the opening 14a of the contact layer 14, the light absorption in the contact layer 14 is avoided, and it is possible to enhance light output efficiency. When it is possible to allow the light absorption in the contact layer 14, however, the contact layer 14 may cover the entire surface of the cladding layer 13 without providing the opening 14a. As the light passes through the opening 23a of the electrode 23, the light can be suitably outputted from the front surface side of the semiconductor light-emitting element 1B without being blocked by the electrode 23.

A front surface of the cladding layer 13 (or a front surface of the contact layer 14 when the opening 14a is not provided) exposed from the opening 14a of the contact layer 14 is covered with an anti-reflection film 25. Incidentally, the anti-reflection film 25 may also be provided outside the contact layer 14. In addition, a part other than the electrode 22 on the rear surface 10b of the semiconductor substrate 10 is covered with a protective film 24. A material of the protective film 24 is the same as that of the protective film 18 of the first embodiment. A material of the anti-reflection film 25 is the same as that of the anti-reflection film 19 of the first embodiment.

The current confinement layer 21 has a structure that causes the current to hardly pass (or not to pass) therethrough, and has an opening 21a in a central portion thereof. As illustrated in FIG. 17, a planar shape of the opening 21a is similar to the shape of the opening 23a of the electrode 23, and is, for example, a square or a circle. The current confinement layer 21 is, for example, an Al oxide layer formed by oxidizing a layer containing Al at a high concentration. Alternatively, the current confinement layer 21 may be a layer formed by injecting protons ($H^+$) into the cladding layer 13. Alternatively, the current confinement layer 21 may have a reverse p-n junction structure in which a semiconductor layer having a conductivity type opposite to that of the semiconductor substrate 10 and a semiconductor layer having the same conductivity type as that of the semiconductor substrate 10 are stacked in order.

When a drive current is supplied between the electrode 22 and the electrode 23, the driving current reaches the active layer 12. At this time, the current flowing between the electrode 23 and the active layer 12 sufficiently diffuses in the thick cladding layer 13 and passes through the opening 21a of the current confinement layer 21. As a result, the current diffuses uniformly near the center of the active layer 12. Then, recoupling of electrons and holes occurs in the active layer 12, and light is generated in the active layer 12. The electrons and holes contributing to the light emission and the generated light are efficiently confined between the lower cladding layer 11 and the upper cladding layer 13. The laser light outputted from the active layer 12 enters the inside of the phase modulation layer 15A, and forms a predetermined mode corresponding to a lattice structure inside the phase modulation layer 15A. The laser light outputted from the inside of the phase modulation layer 15A is outputted from the cladding layer 13 to the outside through the openings 14a and 23a.

Even in the present embodiment, the same effects as those in the first embodiment can be obtained. That is, the traveling waves AU, AD, AR, and AL traveling in the phase modulation layer 15A along a plane (traveling plane) parallel to the main surface 10a are scattered or reflected in a direction (for example, the Z-axis direction) intersecting a design plane of the phase modulation layer 15A at an interface between the modified refractive index region 15b and its upper layer. At this time, the two traveling waves AU and AD traveling in opposite directions on the traveling plane of the phase modulation layer 15A are scattered or reflected in directions different from each other, thereby being separated from each other (see FIG. 13). Similarly, the two traveling waves AR and AL traveling in opposite directions on the traveling plane of the phase modulation layer 15A are scattered or reflected in directions different from each other, thereby being separated from each other (see FIG. 13).

The traveling waves AD and AL are scattered or reflected toward the cladding layer 13, and thus, the traveling waves AD and AL directly pass through the cladding layer 13 and are outputted to the outside, and optical paths thereof become short. On the other hand, the traveling waves AU, AR are scattered or reflected toward the side opposite to the cladding layer 13, and thus, optical paths thereof become longer than those of the traveling waves AD and AL by the amount reflected by the electrode 22 and reaching the cladding layer 13.

Therefore, the traveling waves AU and AR are attenuated more than the traveling waves AD and AL due to action of light absorption in the semiconductor. Therefore, one of 1st-order light and −1st-order light can be reduced with respect to the other light according to the semiconductor light-emitting element 1B of the present embodiment.

First Modification

FIGS. 18A to 18H are plan views illustrating examples of a shape in the X-Y plane of the modified refractive index region 15b. In the above-described first embodiment, the planar shape of the modified refractive index region 15b is a shape in which a width in a certain direction gradually decreases along an axis AX extending in a direction intersecting the direction. As examples of such a planar shape, FIGS. 18A, 18D, and 18F illustrate a right-angled isosceles triangle having a hypotenuse along a certain direction. In addition, FIGS. 18B and 18G illustrate trapezoids having an upper base and a lower base along a certain direction. FIGS. 18C and 18H illustrate an example having an upper base and a lower base along a certain direction, and a line connecting the upper base and the lower base is curved. FIG. 18E illustrates a triangle in which all corners are not right angles and sides are not equilateral. These shapes have a side S extending in a direction orthogonal to or intersecting the axis AX.

As illustrated in FIGS. 18A to 18D and FIGS. 18F to 18H, an angle between the axis AX and the X-axis may be 45° or 135°. As a result, the scattering or reflecting action obtained by the inclined refractive index interface of the modified refractive index region 15b can be uniformly exerted with respect to the traveling waves AU and AD and the traveling waves AR and AL. In addition, the planar shape of the modified refractive index region 15b may be line-symmetric with respect to the axis AX. The axis AX may coincide with the straight line D illustrated in FIG. 5 or a vector connecting the lattice point O and the gravity center G illustrated in FIGS. 19A and 19B.

Figure 19B:
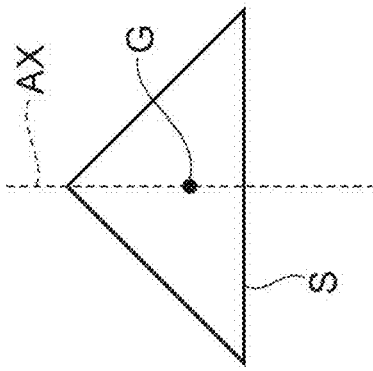
FIGS. 19A and 19B are plan views illustrating other examples of the shape of the modified refractive index region in the X-Y plane.
Figure 19A:
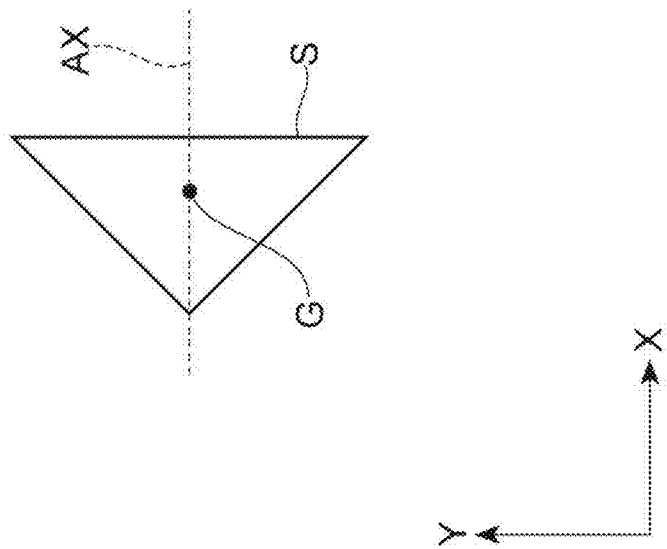

FIGS. 19A and 19B are plan views illustrating other examples of the shape of the modified refractive index region 15b in the X-Y plane. As illustrated in these drawings, the axis AX may extend along the X-axis or the Y-axis. Even in these cases, the scattering or reflection action obtained by the inclined refractive index interface of the modified refractive index region 15b can be exerted with respect to the traveling waves AU and AD or the traveling waves AR and AL. As a result, one of 1st-order light and −1st light can be reduced with respect to the other light.

Figure 20A:
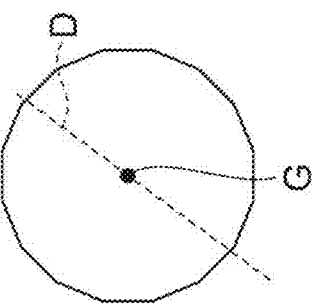
FIGS. 20A to 20G are plan views illustrating examples of the shape of the modified refractive index region in the X-Y plane.
Figure 20B:
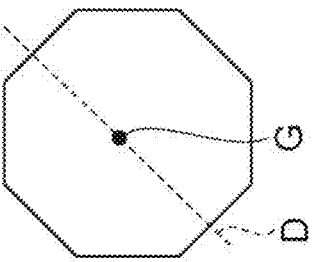
Figure 20C:
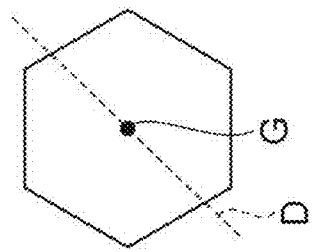
Figure 20D:
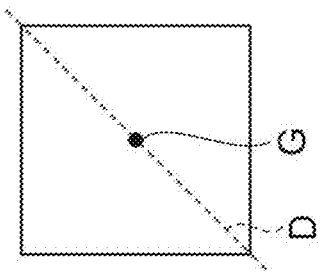
Figure 20E:
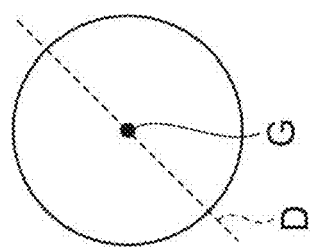
Figure 20F:
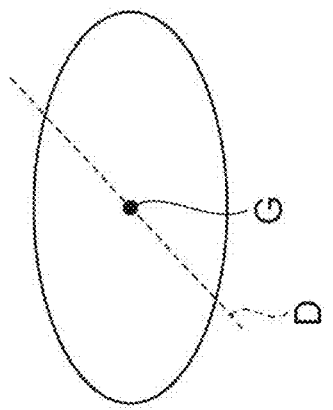
Figure 20G:
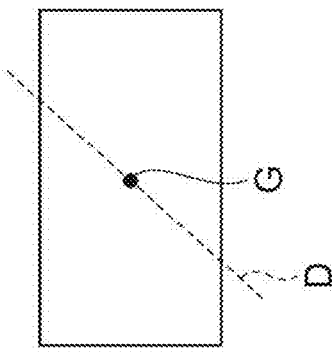
Figure 21A:
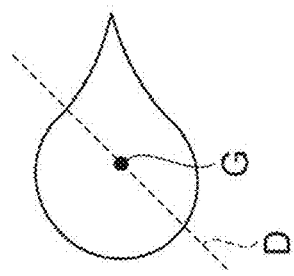
FIGS. 21A to 21K are plan views illustrating examples of the shape of the modified refractive index region in the X-Y plane.
Figure 21B:
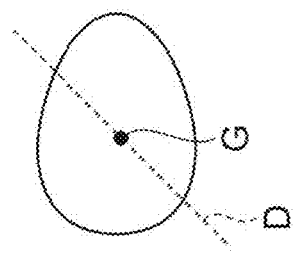
Figure 21C:
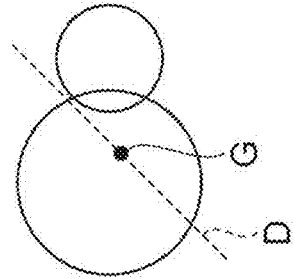
Figure 21D:
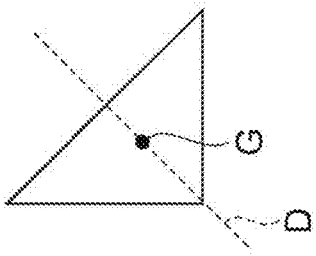
Figure 21E:
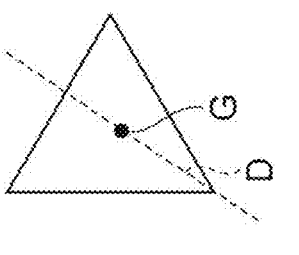
Figure 21F:
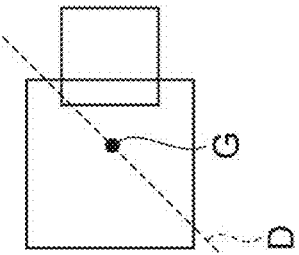
Figure 21G:
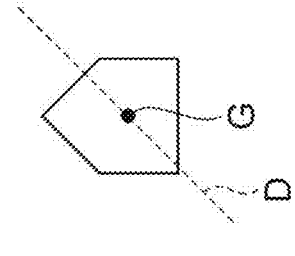
Figure 21H:
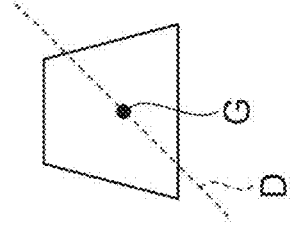
Figure 21I:
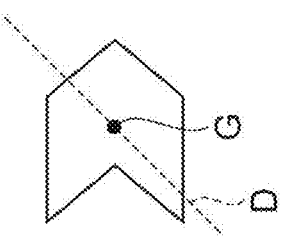
Figure 21J:
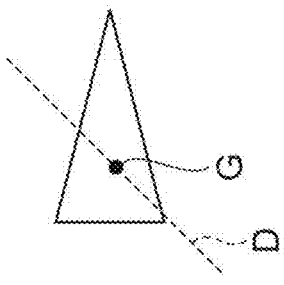
Figure 21K:
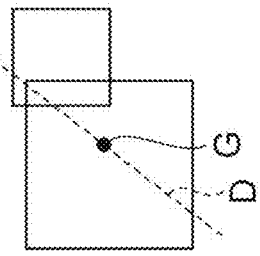

FIGS. 20A to 20G and FIGS. 21A to 21K are plan views illustrating examples of the shape of the modified refractive index region 15b in the X-Y plane. In other embodiments and modifications except for the first embodiment, shapes of the modified refractive index regions 15b in the X-Y plane can adopt not only the shapes illustrated in FIGS. 18A to 18H and FIGS. 19A and 19B but also various shapes such as follows. For example, the shape of the modified refractive index region 15b in the X-Y plane may have a mirror-image symmetry (line symmetry). Here, the mirror-image symmetry (line symmetry) represents that a planar shape of the modified refractive index region 15b positioned on one side of a straight line and a planar shape of the modified refractive index region 15b positioned on the other side of the straight line can be mirror-image symmetric (line symmetric) with each other with a certain straight line along X-Y plane interposed therebetween. Examples of the shape having mirror-image symmetry (line symmetry) includes a perfect circle illustrated in FIG. 20A, a square illustrated in FIG. 20B, a regular hexagon illustrated in FIG. 20C, a regular octagon illustrated in FIG. 20D, a regular hexadecagon illustrated in FIG. 20E, a rectangle illustrated in FIG. 20F, an ellipse illustrated in FIG. 20G, and the like. In this manner, the shape of the modified refractive index region 15b in the X-Y plane has a mirror-image symmetry (line symmetry). In this case, the shape is simple in each of the unit constituent regions R, and thus, a direction and a position of the gravity center G of the corresponding modified refractive index region 15b from the lattice point O can be determined with high precision, so that patterning with high precision is possible.

In addition, the shape of the modified refractive index region 15b in the X-Y plane may adopt a shape that does not have a 180-degree rotational symmetry. Examples of such a shape include an equilateral triangle illustrated in FIG. 21A, a right-angled isosceles triangle illustrated in FIG. 21B, a shape illustrated in FIG. 21C in which two circles or ellipses partially overlap, a shape (egg shape) illustrated in FIG. 21D in which a dimension in the minor-axis direction near one end along the major axis of an ellipse is deformed to be smaller than a dimension in the minor-axis direction near the other end, a shape (teardrop shape) illustrated in FIG. 21E in which one end along the major axis of an ellipse is deformed into a sharp end protruding along the major-axis direction, an isosceles triangle illustrated in FIG. 21F, a shape (arrow shape) illustrated in FIG. 21G in which one side of a rectangle is recessed in a triangular shape and the opposite side thereof is pointed in a triangular shape, a trapezoid illustrated in FIG. 21H, a pentagon illustrated in FIG. 21, a shape illustrated in FIG. 21J in which two rectangles partially overlap, a shape illustrated in FIG. 21K in which two rectangles partially overlap and do not have mirror-image symmetry, and the like. Since the shape of the modified refractive index region 15b in the X-Y plane does not have the 180-degree rotational symmetry in this manner, it is possible to obtain a higher light output.

FIGS. 22A to 22K and FIG. 23 are plan views illustrating other examples of the shape of the modified refractive index region in the X-Y plane. In the present modification, a plurality of modified refractive index regions 15c (second modified refractive index regions) different from the plurality of modified refractive index regions 15b are further provided. Each of the modified refractive index regions 15c is made of a second refractive index medium having a refractive index different from that of the first refractive index medium of the base layer 15a. The modified refractive index region 15c may be a depression (or hole) similarly to the modified refractive index region 15b, or may be formed by embedding a compound semiconductor in the depression. The modified refractive index regions 15c are provided in the modified refractive index regions 15b with one-to-one correspondence. Then, a gravity center G obtained by combining a gravity center of the modified refractive index region 15c and the gravity center of the modified refractive index region 15b is positioned on the straight line D passing through the lattice point O. Incidentally, each of the modified refractive index regions 15b and 15c is included in the range of a unit constituent region R constituting the virtual square lattice. The unit constituent region R is a region surrounded by a straight line that bisects the lattice point of the virtual square lattice.

A planar shape of the modified refractive index region 15c is, for example, a circular shape, but can have various shapes similarly to the modified refractive index region 15b. FIGS. 22A to 22K illustrate examples of shapes and a relative relationship of the modified refractive index regions 15b and 15c in the X-Y plane. FIGS. 22A and 22B illustrate a form in which the modified refractive index regions 15b and 15c have the same figure shape. FIGS. 22C and 22D illustrate a form in which the modified refractive index regions 15b and 15c have the same figure shape, and parts thereof overlap with each other. FIG. 22E illustrates a form in which the modified refractive index regions 15b and 15c have the same figure shape, and a distance between gravity centers of the modified refractive index regions 15b and 15c is arbitrarily set for each lattice point. FIG. 22F illustrates a form in which the modified refractive index regions 15b and 15c have different figure shapes. FIG. 22G illustrates a form in which the modified refractive index regions 15b and 15c have different figure shapes, and a distance between gravity centers of the modified refractive index regions 15b and 15c is arbitrarily set for each lattice point.

In addition, the modified refractive index region 15b may be configured to include two regions 15b1 and 15b2 separated from each other as illustrated in FIGS. 22H to 22K. Then, the distance between the gravity center of the regions 15b1 and 15b2 (corresponding to the gravity center of the single modified refractive index region 15b) and the gravity center of the modified refractive index region 15c may be arbitrarily set. In addition, the regions 15b1 and 15b2 and the modified refractive index region 15c may have the same figure shape in this case as illustrated in FIG. 22H. Alternatively, two out of the regions 15b1 and 15b2 and the modified refractive index region 15c may have a figure different from the other as illustrated in FIG. 22. In addition, an angle of the modified refractive index region 15c with respect to the X-axis may be arbitrarily set in addition to the angle of the straight line connecting the regions 15b1 and 15b2 with respect to the X-axis as illustrated in FIG. 22J. In addition, the angle of the straight line connecting the regions 15b1 and 15b2 with respect to the X-axis may be arbitrarily set while maintaining mutually the same relative angles among the regions 15b1 and 15b2 and the modified refractive index region 15c as illustrated in FIG. 22K.

Figure 23:
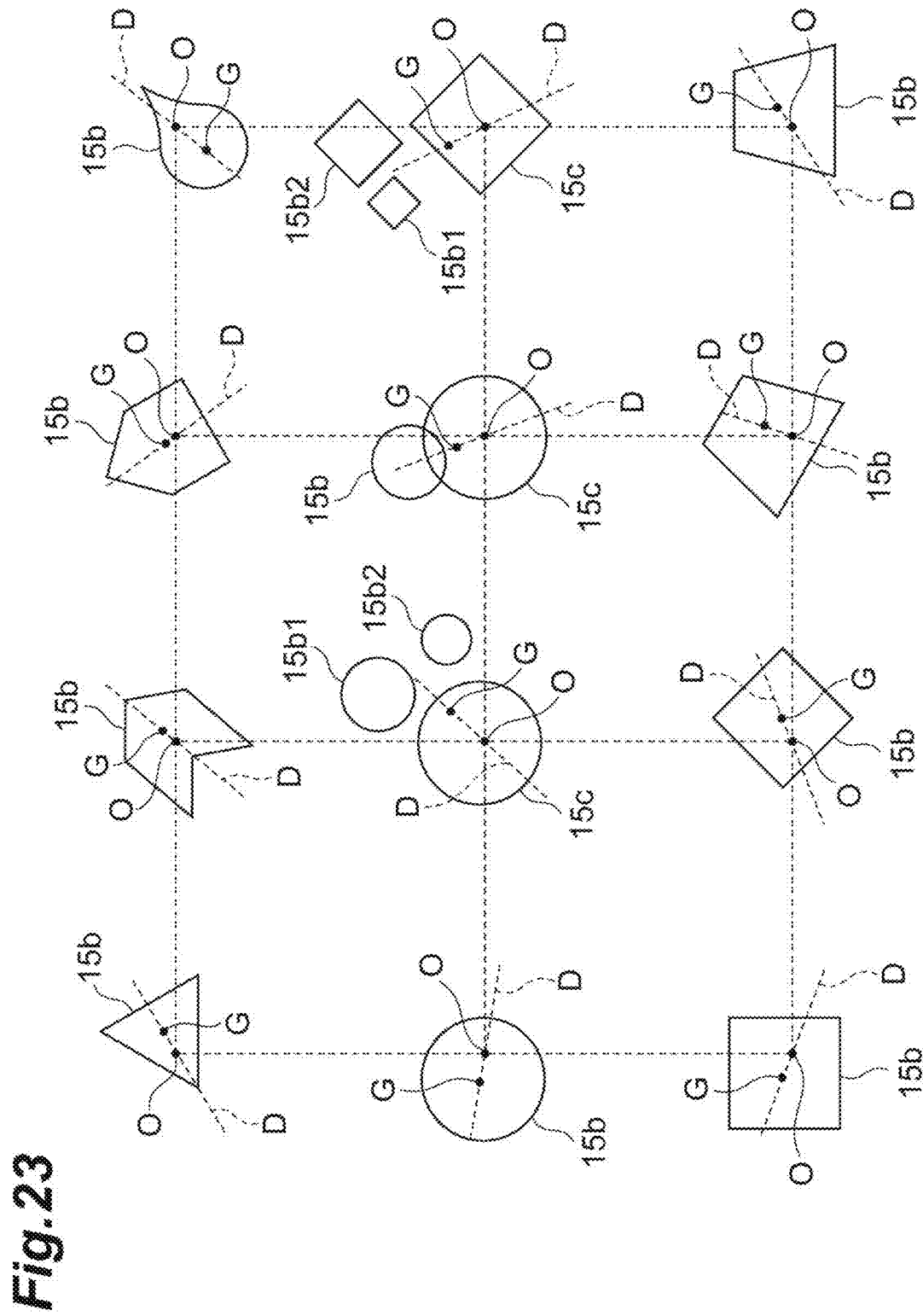
FIG. 23 is a plan view illustrating other examples of the shape of the modified refractive index region in the X-Y plane.

The shapes of the modified refractive index regions in the X-Y plane may be the same between the respective lattice points. That is, the modified refractive index regions may have the same figure at all lattice points and can be caused to overlap with each other between the lattice points by a translational operation or the translational operation and a rotational operation. In that case, it is possible to suppress generation of noise light and 0th-order light causing noise in a beam pattern. Alternatively, the shapes of the modified refractive index regions in the X-Y plane are not necessarily the same between lattice points, and the shapes may be different between adjacent lattice points, for example, as illustrated in FIG. 23. Incidentally, as illustrated in the example of FIG. 5, the center of the straight line D passing through each lattice point is preferably set so as to coincide with the lattice point O even in any case of FIGS. 18A to 18H, FIG. 19A, FIG. 19B, FIGS. 20A to 20G, FIGS. 21A to 21K, FIGS. 22A to 22K, and FIG. 23.

For example, a side surface of the modified refractive index region 15b is inclined with respect to the Z-axis even in the configuration of the phase modulation layer as in the present modification, so that the effects of the above-described embodiments can be suitably obtained.

Second Modification

Figure 24A:
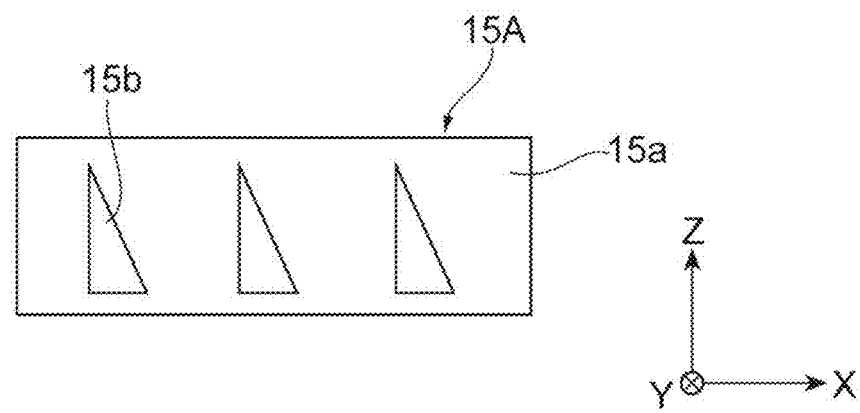
FIGS. 24A to 24C are views illustrating a modification of a cross-sectional shape of a modified refractive index region along a Z-axis.
Figure 24B:
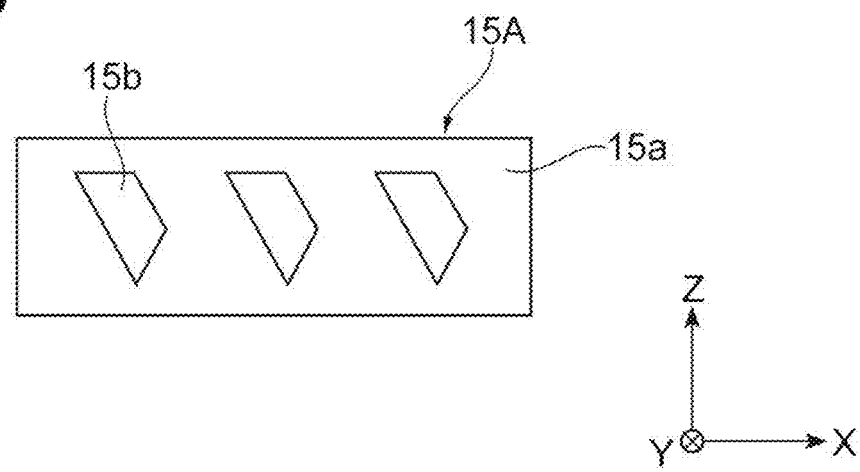
Figure 24C:
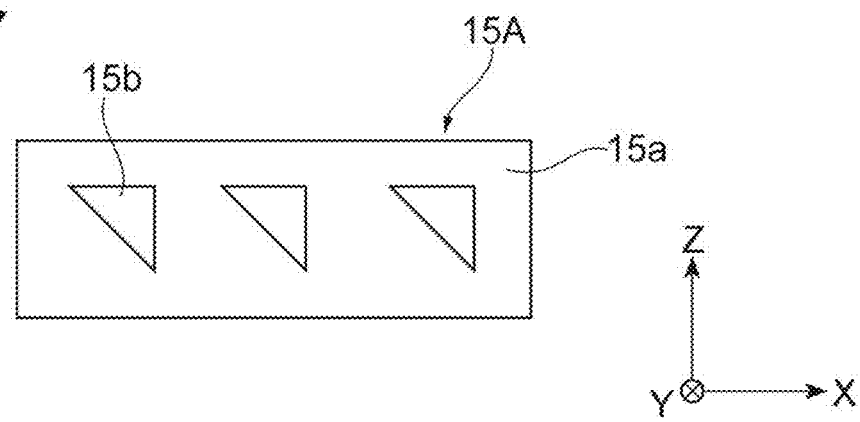

FIGS. 24A to 24C are views illustrating a modification of a cross-sectional shape of the modified refractive index region 15b along the Z-axis. The cross-sectional shape of the modified refractive index region 15b along the Z-axis is preferable if at least a part of an interface with a layer in the periphery thereof is inclined with respect to the main surface 10a (X-Y plane), and is not limited to shapes illustrated in FIGS. 24A to 24C. Incidentally, FIG. 24A illustrates a triangular cross section in which one side is inclined with respect to the X-Y plane. FIG. 24B illustrates a trapezoidal cross section in which an upper base and a lower base are inclined with respect to the X-Y plane. FIG. 24C illustrates a cross section in a right-angled isosceles triangle shape of which hypotenuse is inclined with respect to the X-Y plane. Even with these cross-sectional shapes, each of the traveling waves AU, AD, AR, and AL is scattered or reflected at a refractive index interface inclined with respect to the X-Y plane, so that the same effects as those of the above-described embodiments can be obtained.

Third Modification

Figure 25:
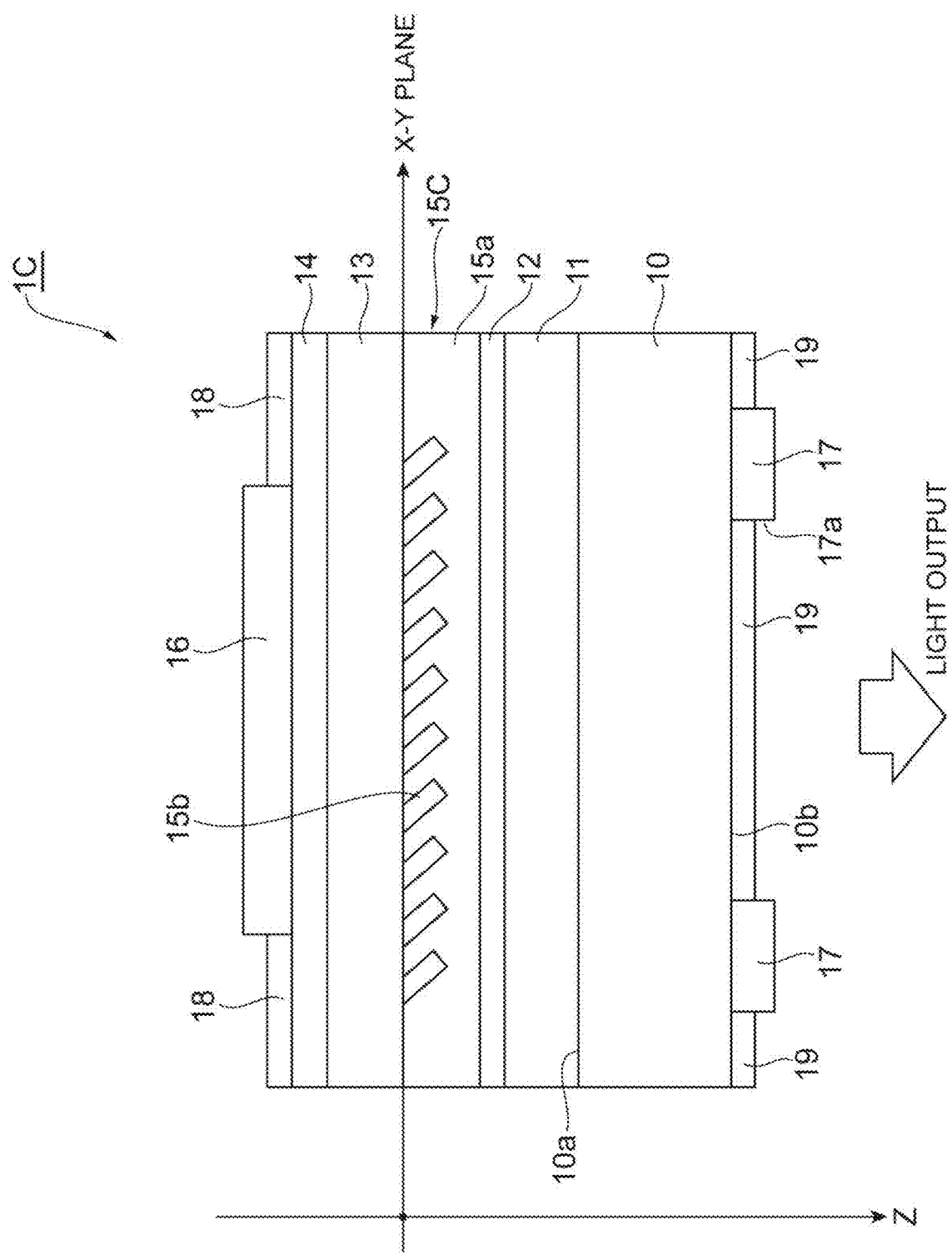
FIG. 25 is a view schematically illustrating a cross-sectional structure of a semiconductor light-emitting element as a third modification.

FIG. 25 is a view schematically illustrating a cross-sectional structure of a semiconductor light-emitting element 1C as a modification (third modification) of the first embodiment. A difference between the present modification and the first embodiment is a cross-sectional shape of the modified refractive index region 15b in a phase modulation layer. That is, a depth direction of the modified refractive index region 15b is inclined with respect to the Z-axis in the phase modulation layer 15AC of the present modification. In other words, a side surface of the modified refractive index region 15b, which is a refractive index interface with the base layer 15a, is inclined with respect to the normal direction of the main surface 10a. An inner diameter of the modified refractive index region 15b is substantially constant in the depth direction. Even with such a configuration, each of the traveling waves AU, AD, AR, and AL is scattered or reflected at the main surface 10a or the refractive index interface inclined with respect to the normal direction of the main surface 10a, so that the same effects as those of the above-described embodiments can be obtained.

Figure 26A:
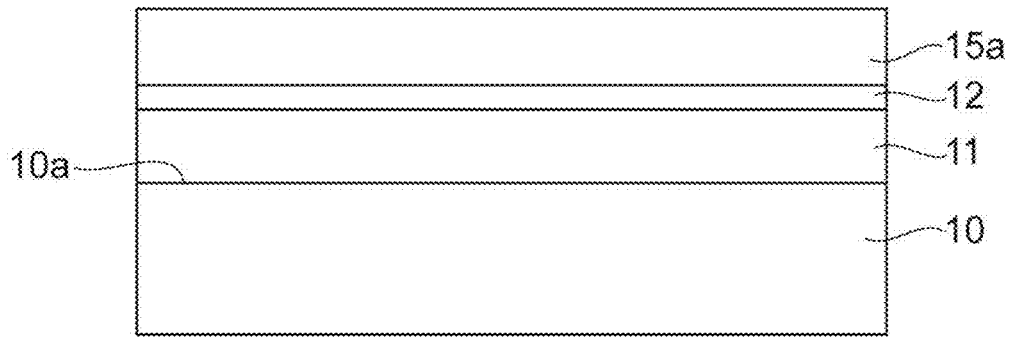
FIGS. 26A to 26C are views for describing a production method for a phase modulation layer according to the third modification.
Figure 26B:
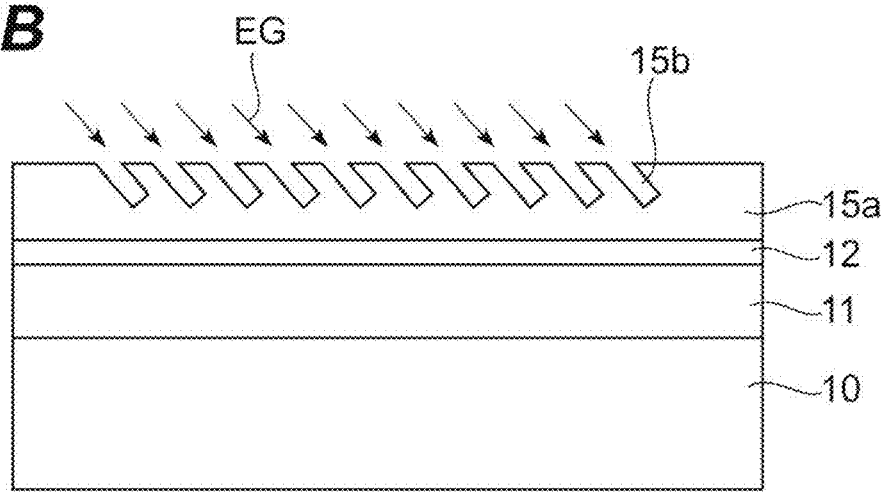
Figure 26C:
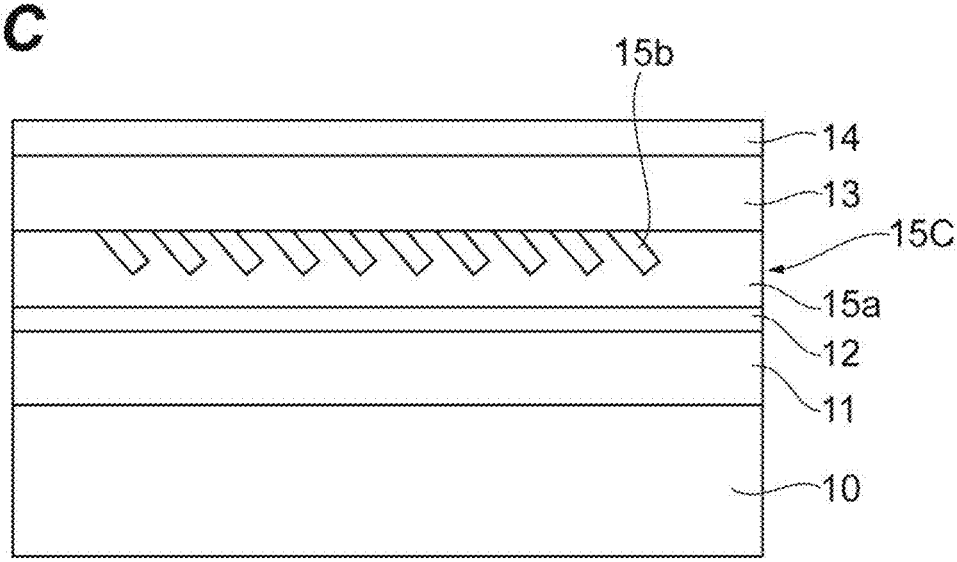

FIGS. 26A to 26C are views for describing a production method for the phase modulation layer 15C according to the present modification. First, as illustrated in FIG. 26A, the cladding layer 11, the active layer 12, and the base layer 15a are provided on the main surface 10a of the semiconductor substrate 10 by an epitaxial growth method (first step). Next, an etching mask is formed on the base layer 15a using a microfabrication technique such as an electron beam drawing method. Subsequently, as illustrated in FIG. 26B, a plurality of depressions (which may be holes) that are to serve as the modified refractive index regions 15b are formed by dry etching on the base layer 15a (second step). In this second step, an etching reaction gas EG is applied to the base layer 15a from a direction inclined with respect to the Z-axis direction. For example, as illustrated in the following Document (5), a traveling direction of the etching reaction gas EG can be inclined by arranging a sheath electric field control plate or the like on the base layer 15a and inclining a direction of an electric field with respect to the normal direction of the main surface 10a. Then, the cladding layer 13 and the contact layer 14 are regrown using the MOCVD method as illustrated in FIG. 26C. As a result, the depression is closed by the cladding layer 13, and the modified refractive index region 15b (closed space) is formed. Thereafter, the electrodes 16 and 17 illustrated in FIG. 25 are formed by a vapor deposition method, a sputtering method, or the like. In addition, the protective film 18 and the anti-reflection film 19 are formed by sputtering or the like if necessary. The semiconductor light-emitting element 1C of the present modification is produced through the above steps. Incidentally, the method of inclining the traveling direction of the etching reaction gas EG is also described in the following Documents (6) and (7).

(5) Shigeki Takahashi et al., "Direct creation of three-dimensional photonic crystals by a top-down approach", Nature Materials 8, pp. 721-725 (2009)

(6) Masaya Nishimoto et al., "Design of photonic-crystal surface-emitting lasers with circularly-polarized beam", OPTICS EXPRESS 25, pp. 6104-6111 (2017)

(7) Katsuyoshi Suzuki et al., "Three-dimensional photonic crystals created by single-step multi-directional plasma etching", OPTICS EXPRESS 22, pp. 17099-17106 (2014)

In addition, even in the present modification, a front surface output type configuration can be adopted similarly to the second embodiment. In addition, the arrangement of the modified refractive index regions 15b can adopt the arrangement of the first embodiment (see FIG. 5). In addition, the modified refractive index region 15b may be formed by embedding a semiconductor having a modified refractive index from the base layer 15a in the depression in the present modification (at this time, the depression may enter the cladding layer 13). In such a case, for example, the depression of the base layer 15a may be formed by etching, and then, a semiconductor may be embedded in the depression using a metal organic chemical vapor deposition method, a sputtering method, or an epitaxial method. For example, when the base layer 15a is made of GaAs, the modified refractive index region 15b may be made of AlGaAs. In addition, the modified refractive index region 15b may be formed by embedding the semiconductor in the depression of the base layer 15a, and then, the same semiconductor as the base layer 15a or the modified refractive index region 15b may be further deposited on the depression.

Fourth Modification

Figure 27:
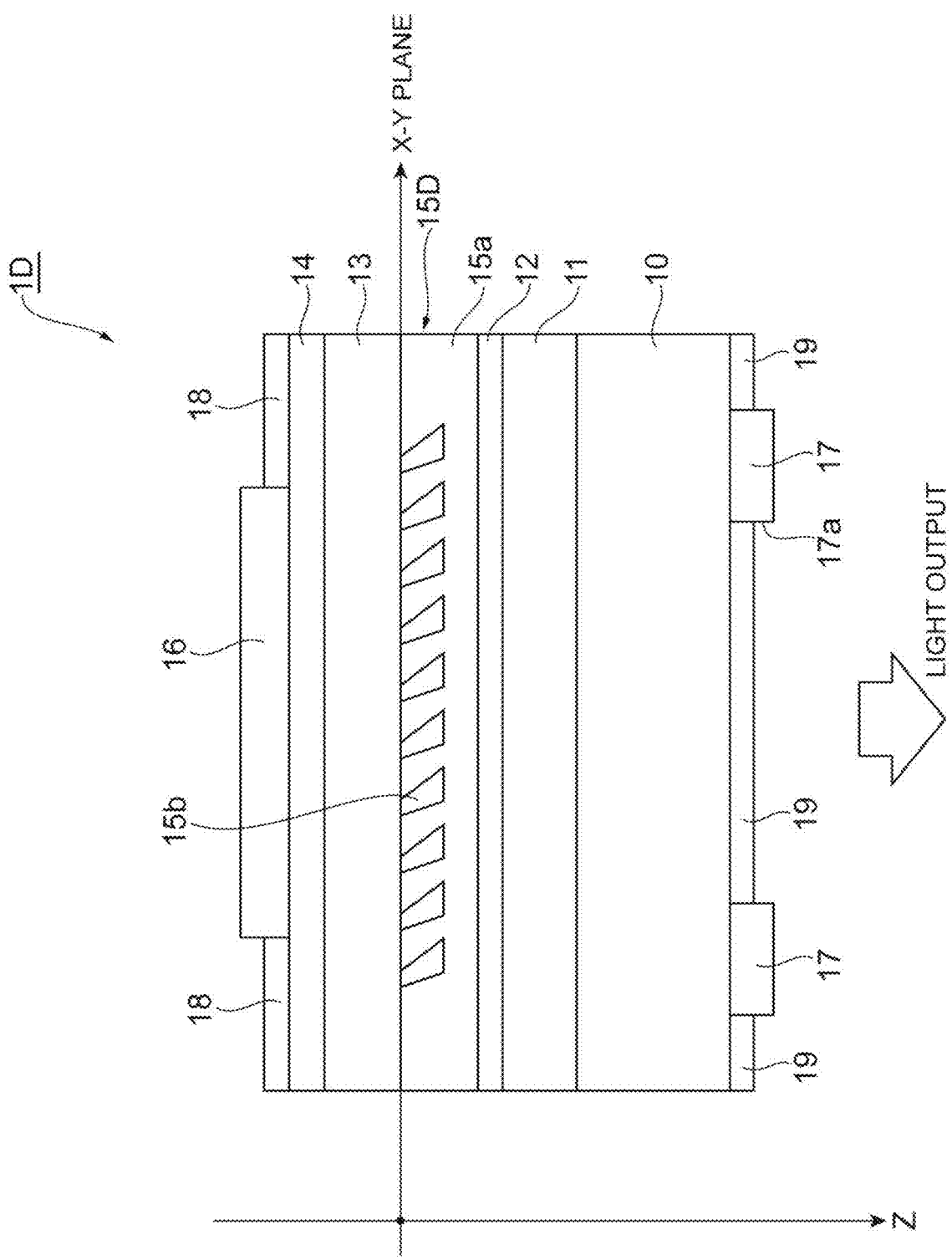
FIG. 27 is a view schematically illustrating a cross-sectional structure of a semiconductor light-emitting element as a fourth modification.

FIG. 27 is a view schematically illustrating a cross-sectional structure of a semiconductor light-emitting element 1D as a modification (fourth modification) of the first embodiment. A difference between the present modification and the first embodiment is a cross-sectional shape of the modified refractive index region 15b in a phase modulation layer. That is, even in the phase modulation layer 15AD of the present modification, a depth direction of the modified refractive index region 15b is inclined with respect to the Z-axis similarly to the fifth modification. In other words, a side surface of the modified refractive index region 15b, which is a refractive index interface with the base layer 15a, is inclined with respect to the main surface 10a or the normal direction of the main surface 10a. However, an inner diameter of the modified refractive index region 15b changes in the depth direction (Z-axis direction), which is different from the above-described third modification. Even with such a configuration, each of the traveling waves AU, AD, AR, and AL is scattered or reflected at a refractive index interface inclined with respect to the main surface 10a, so that the same effects as those of the above-described embodiments can be obtained.

Figure 28A:
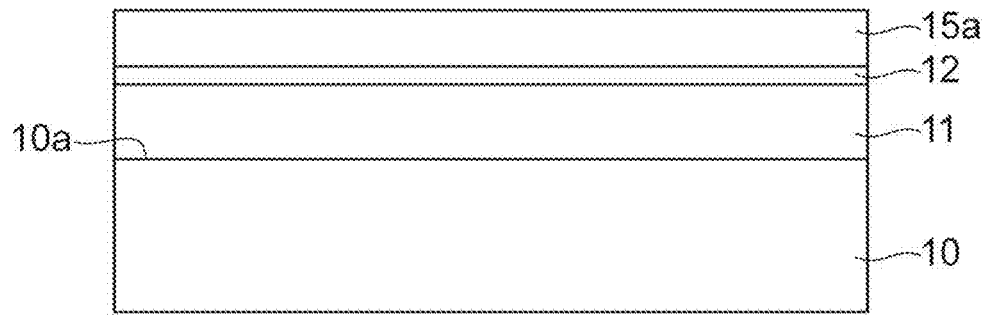
FIGS. 28A to 28C are views for describing a production method for a phase modulation layer according to the fourth modification.
Figure 28B:
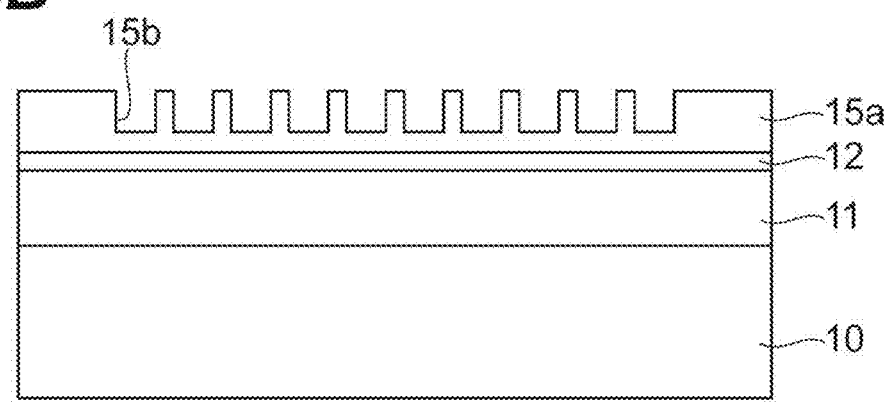
Figure 28C:
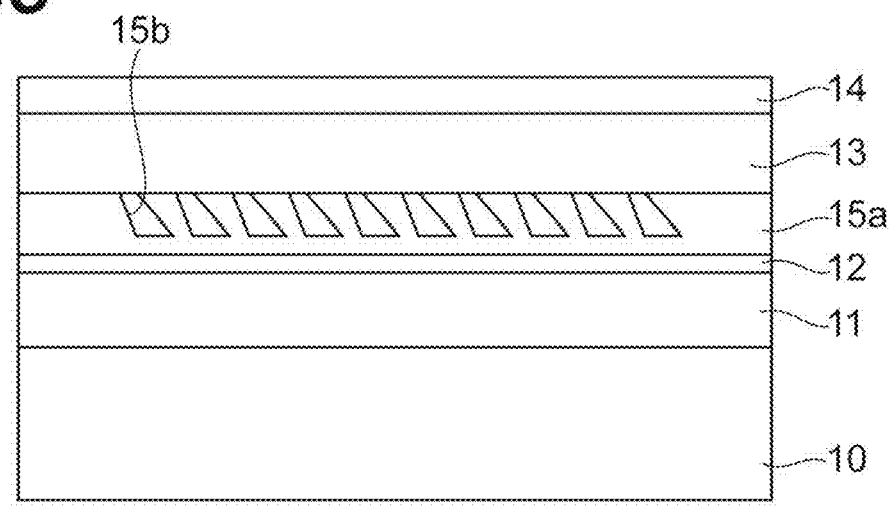

FIGS. 28A to 28C are views for describing a production method for the phase modulation layer 15D according to the present modification. First, as illustrated in FIG. 28A, the cladding layer 11, the active layer 12, and the base layer 15a are provided on the main surface 10a of the semiconductor substrate 10 by an epitaxial growth method (first step). Next, as illustrated in FIG. 28B, a plurality of depressions (which may be holes) that are to serve as the modified refractive index regions 15b are formed by dry etching on the base layer 15a (second step). Subsequently, as illustrated in FIG. 28C, the cladding layer 13 and the contact layer 14 are regrown using the MBE method (third step). As a result, the depression is closed by the cladding layer 13, and the modified refractive index region 15b (closed space) is formed. In the third step, a source beam is applied to the base layer 15a from a direction inclined with respect to the Z-axis direction at least during the epitaxial growth of the cladding layer 13. That is, a supply direction of an etching reaction gas in the second step is different from a supply direction of a material gas in the third step. A method such as the third step is described in the following Document (8), for example. As a result, the material flies from the direction inclined with respect to the depth direction of the depression so that a side surface of the depression is also inclined with respect to the depth direction by the material deposited on the side surface of the depression. Thereafter, the electrodes 16 and 17 illustrated in FIG. 27 are formed by a vapor deposition method or a sputtering method. In addition, the protective film 18 and the anti-reflection film 19 are formed by sputtering or the like if necessary. The semiconductor light-emitting element 1D of the present modification is produced through the above steps.

(8) Masaya Nishimoto et al., "Fabrication of photonic crystal lasers by MBE air-hole retained growth", Applied Physics Express 7, 092703 (2014)

Even in the present modification, the planar shape of the modified refractive index region 15b is not limited to the shape of each of the above-described embodiments (shape in which a width in a certain direction gradually decreases along a direction intersecting the direction), and can adopt various shapes similarly to the third modification (see FIGS. 20A to 20G, FIGS. 21A to 21K, FIGS. 22A to 22K, and FIG. 23). In addition, even in the present modification, a front surface output type configuration can be adopted similarly to the second embodiment. In addition, the arrangement of the modified refractive index regions 15b can adopt the arrangement of the first embodiment (see FIG. 5). In addition, a semiconductor layer (for example, a semiconductor layer made of the same material as the base layer 15a) other than the cladding layer 13 may be regrown by the same method as the cladding layer 13 described above in the present modification.

Fifth Modification

Figure 29:
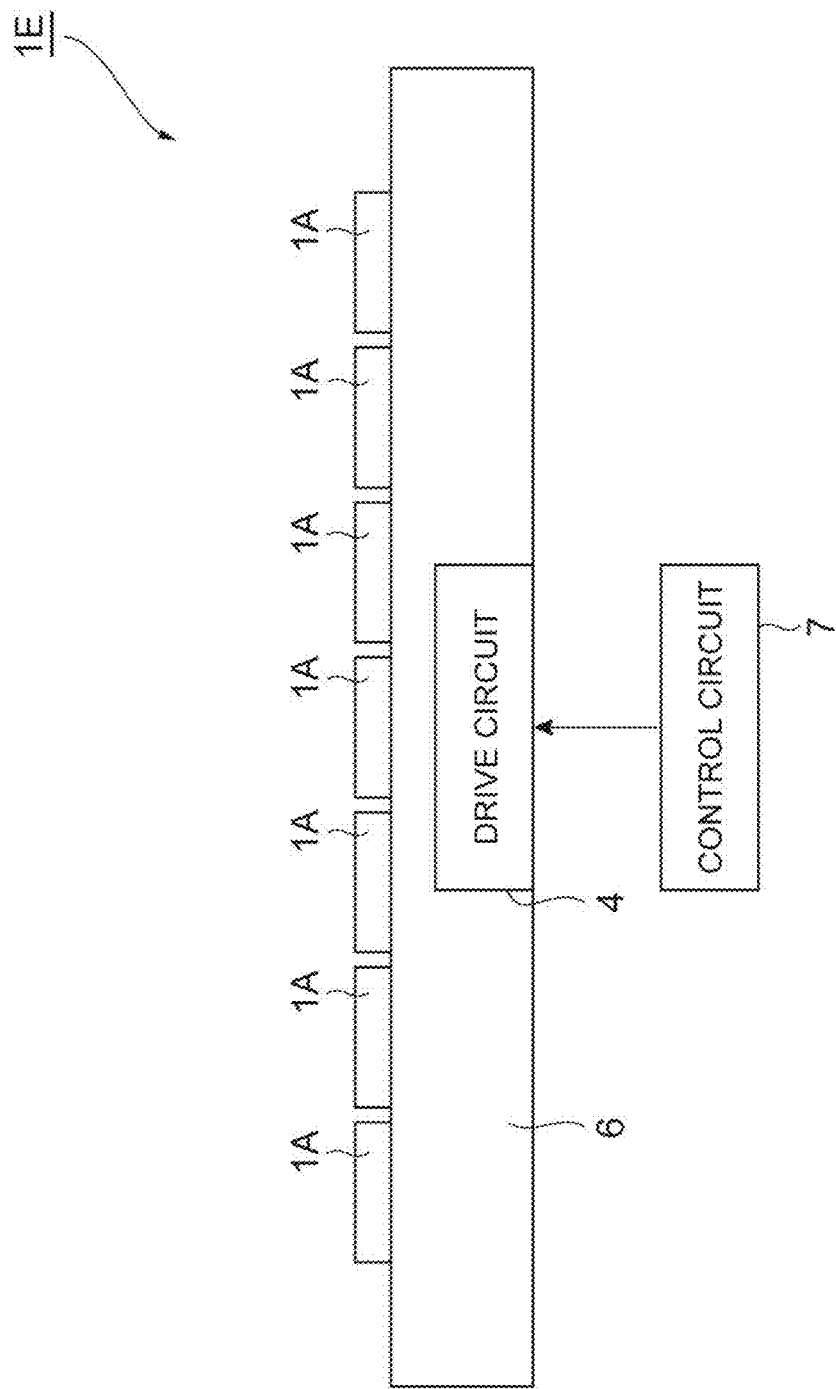
FIG. 29 is a view illustrating a configuration of a light-emitting device according to a fifth modification.

FIG. 29 is a view illustrating a configuration of a light-emitting device 1E according to a fifth modification. This light-emitting device 1E includes a support substrate 6, a plurality of the semiconductor light-emitting elements 1A arranged one-dimensionally or two-dimensionally on the support substrate 6, and a drive circuit 4 individually driving the plurality of the semiconductor light-emitting element 1A. The configuration of each of the semiconductor light-emitting elements 1A is the same as that of the first embodiment. However, the plurality of semiconductor light-emitting elements 1A include a laser element that outputs an optical image in a red wavelength region, a laser element that outputs an optical image in a blue wavelength region, and a laser element that outputs an optical image in a green wavelength region. The laser element outputting the optical image of the red wavelength range is constituted by, for example, a GaAs-based semiconductor. The laser element that outputs the optical image of the blue wavelength range and the laser element that outputs the optical image of the green wavelength range are configured using, for example, a nitride-based semiconductor. The drive circuit 4 is provided on a rear surface or the inside of the support substrate 6, and drives the respective semiconductor light-emitting elements 1A individually. The drive circuit 4 supplies a drive current to each of the semiconductor light-emitting elements 1A according to an instruction from a control circuit 7.

When the plurality of individually driven semiconductor light-emitting elements 1A are provided to extract a desired optical image from each of the semiconductor light-emitting elements 1A (to appropriately drive a necessary element) as in the present modification, a head-up display or the like can be suitably realized for a module in which semiconductor light-emitting elements corresponding to a plurality of patterns are arranged in advance. In addition, a color head-up display or the like can be suitably realized since the plurality of semiconductor light-emitting elements 1A include the laser element that outputs the optical image in the red wavelength range, the laser element that outputs the optical image in the blue wavelength range, and the laser element that outputs the optical image in the green wavelength range. Incidentally, the semiconductor light-emitting element 1A may be replaced by the semiconductor light-emitting element 1B of the second embodiment or the semiconductor light-emitting element of each of the above modifications in the present modification.

Specific Example of First Embodiment

The inventors have examined conditions that do not cause a higher-order mode for the thickness and the refractive index of the optical waveguide layer including the active layer and the thickness and the refractive index of the contact layer. A process and a result of the examination will be described hereinafter.

Figure 31:
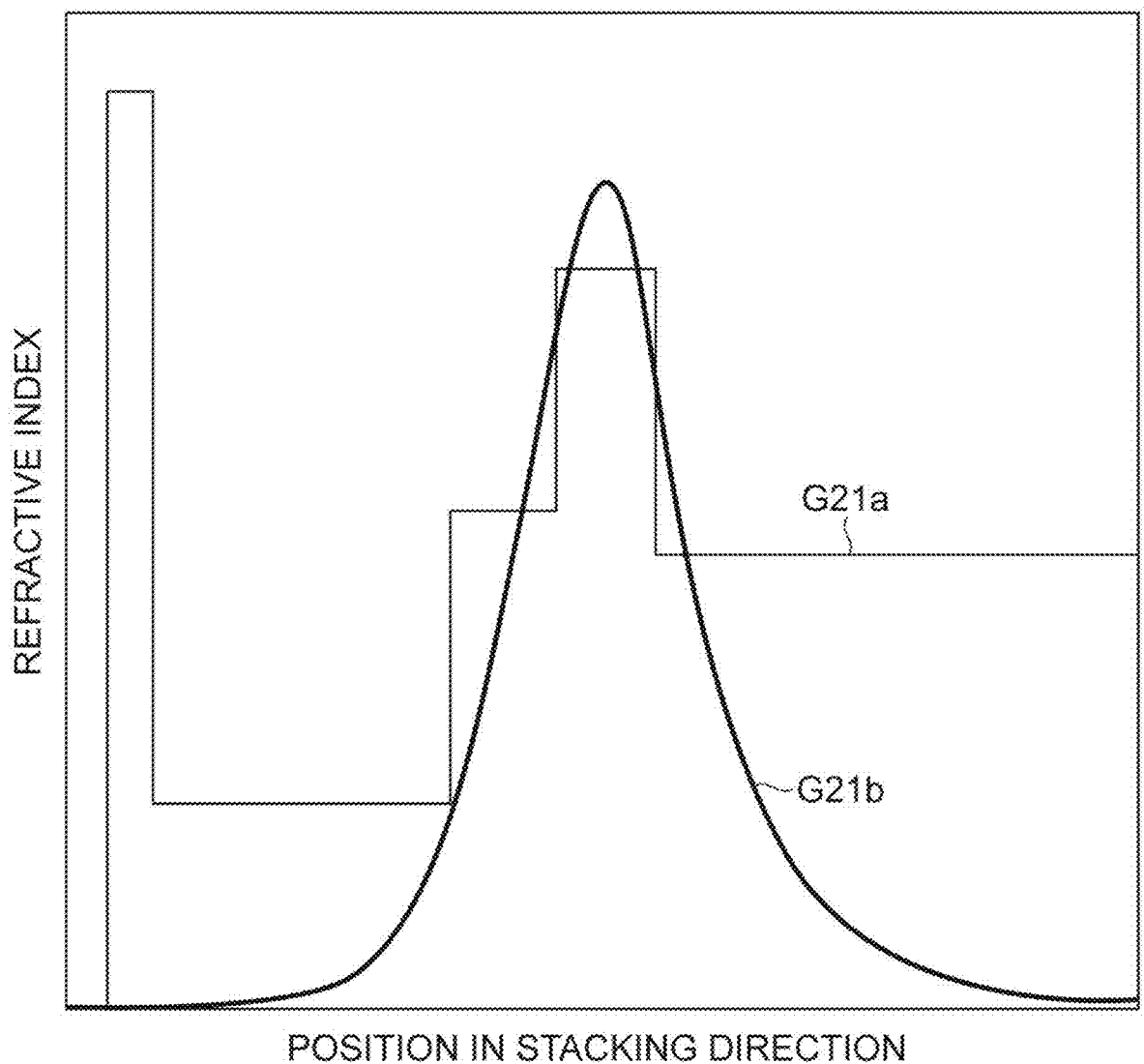
FIG. 31 illustrates a refractive index profile and a mode distribution of the semiconductor light-emitting element having the layer structure illustrated in FIG. 30.

First, a specific structure of the semiconductor light-emitting element 1A that has been examined in this specific example will be described. FIG. 30 is a table illustrating a layer structure when the semiconductor light-emitting element 1A is made of a GaAs-based compound semiconductor (emission wavelength: 940 nm band). The table of FIG. 30 illustrates a conductivity type, a composition, a layer thickness, and a refractive index of each layer. Incidentally, layer number 1 indicates the contact layer 14, layer number 2 indicates the cladding layer 13, layer number 3 indicates the phase modulation layer 15A, layer number 4 indicates the light guide layer and the active layer 12, and layer number 5 indicates the cladding layer 11. FIG. 31 illustrates a refractive index profile G21a and a mode distribution G21b of the semiconductor light-emitting element 1A having the layer structure illustrated in FIG. 30. The horizontal axis represents a position in the stacking direction (range is 2.5 µm). At this time, it can be understood that only a fundamental mode has been generated and the higher-order mode has been suppressed.

Figure 33:
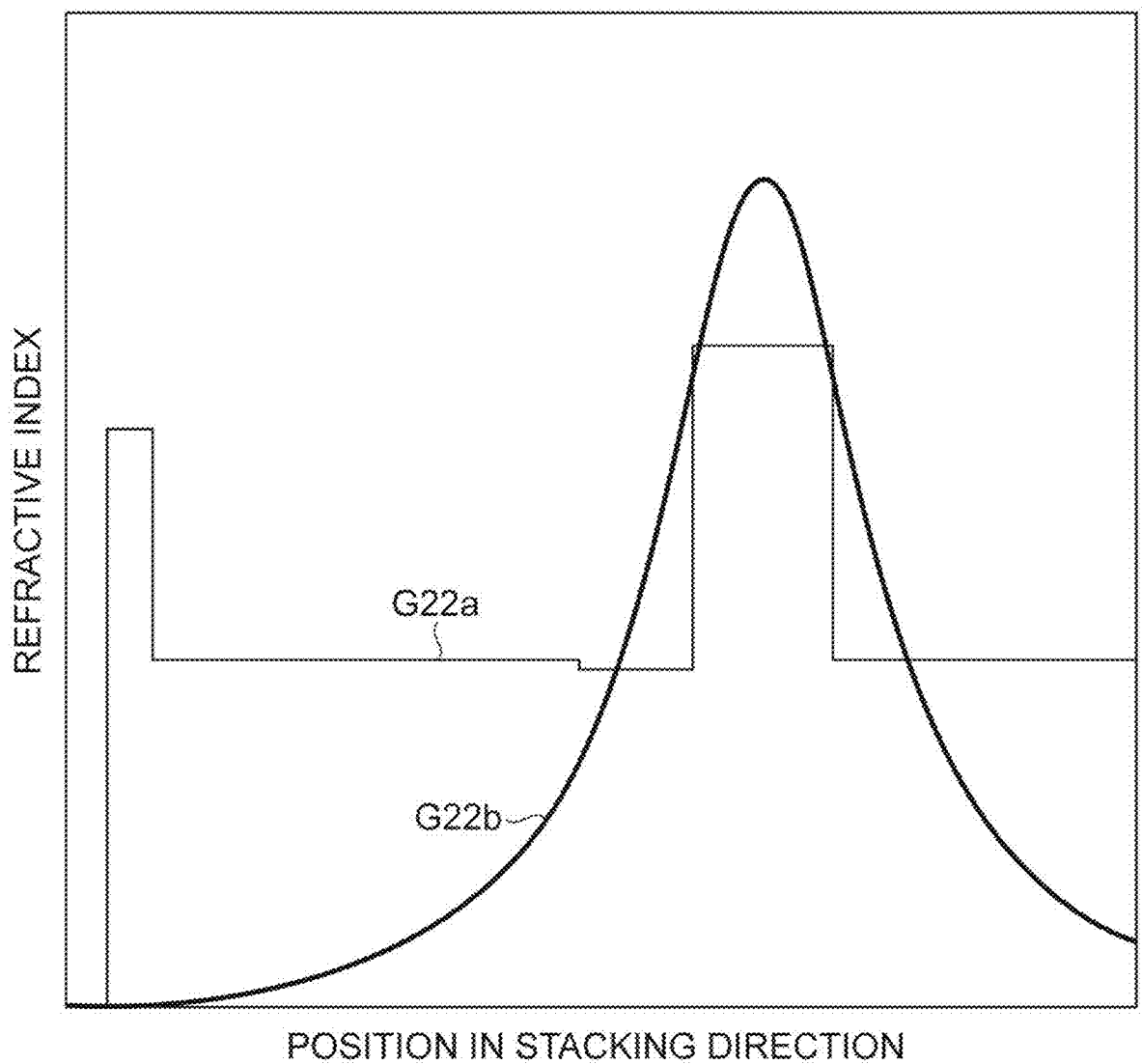
FIG. 33 illustrates a refractive index profile and a mode distribution of the semiconductor light-emitting element having the layer structure illustrated in FIG. 32.

FIG. 32 is a table illustrating a layer structure when the semiconductor light-emitting element 1A is made of an InP-based compound semiconductor (emission wavelength: 1300 nm band). Layer number 1 indicates the contact layer 14, layer number 2 indicates the cladding layer 13, layer number 3 indicates the phase modulation layer 15A, layer number 4 indicates the light guide layer and the active layer 12, and layer number 5 indicates the cladding layer 11. FIG. 33 illustrates a refractive index profile G22a and a mode distribution G22b of the semiconductor light-emitting element 1A having the layer structure illustrated in FIG. 32. The horizontal axis represents a position in the stacking direction (range is 2.5 µm). At this time, it can be understood that only a fundamental mode has been generated and the higher-order mode has been suppressed.

Figure 35:
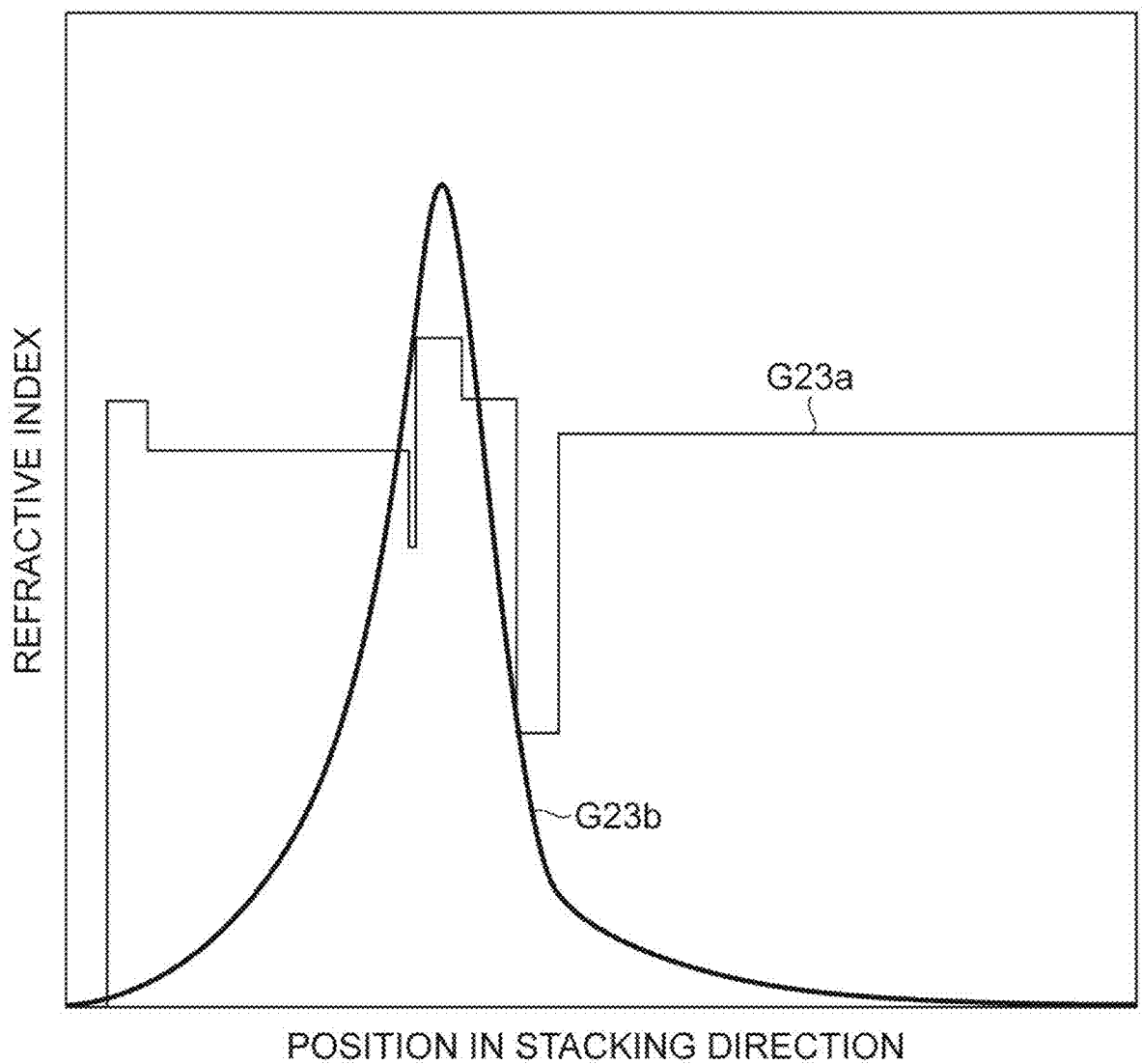
FIG. 35 illustrates a refractive index profile and a mode distribution of the semiconductor light-emitting element having the layer structure illustrated in FIG. 34.

FIG. 34 is a table illustrating a layer structure when the semiconductor light-emitting element 1A is made of a nitride-based compound semiconductor (emission wavelength: 405 nm band). Layer number 1 indicates the contact layer 14, layer number 2 indicates the cladding layer 13, layer number 3 indicates the carrier barrier layer, layer number 4 indicates the active layer 12, layer number 5 indicates the light guide layer, layer number 6 indicates the phase modulation layer 15A, and layer number 7 indicates the cladding layer 11. FIG. 35 illustrates a refractive index profile G23a and a mode distribution G23b of the semiconductor light-emitting element 1A having the layer structure illustrated in FIG. 34. The horizontal axis represents a position in the stacking direction (range is 2.5 µm). At this time, it can be understood that only a fundamental mode has been generated and the higher-order mode has been suppressed.

Incidentally, a filling factor (FF) of the phase modulation layer 15A is 15% in each of the above structures. The filling factor is a ratio of the area of the modified refractive index region 15b accounting for the single unit constituent region R.

Next, preconditions for the examination will be described. The following examination has been conducted assuming a TE mode. That is, a leakage mode and a TM mode are not considered. In addition, the cladding layer 11 is sufficiently thick, and the influence of the semiconductor substrate 10 is negligible. In addition, a refractive index of the cladding layer 13 is equal to or lower than a refractive index of the cladding layer 11. Then, the active layer 12 (MQW layer) and the light guide layer are regarded as one optical waveguide layer (core layer) having an average dielectric constant and a total film thickness unless otherwise specified. In addition, a dielectric constant of the phase modulation layer 15A is an average dielectric constant based on a filling factor.

Calculation formulas of an average refractive index and the film thickness of the optical waveguide layer including the active layer 12 and the light guide layer are given as follows. That is, $\varepsilon_{score}$ is an average dielectric constant of the optical waveguide layer, and is defined by the following Formula (26). Further, $\varepsilon_i$ is a dielectric constant of each layer, $d_i$ is a thickness of each layer, and $n_i$ is a refractive index of each layer. Further, $n_{core}$ is the average refractive index of the optical waveguide layer and is defined by the following Formula (27). Further, $d_{core}$ is the film thickness of the optical waveguide layer and is defined by the following Formula (28).

$$\varepsilon_{core} = \frac{\sum_{i=1}^{N} \varepsilon_i \cdot d_i}{\sum_{i=1}^{N} d_i} = \frac{\sum_{i=1}^{N} n_i^2 \cdot d_i}{\sum_{i=1}^{N} d_i} \tag{26}$$

$$n_{core} = \sqrt{\varepsilon_{core}} = \sqrt{\frac{\sum_{i=1}^{N} n_i^2 \cdot d_i}{\sum_{i=1}^{N} d_i}} \tag{27}$$

$$d_{core} = \sum_{i=1}^{N} d_i \tag{28}$$

In addition, a calculation formula for an average refractive index of the phase modulation layer 15A is given as follows. That is, $n_{PM}$ is the average refractive index of the phase modulation layer 15A and is defined by the following Formula (29). Further, $\varepsilon_{PM}$ is a dielectric constant of the phase modulation layer 15A, $n_1$ is a refractive index of a first refractive index medium, $n_2$ is a refractive index of a second refractive index medium, and FF is the filling factor.

$$n_{PM} = \varepsilon_{PM} = n_1^2 \cdot FF + n_2^2 \cdot (1 - FF) \tag{29}$$

In the following examination, a waveguide structure has been approximated by a five-layer or six-layer slab waveguide. FIGS. 36A and 36B are a cross-sectional view and a refractive index profile for describing a case where the waveguide structure is approximated by the six-layer slab waveguide. FIGS. 37A and 37B are a cross-sectional view and a refractive index profile for describing a case where the waveguide structure is approximated by the five-layer slab waveguide. As illustrated in FIGS. 36A and 36B, when the refractive index of the phase modulation layer 15A is lower than the refractive index of the cladding layer 11, the phase modulation layer 15A does not have a waveguide function, and thus, the approximation has been made for the six-layer slab waveguide. That is, the optical waveguide layer has a structure that includes the active layer 12 and the light guide layer, but does not include the cladding layer 11, the cladding layer 13, and the phase modulation layer 15A. Such an approximation can be applied to, for example, a structure illustrated in FIGS. 32 and 34 (In this specific example, an InP-based compound semiconductor or a nitride-based compound semiconductor).

In addition, as illustrated in FIGS. 37A and 37B, when the refractive index of the phase modulation layer 15A is equal to or higher than the refractive index of the cladding layer 11, the phase modulation layer 15A has the waveguide function, and thus, the approximation has been made for the five-layer slab waveguide. That is, the optical waveguide layer has a structure that includes the phase modulation layer 15A and the active layer 12, but does not include the cladding layer 11 and the cladding layer 13. Such an approximation can be applied to, for example, a structure illustrated in FIG. 30 (a GaAs-based compound semiconductor in this example).

Further, a calculation range is limited to a peripheral portion of each of the optical waveguide layer and the contact layer having refractive indices higher than an equivalent refractive index of the semiconductor light-emitting element 1A in order to further simplify the calculation. That is, a three-layer slab structure related to the optical waveguide layer is defined by the optical waveguide layer and upper and lower layers adjacent to the optical waveguide layer, and a three-layer slab structure related to the contact layer 14 is defined by the contact layer 14 and adjacent upper and lower layers.

Figure 38A:
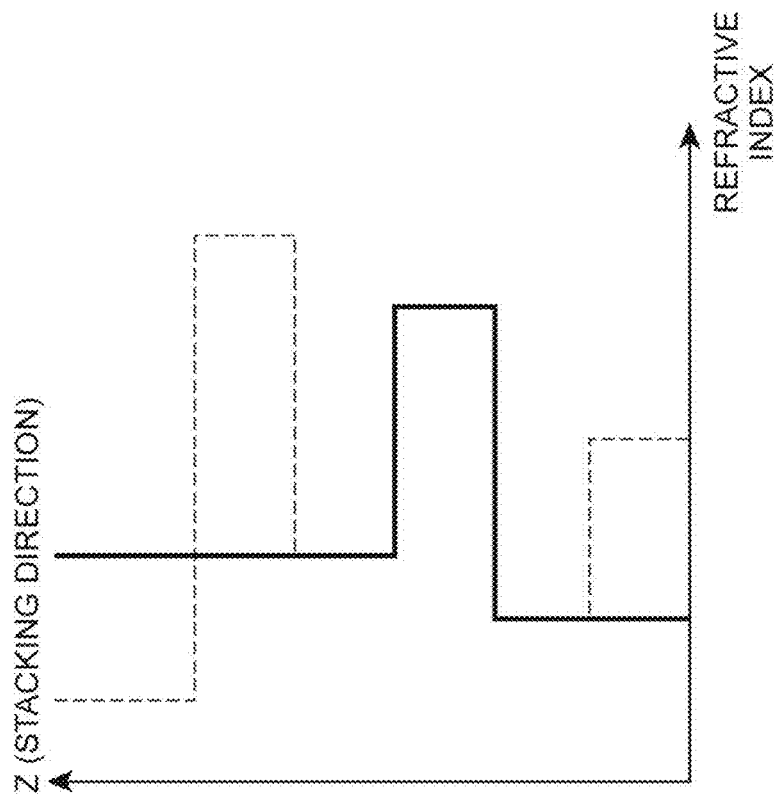
FIGS. 38A and 38B are a cross-sectional view and a refractive index profile illustrating a three-layer slab structure related to an optical waveguide layer in the six-layer slab waveguide.
Figure 38B:
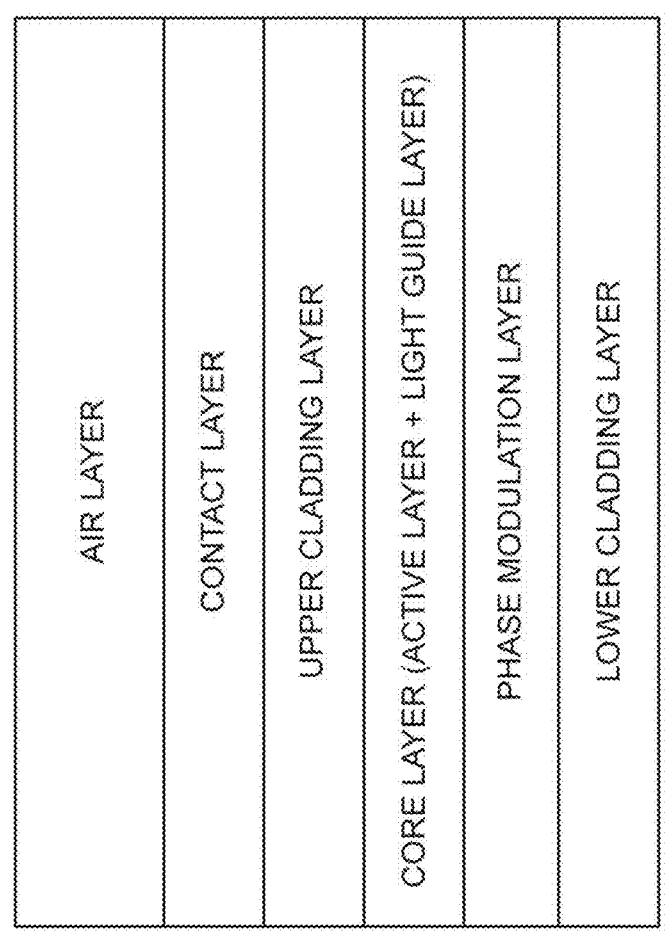

FIGS. 38A and 38B illustrate a cross-sectional view and a refractive index profile for describing the three-layer slab structure related to the optical waveguide layer in the six-layer slab waveguide (see FIGS. 36A and 36B). In this case, a guided mode of the optical waveguide layer is calculated based on a refractive index profile indicated by the solid line in the refractive index profile of FIG. 38B. In addition, FIGS. 39A and 39B illustrate a cross-sectional view and a refractive index profile for describing the three-layer slab structure related to the contact layer 14 in the six-layer slab waveguide (see FIGS. 36A and 36B). In this case, a guided mode of the contact layer 14 is calculated based on a refractive index profile illustrated by the solid line in FIG. 39B.

Figure 40B:
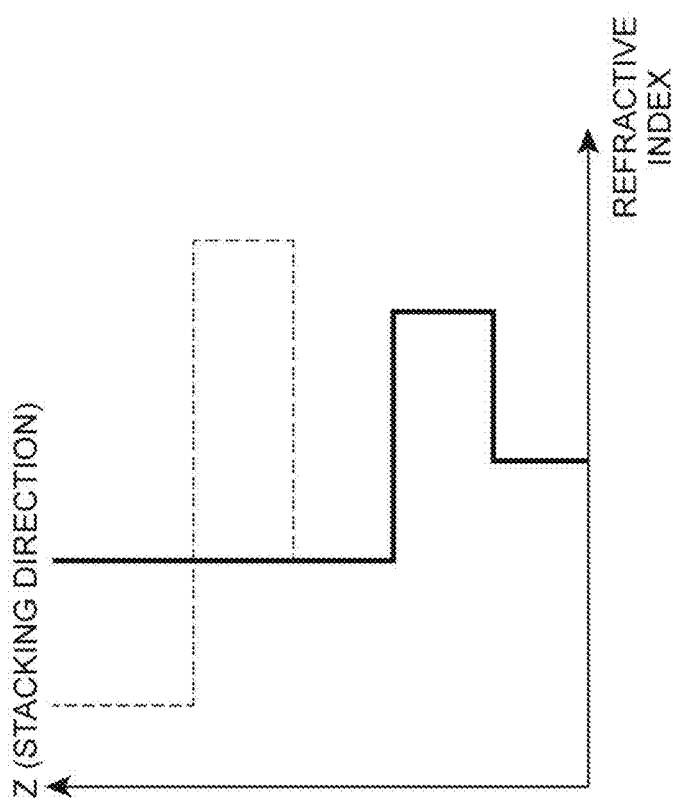
FIGS. 40A and 40B are a cross-sectional view and a refractive index profile illustrating a three-layer slab structure related to an optical waveguide layer in the five-layer slab waveguide.
Figure 40A:
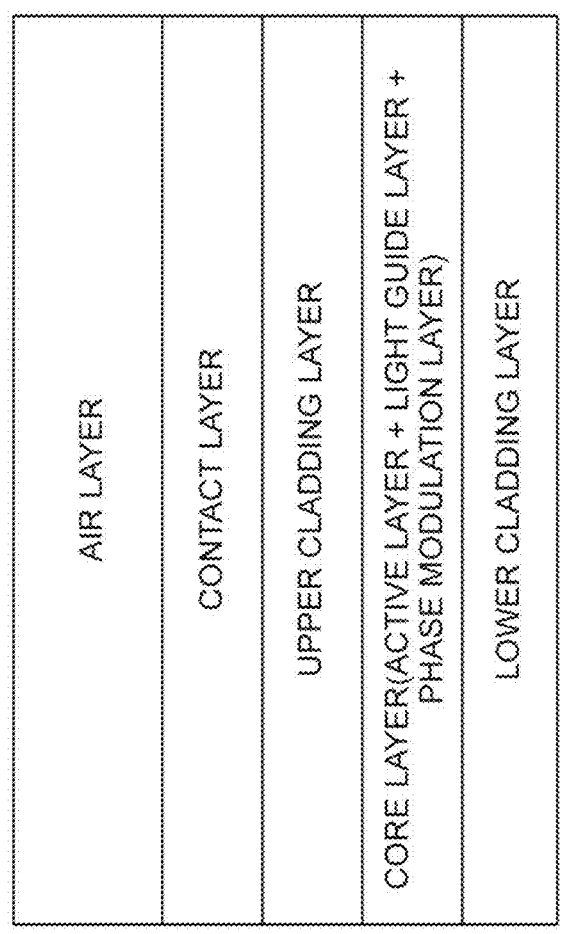

FIGS. 40A and 40B illustrate a cross-sectional view and a refractive index profile for describing the three-layer slab structure related to the optical waveguide layer in the five-layer slab waveguide (see FIGS. 37A and 37B). In this case, a guided mode of the optical waveguide layer is calculated based on a refractive index profile indicated by the solid line in FIG. 40B. In addition, FIGS. 41A and 41B illustrate a cross-sectional view and a refractive index profile for describing the three-layer slab structure related to the contact layer 14 in the five-layer slab waveguide (see FIGS. 37A and 37B). In this case, a guided mode of the contact layer 14 is calculated based on a refractive index profile indicated by the solid line in FIG. 41B.

Incidentally, the refractive index of the cladding layer 11 needs to be equal to or lower than the equivalent refractive index of the semiconductor light-emitting element 1A in order to prevent the guided mode from leaking to the semiconductor substrate 10 via the cladding layer 11 at the time of the approximation by the above-described three-layer slab structure.

Here, an analytical expression of the three-layer slab structure will be described. FIGS. 42A and 42B illustrate a three-layer slab structure 30 including the cladding layer 11, the optical waveguide layer 31, and the cladding layer 13, and a refractive index profile thereof. Here, the refractive index of the cladding layer 11 is $n_2$, the refractive index of the optical waveguide layer 31 is $n_1$, and the refractive index of the cladding layer 13 is $n_3$. Then, when the normalized waveguide width $V_1$ of the optical waveguide layer 31 is defined by the above Formula (1), the guided mode is set to only the fundamental mode within a range where there is only one solution of the normalized waveguide width $V_1$. However, when examining the guided modes of the above-described five-layer slab structure and six-layer slab structure with the analytical expression of the three-layer slab structure, the condition expressed by the above Formula (2) also needs to be satisfied since it is necessary for the guided mode not to leak to the cladding layer 11.

Regarding the contact layer 14, the cladding layer 11, the optical waveguide layer 31, and the cladding layer 13 may be replaced with the cladding layer 13, the contact layer 14, and an air layer, respectively, in FIGS. 42A and 42B. Then, assuming that the refractive index of the contact layer 14 is $n_4$ and a refractive index of the air layer is $n_5$, the above Formula (5) related to the normalized waveguide width $V_2$ of the contact layer 14 is obtained. Then, no guided mode exists in the contact layer 14 in a range where there is no solution of the normalized waveguide width $V_2$. However, when examining the guided modes of the above-described five-layer slab structure and six-layer slab structure with the analytical expression of the three-layer slab structure, the condition expressed by the above Formula (6) also needs to be satisfied since it is necessary for the guided mode not to leak to the cladding layer 11.

Incidentally, it has been confirmed that the thickness of the cladding layer 13 has no influence on the guided mode by changing the thickness of the cladding layer 13 and analyzing the guided mode thus generated.

(When Semiconductor Light-Emitting Element 1A is Made of GaAs-Based Compound Semiconductor)

FIG. 43 is a table illustrating an example of a five-layer slab structure when the semiconductor light-emitting element 1A is made of a GaAs-based compound semiconductor. A range of a film thickness of the optical waveguide layer (layer number 4) and a contact layer (layer number 2) in this five-layer slab structure can be obtained by the following calculation.

Figure 45:
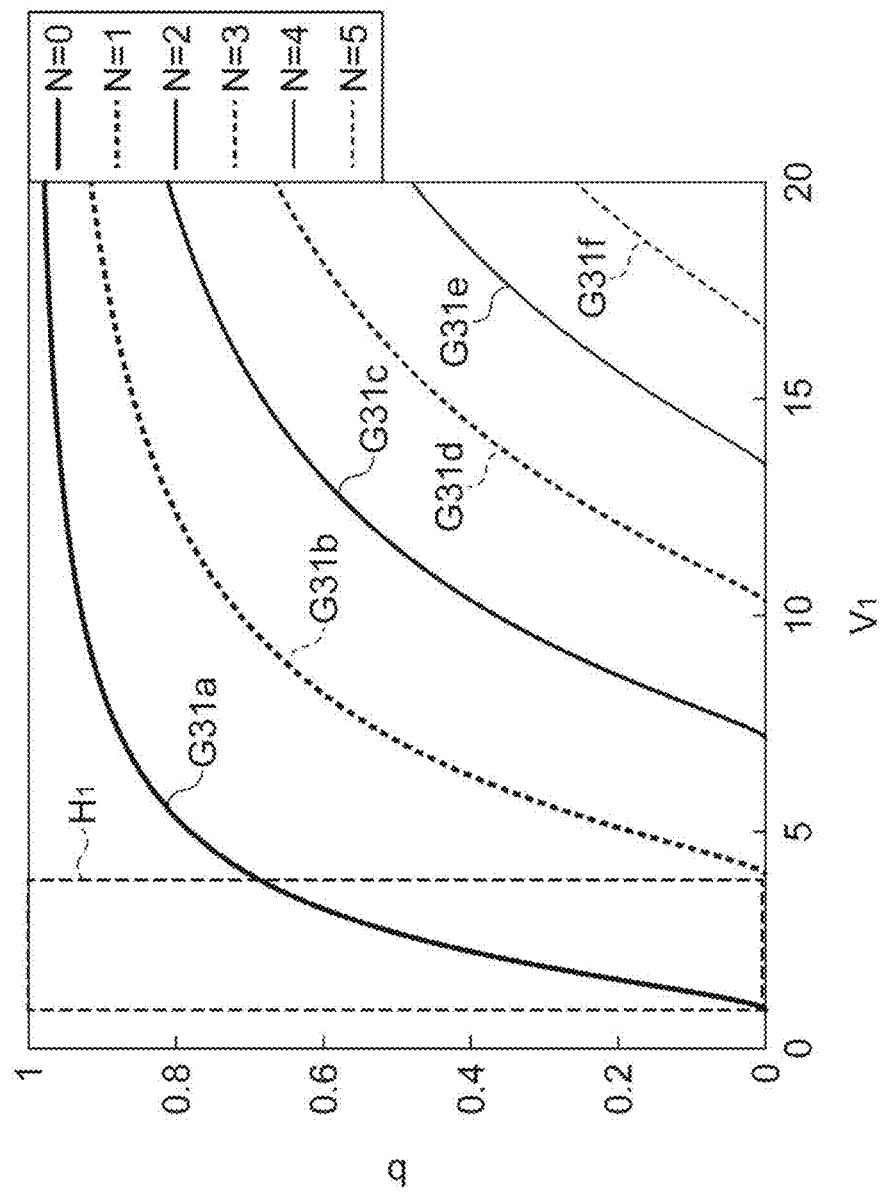
FIG. 45 is a graph illustrating a relationship between a normalized waveguide width $V_1$ of an optical waveguide layer expressed by Formulas (1) and (2) and a normalized propagation coefficient b.

FIG. 44A is a table illustrating the refractive indices $n_1$, $n_2$, and $n_3$, the asymmetric parameter a', and the refractive index $n_{clad}$ of the cladding layer 11 used in the calculation. In this case, FIG. 45 illustrates a relationship between the normalized waveguide width $V_1$ of the optical waveguide layer and the normalized propagation coefficient b expressed by the above Formulas (1) and (2). In FIG. 45, graphs G31a to G31f illustrate cases where a mode order N=0 to 5, respectively. In this graph, the guided mode is set to only the fundamental mode (that is, N=0) in the range where the normalized waveguide width $V_1$ has one solution, and is inside a range $H_1$. The range $H_1$ is a range having a value of the normalized waveguide width $V_1$ corresponding to N=0 when the normalized propagation coefficient b is 0 as a lower limit value and a value of the normalized waveguide width $V_1$ corresponding to N=1 when the normalized propagation coefficient b is 0 as an upper limit value. FIG. 44B is a table illustrating calculation results of such lower limit value and upper limit value.

Figure 47:
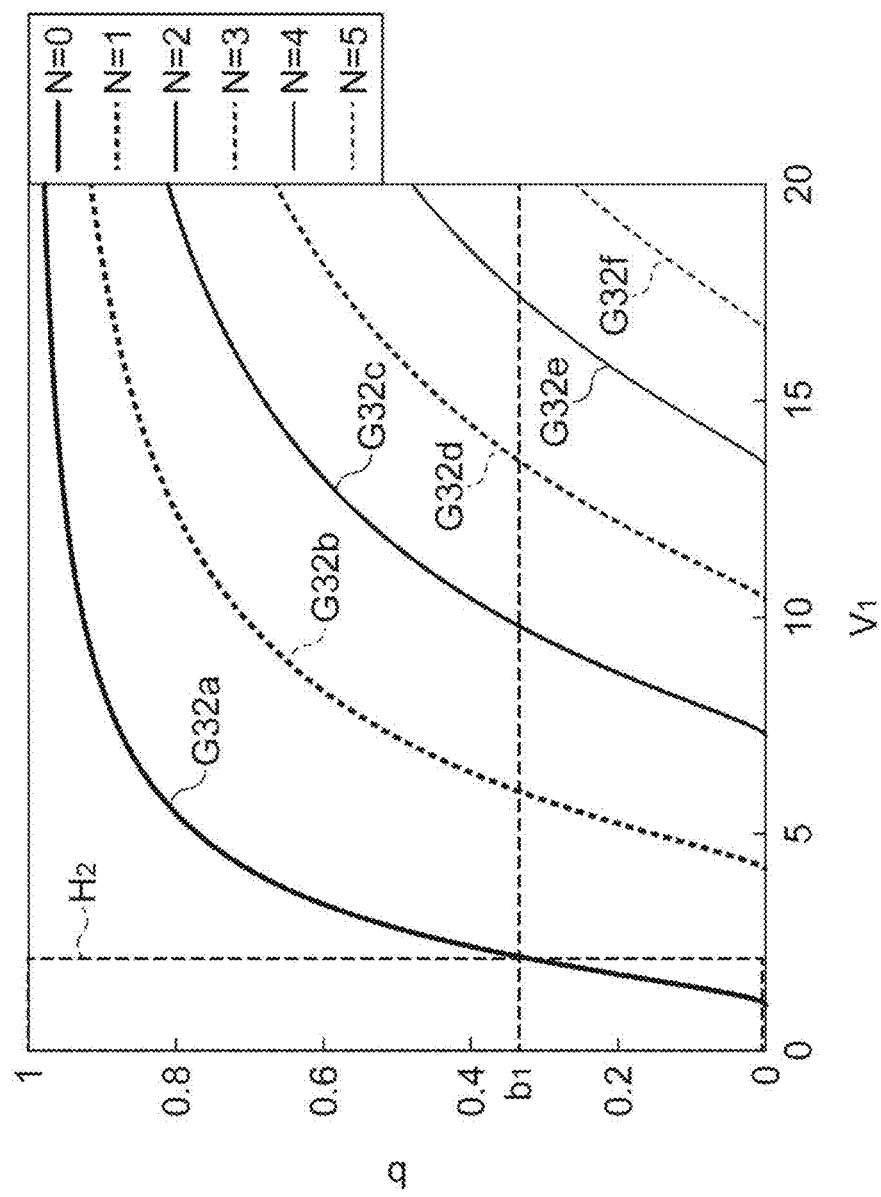
FIG. 47 is a graph illustrating a relationship between a normalized waveguide width $V_2$ of a contact layer expressed by Formulas (5) and (6) and the normalized propagation coefficient b.

In addition, FIG. 46A is a table illustrating the refractive indices $n_4$, $n_5$, and $n_6$, the asymmetric parameter a', and the refractive index $n_{clad}$ of the cladding layer 11 used in the calculation. In this case, FIG. 47 illustrates a relationship between the normalized waveguide width $V_2$ of the contact layer 14 and the normalized propagation coefficient b expressed by the above Formulas (5) and (6). In FIG. 47, graphs G32a to G32f illustrate cases where the mode order N=0 to 5, respectively. In the graph, no guided mode caused by the contact layer 14 is generated, and the guided mode of the semiconductor light-emitting element 1A is set to only the fundamental mode of the optical waveguide layer in a range where there is no solution of the normalized waveguide width $V_2$, and is inside a range $H_2$. The range $H_2$ is a range having 0 as a lower limit value and a value of the normalized waveguide width $V_2$ corresponding to N=0 when the normalized propagation coefficient b is a value $b_1$ corresponding to the refractive index of the cladding layer 11 as an upper limit value. FIG. 46B is a table illustrating a calculation result of such an upper limit value.

Figure 48:
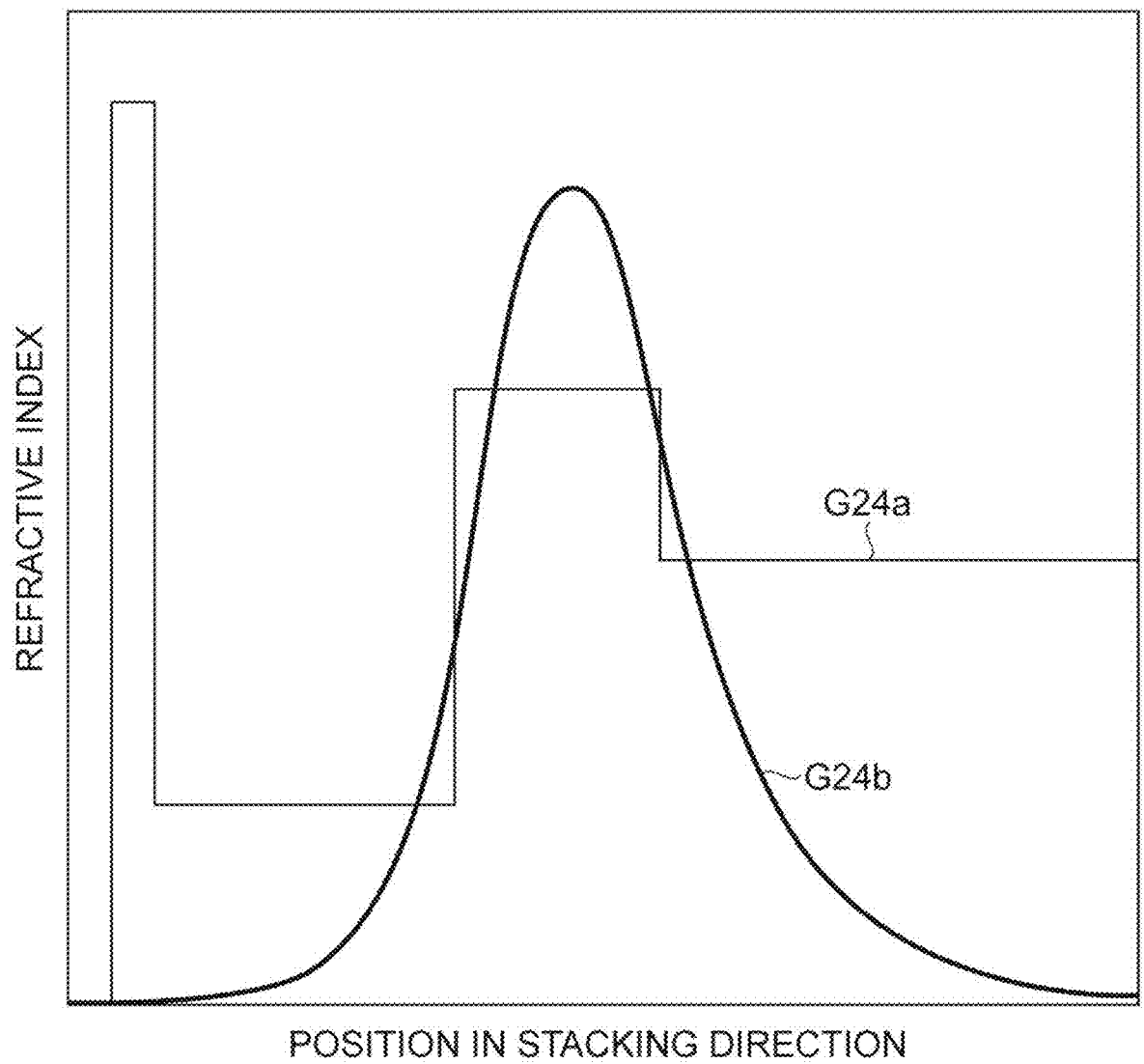
FIG. 48 illustrates a refractive index profile and a mode distribution of the semiconductor light-emitting element having the layer structure illustrated in FIG. 43.

FIG. 48 illustrates a refractive index profile G24a and a mode distribution G24b of the semiconductor light-emitting element 1A having the layer structure illustrated in FIG. 43. It can be understood that only the fundamental mode has been generated remarkably, and the higher-order mode has been suppressed.

(When Semiconductor Light-Emitting Element 1A is Made of InP-Based Compound Semiconductor)

FIG. 49 is a table illustrating an example of a six-layer slab structure when the semiconductor light-emitting element 1A is made of an InP-based compound semiconductor. A range of a film thickness of the optical waveguide layer (layer number 5) and a contact layer (layer number 2) in this six-layer slab structure can be obtained by the following calculation.

Figure 51:
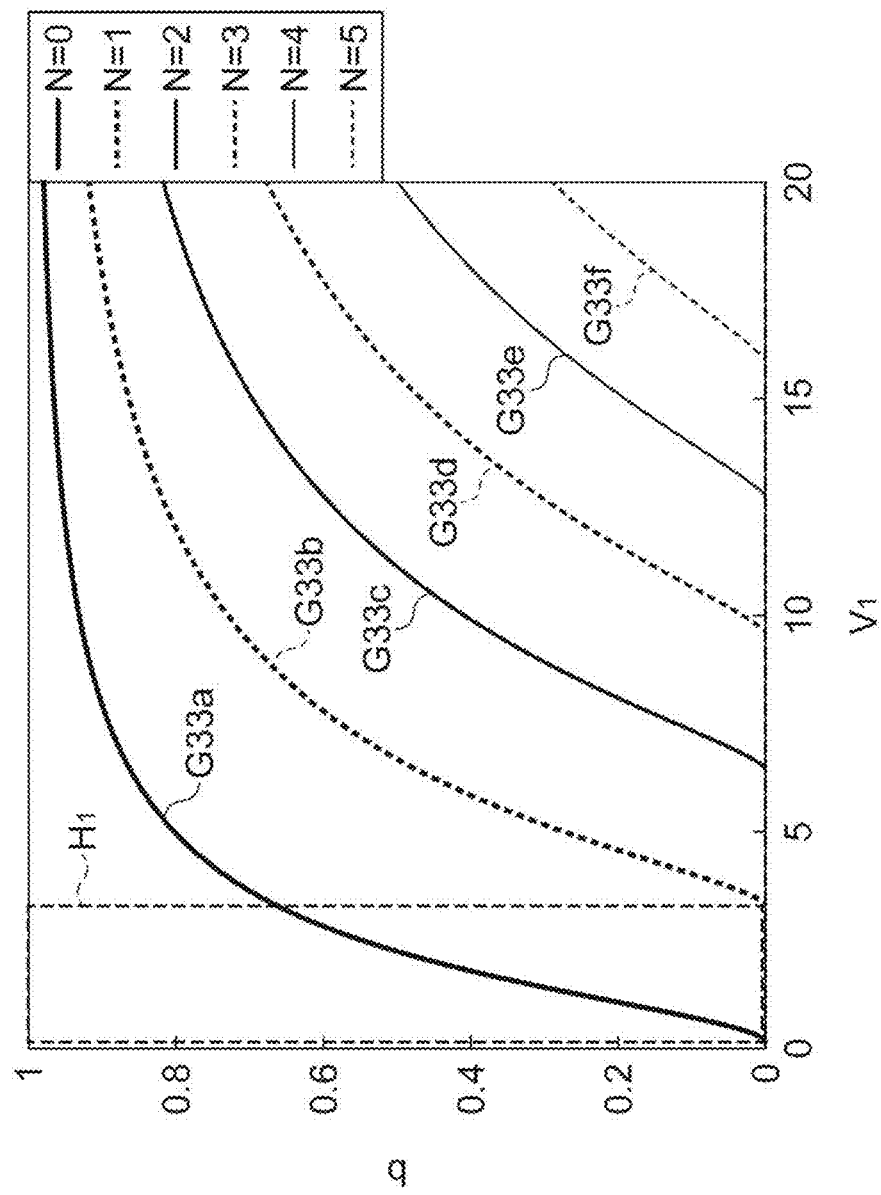
FIG. 51 is a graph illustrating a relationship between the normalized waveguide width $V_1$ of an optical waveguide layer expressed by Formulas (1) and (2) and the normalized propagation coefficient b.

FIG. 50A is a table illustrating the refractive indices $n_1$, $n_2$, and $n_3$, the asymmetric parameter a', and the refractive index $n_{clad}$ of the cladding layer 11 used in the calculation. In this case, FIG. 51 illustrates a relationship between the normalized waveguide width $V_1$ of the optical waveguide layer and the normalized propagation coefficient b expressed by the above Formulas (1) and (2). In FIG. 51, graphs G33a to G33f illustrate cases where the mode order N=0 to 5, respectively. In this graph, the guided mode is set to only the fundamental mode (that is, N=0) in the range where the normalized waveguide width $V_1$ has one solution, and is inside a range $H_1$. Incidentally, a definition of the range $H_1$ is the same as that in the case of the GaAs-based compound semiconductor described above. FIG. 50B is a table illustrating calculation results of a lower limit value and an upper limit value.

Figure 53:
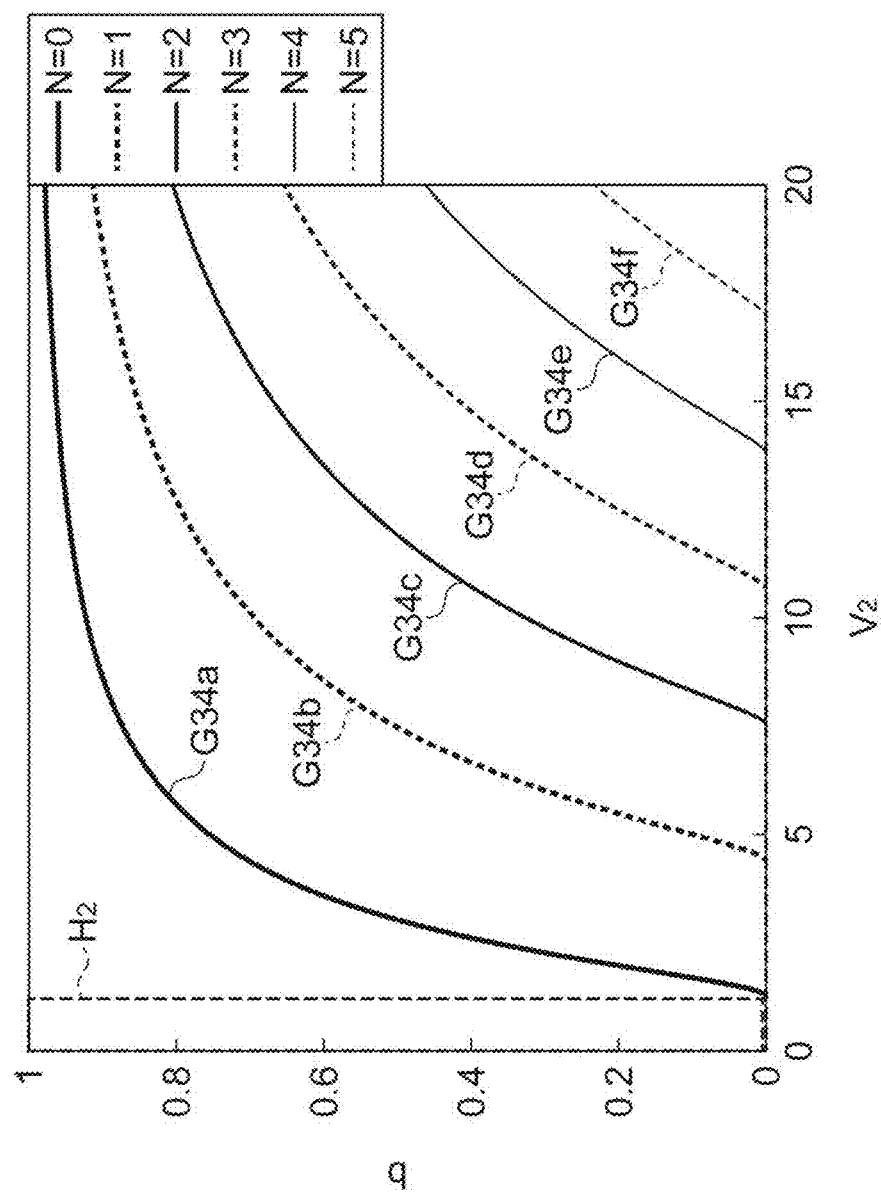
FIG. 53 is a graph illustrating a relationship between the normalized waveguide width $V_2$ of a contact layer expressed by Formulas (5) and (6) and the normalized propagation coefficient b.

In addition, FIG. 52A is a table illustrating the refractive indices $n_4$, $n_5$, and $n_6$, the asymmetric parameter a', and the refractive index $n_{clad}$ of the cladding layer 11 used in the calculation. In this case, the graph of FIG. 53 illustrates a relationship between the normalized waveguide width $V_2$ of the contact layer 14 and the normalized propagation coefficient b expressed by the above Formulas (5) and (6). In FIG. 53, graphs G34a to G34f illustrate cases where the mode order N=0 to 5, respectively. In the graph, no guided mode caused by the contact layer 14 is generated, and the guided mode of the semiconductor light-emitting element 1A is set to only the fundamental mode of the optical waveguide layer in a range where there is no solution of the normalized waveguide width $V_2$, and is inside a range $H_2$. A definition of the range $H_2$ is the same as that in the case of the GaAs-based compound semiconductor described above. FIG. 52B is a table illustrating a calculation result of such an upper limit value.

Figure 54:
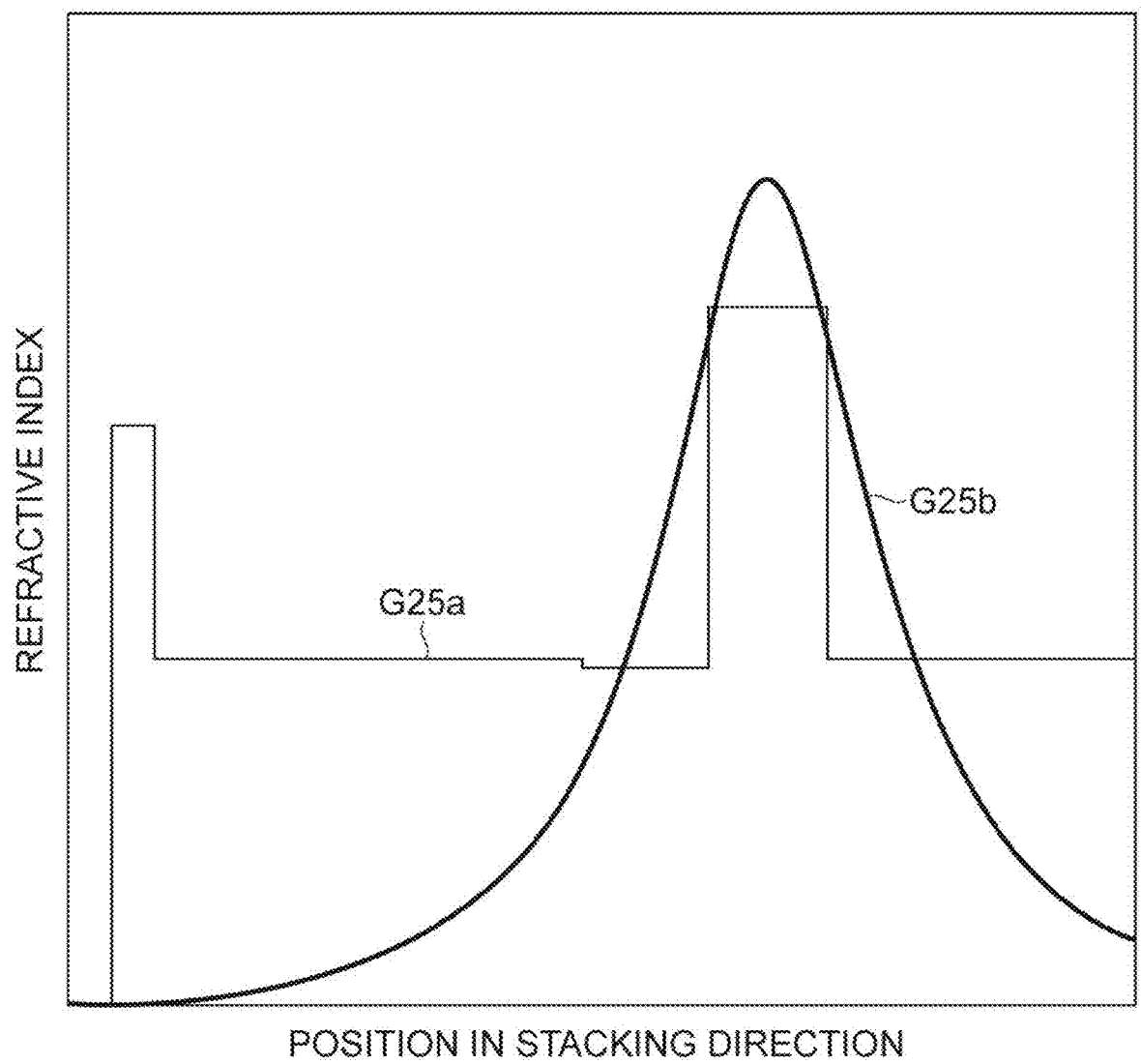
FIG. 54 illustrates a refractive index profile and a mode distribution of the semiconductor light-emitting element having the layer structure illustrated in FIG. 49.

FIG. 54 illustrates a refractive index profile G25a and a mode distribution G25b of the semiconductor light-emitting element 1A having the layer structure illustrated in FIG. 49. It can be understood that only the fundamental mode has been generated remarkably, and the higher-order mode has been suppressed.

(When Semiconductor Light-Emitting Element 1A is Made of Nitride-Based Compound Semiconductor)

FIG. 55 is a table illustrating an example of a six-layer slab structure when the semiconductor light-emitting element 1A is made of a nitride-based compound semiconductor. A range of a film thickness of the optical waveguide layer (layer number 4) and a contact layer (layer number 2) in this six-layer slab structure can be obtained by the following calculation.

Figure 57:
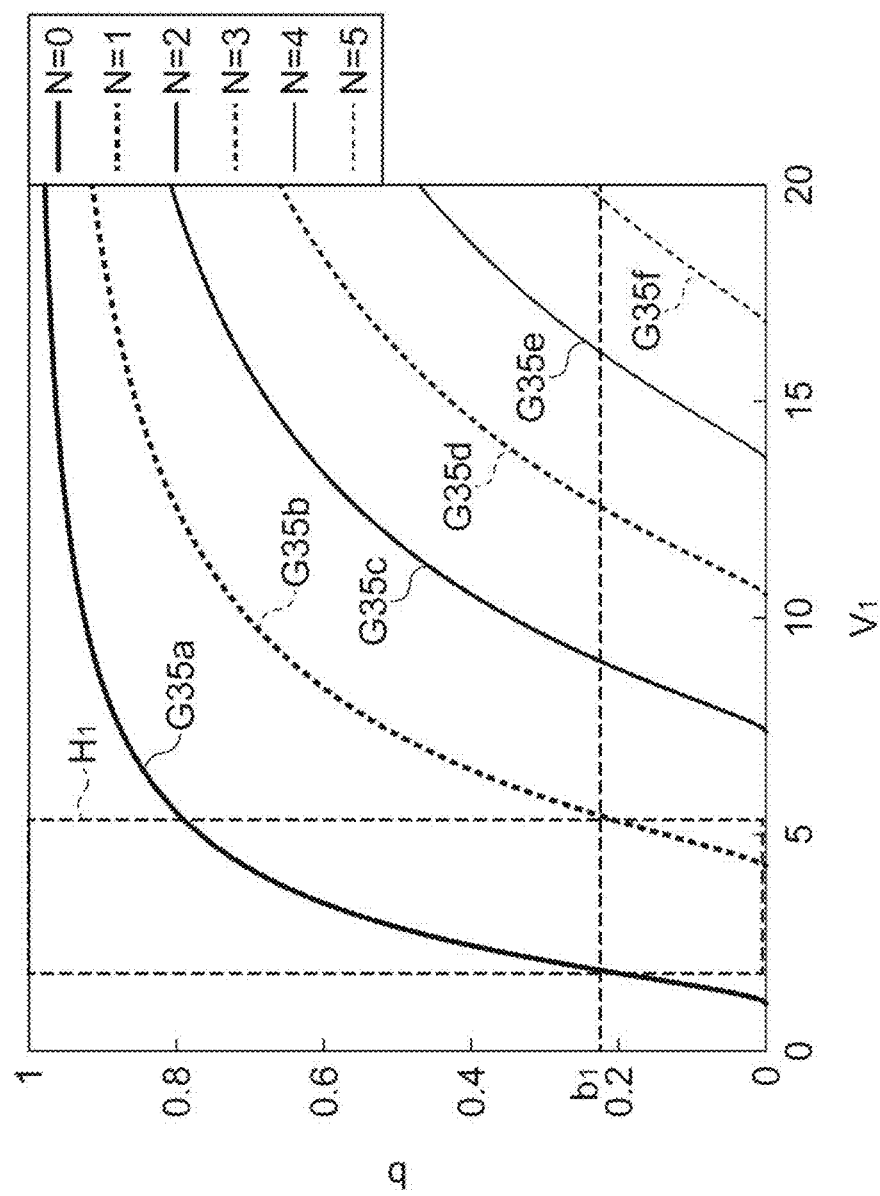
FIG. 57 is a graph illustrating a relationship between the normalized waveguide width $V_1$ of an optical waveguide layer expressed by Formulas (1) and (2) and the normalized propagation coefficient b.

FIG. 56A is a table illustrating the refractive indices $n_1$, $n_2$, and $n_3$, the asymmetric parameter a', and the refractive index $n_{clad}$ of the cladding layer 11 used in the calculation. In this case, FIG. 57 illustrates a relationship between the normalized waveguide width $V_1$ of the optical waveguide layer and the normalized propagation coefficient b expressed by the above Formulas (1) and (2). In FIG. 57, graphs G35a to G35f illustrate cases where the mode order N=0 to 5, respectively. In this graph, the guided mode is set to only the fundamental mode (that is, N=0) in the range where the normalized waveguide width $V_1$ has one solution, and is inside a range $H_1$. The range $H_1$ is a range having a value of the normalized waveguide width $V_1$ corresponding to N=0 when the normalized propagation coefficient b is the value $b_1$ as a lower limit value and a value of the normalized waveguide width $V_1$ corresponding to N=1 when the normalized propagation coefficient b is the value $b_1$ as an upper limit value. FIG. 56B is a table illustrating calculation results of a lower limit value and an upper limit value.

Figure 59:
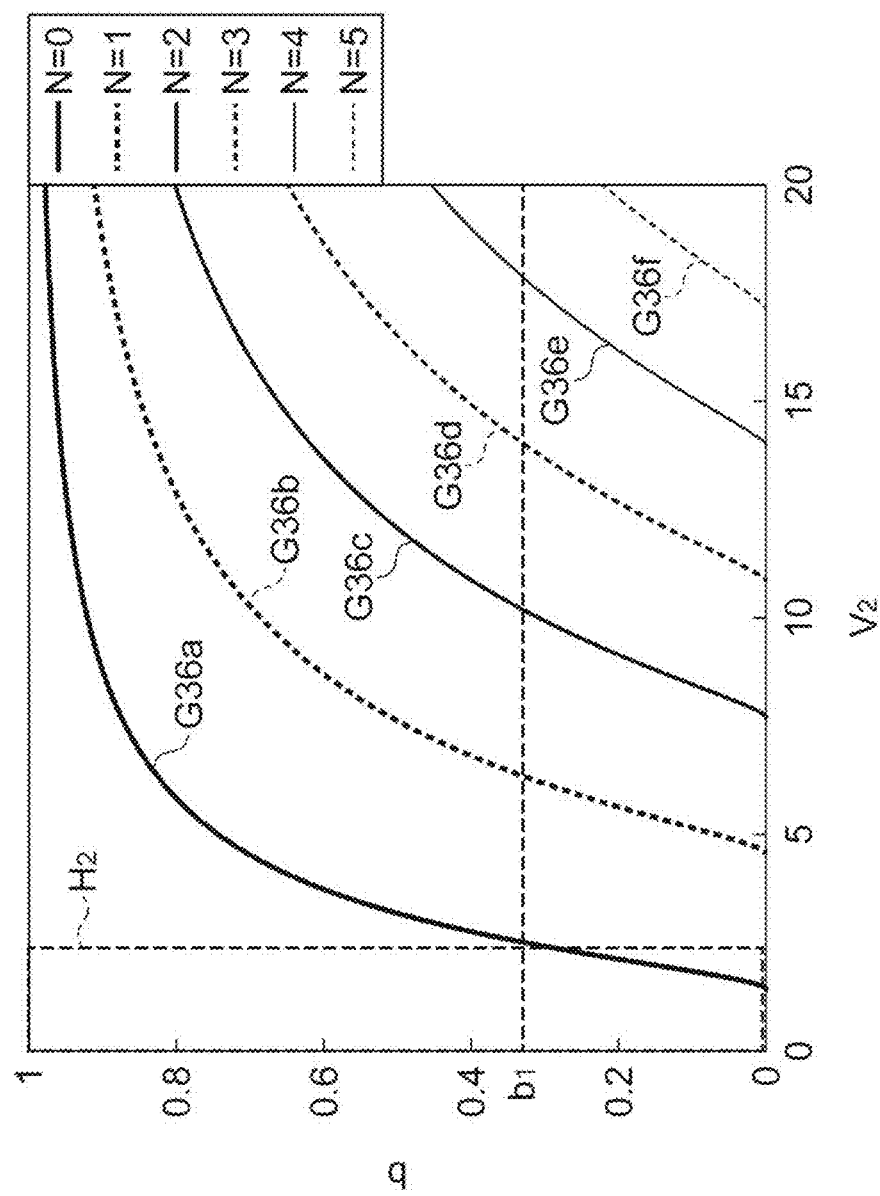
FIG. 59 is a graph illustrating a relationship between the normalized waveguide width $V_2$ of a contact layer expressed by Formulas (5) and (6) and the normalized propagation coefficient b.

In addition, FIG. 58A is a table illustrating the refractive indices $n_4$, $n_5$, and $n_6$, the asymmetric parameter a', and the refractive index $n_{clad}$ of the cladding layer 11 used in the calculation. In this case, FIG. 59 illustrates a relationship between the normalized waveguide width $V_2$ of the contact layer 14 and the normalized propagation coefficient b expressed by the above Formulas (5) and (6). In FIG. 59, graphs G36a to G36f illustrate cases where the mode order N=0 to 5, respectively. In the graph, no guided mode caused by the contact layer 14 is generated, and the guided mode of the semiconductor light-emitting element 1A is set to only the fundamental mode of the optical waveguide layer in a range where there is no solution of the normalized waveguide width $V_2$, and is inside a range $H_2$. A definition of the range $H_2$ is the same as that in the case of the GaAs-based compound semiconductor described above. FIG. 58B is a table illustrating a calculation result of such an upper limit value.

Figure 60:
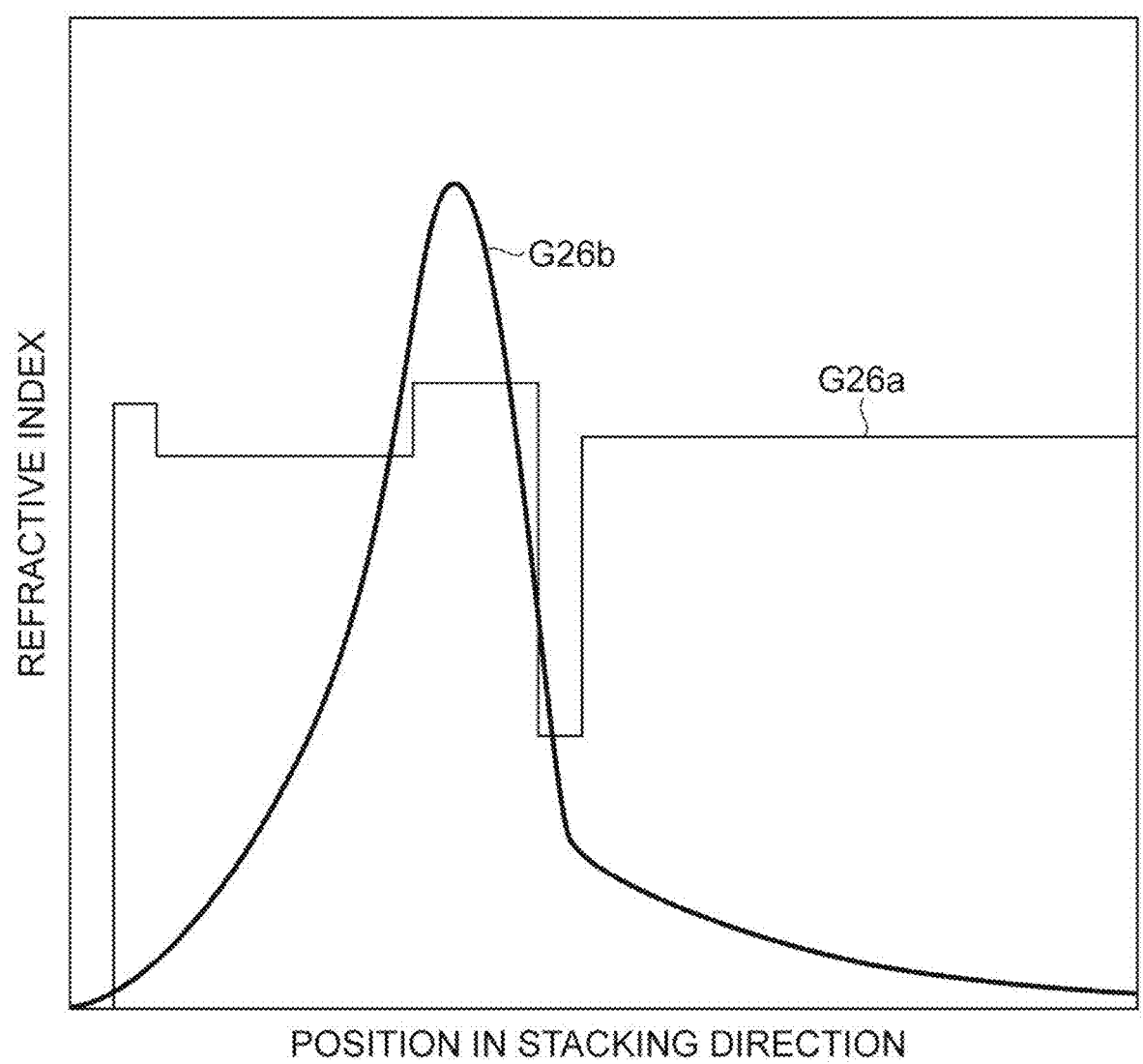
FIG. 60 illustrates a refractive index profile and a mode distribution of the semiconductor light-emitting element having the layer structure illustrated in FIG. 55.

FIG. 60 illustrates a refractive index profile G26a and a mode distribution G26b of the semiconductor light-emitting element 1A having the layer structure illustrated in FIG. 55. It can be understood that only the fundamental mode has been generated remarkably, and the higher-order mode has been suppressed.

The light-emitting device and the production method for the same according to the invention are not limited to the above-described embodiments, and various other modifications can be made. For example, the semiconductor light-emitting element made of the semiconductor of GaAs-base, InP-base, and nitride-base (particularly, GaN-base) compound semiconductors has been exemplified in the above-described embodiments, but the invention can be applied to semiconductor light-emitting elements made of various semiconductor materials other than these.

In addition, the example in which the active layer 12 provided on the semiconductor substrate 10 common to the phase modulation layer 15A is used as the light-emitting portion has been described in the above-described embodiments, but the light-emitting portion may be provided separately from the semiconductor substrate 10 in the invention. The same effects as those in the above-described embodiments can be suitably obtained even with such a separated configuration as long as the light-emitting portion is a portion that is optically coupled to a phase modulation layer and supplies light to the phase modulation layer.

REFERENCE SIGNS LIST 1A, 1B, 1C, 1D . . . semiconductor light-emitting element; 1E . . . light-emitting device; 4 . . . drive circuit; 6 . . . support substrate; 7 . . . control circuit; 10 . . . semiconductor substrate; 10a . . . main surface; 10b . . . rear surface; 11, 13 . . . cladding layer; 12 . . . active layer; 14 . . . contact layer; 14a . . . opening; 15A . . . phase modulation layer; 15a . . . base layer; 15b, 15c . . . modified refractive index region; 16, 17 . . . electrode; 17a . . . opening; 18, 24 . . . protective film; 19, 25 . . . anti-reflection film; 21 . . . current confinement layer; 21a . . . opening; 22, 23 . . . electrode; 23a . . . opening; AU, AD, AR, AL . . . traveling wave; AX . . . axis; BD, BL, BR, BU . . . beam pattern; D . . . straight line; EG . . . etching reaction gas; G . . . gravity center; O . . . lattice point; Q . . . center; R . . . unit constituent region; RIN . . . inner region; ROUT . . . outer region; and θ . . . tilt angle.

The invention claimed is:

1. A light-emitting device that outputs light to form an optical image in at least any one direction of a normal direction of a main surface and an inclination direction inclined with respect to the normal direction, the light-emitting device comprising:

a substrate having the main surface;
a light-emitting portion provided on the substrate; and
a phase modulation layer provided on the substrate in a state of being optically coupled to the light-emitting portion, the phase modulation layer including a base layer and a plurality of modified refractive index regions having a refractive index different from a refractive index of the base layer,
wherein the plurality of modified refractive index regions are arranged at predetermined positions in the base layer in accordance with an arrangement pattern for formation of the optical image on a design plane of the phase modulation layer orthogonal to the normal direction,
each of the plurality of modified refractive index regions has a three-dimensional shape defined by a first surface facing the main surface, a second surface positioned on a side opposite to the main surface with respect to the first surface, and a side surface connecting the first surface and the second surface, and
at least one of the first surface, the second surface, and the side surface in the three-dimensional shape has a portion inclined with respect to the main surface, wherein
each of the plurality of modified refractive index regions is arranged so as to have one-to-one correspondence with any lattice point of a virtual square lattice on the design plane of the phase modulation layer, and
a line segment connecting an arbitrary specific lattice point among a plurality of valid lattice points, associated with the plurality of modified refractive index regions among lattice points constituting the virtual square lattice, and a gravity center of a specific modified refractive index region associated with the specific lattice point is parallel to each of line segments respectively connecting a plurality of peripheral lattice points adjacent to the specific lattice point at a shortest distance and gravity centers of a plurality of peripheral modified refractive index regions associated with the plurality of peripheral lattice points.

2. The light-emitting device according to claim 1, wherein each of the plurality of modified refractive index regions is a closed space defined by the base layer and one or more layers in contact with the base layer, and
each of the plurality of modified refractive index regions has a planar shape in which a width along a first direction on the design plane gradually decreases along a second direction intersecting the first direction on the design plane of the phase modulation layer.

3. The light-emitting device according to claim 1, wherein each of the plurality of modified refractive index regions is a closed space defined by the base layer and one or more layers in contact with the base layer, and
at least a portion of the first surface is inclined with respect to the second surface.

4. The light-emitting device according to claim 1, wherein the light-emitting portion is an active layer provided on the substrate.

5. A production method for the light-emitting device as defined in claim 1, the production method comprising:
a first step of providing the base layer on the substrate; and
a second step of forming a plurality of holes or depressions that are to serve as the plurality of modified refractive index regions in the base layer by dry etching, wherein the dry etching is performed by applying an etching reaction gas to the base layer from a direction inclined with respect to the normal direction in the second step.

6. A light-emitting device that outputs light to form an optical image in at least any one direction of a normal direction of a main surface and an inclination direction inclined with respect to the normal direction, the light-emitting device comprising:

a substrate having the main surface;
a light-emitting portion provided on the substrate; and
a phase modulation layer provided on the substrate in a state of being optically coupled to the light-emitting portion, the phase modulation layer including a base layer and a plurality of modified refractive index regions having a refractive index different from a refractive index of the base layer,
wherein the plurality of modified refractive index regions are arranged at predetermined positions in the base layer in accordance with an arrangement pattern for formation of the optical image on a design plane of the phase modulation layer orthogonal to the normal direction,
each of the plurality of modified refractive index regions has a three-dimensional shape defined by a first surface facing the main surface, a second surface positioned on a side opposite to the main surface with respect to the first surface, and a side surface connecting the first surface and the second surface, and
at least one of the first surface, the second surface, and the side surface in the three-dimensional shape has a portion inclined with respect to the main surface, wherein
each of the plurality of modified refractive index regions is arranged so as to have one-to-one correspondence with any lattice point of a virtual square lattice on the design plane of the phase modulation layer, and
a line segment connecting any specific lattice point among a plurality of valid lattice points, associated with the plurality of modified refractive index regions among lattice points constituting the virtual square lattice, and a gravity center of a specific modified refractive index region associated with the specific lattice point is parallel to each of line segments respectively connecting remaining valid lattice points excluding the specific lattice point and remaining modified refractive index regions associated with the remaining valid lattice points.

7. The light-emitting device according to claim 6, wherein
each of the plurality of modified refractive index regions is a closed space defined by the base layer and one or more layers in contact with the base layer, and
each of the plurality of modified refractive index regions has a planar shape in which a width along a first direction on the design plane gradually decreases along a second direction intersecting the first direction on the design plane of the phase modulation layer.

8. The light-emitting device according to claim 6, wherein
each of the plurality of modified refractive index regions is a closed space defined by the base layer and one or more layers in contact with the base layer, and
at least a portion of the first surface is inclined with respect to the second surface.

9. The light-emitting device according to claim 6, wherein the light-emitting portion is an active layer provided on the substrate.

10. A production method for the light-emitting device as defined in claim 6, the production method comprising:

a first step of providing the base layer on the substrate; and
a second step of forming a plurality of holes or depressions that are to serve as the plurality of modified refractive index regions in the base layer by dry etching,
wherein the dry etching is performed by applying an etching reaction gas to the base layer from a direction inclined with respect to the normal direction in the second step.

11. A production method for a light-emitting device that outputs light to form an optical image in at least any one direction of a normal direction of a main surface and an inclination direction inclined with respect to the normal direction, the light-emitting device comprising:
a substrate having the main surface;
a light-emitting portion provided on the substrate; and
a phase modulation layer provided on the substrate in a state of being optically coupled to the light-emitting portion, the phase modulation layer including a base layer and a plurality of modified refractive index regions having a refractive index different from a refractive index of the base layer,
wherein the plurality of modified refractive index regions are arranged at predetermined positions in the base layer in accordance with an arrangement pattern for formation of the optical image on a design plane of the phase modulation layer orthogonal to the normal direction,
each of the plurality of modified refractive index regions has a three-dimensional shape defined by a first surface facing the main surface, a second surface positioned on a side opposite to the main surface with respect to the first surface, and a side surface connecting the first surface and the second surface, and
at least one of the first surface, the second surface, and the side surface in the three-dimensional shape has a portion inclined with respect to the main surface,
the production method comprising:
a first step of providing the base layer on the substrate;
a second step of forming a plurality of holes or depressions that are to serve as the plurality of modified refractive index regions in the base layer by dry etching; and
a third step of forming a cap layer on the base layer, the cap layer covering opening portions of the plurality of holes or depressions formed in the base layer,
wherein a material gas for formation of the cap layer is applied to the base layer from a direction inclined with respect to the normal direction in the third step.

12. The production method according to claim 11, wherein
a direction in which an etching reaction gas for formation of the plurality of holes or depressions is supplied is different from the direction in which the material gas is supplied.

13. The production method according to claim 11, wherein
in the light-emitting device, each of the plurality of modified refractive index regions is a closed space defined by the base layer and one or more layers in contact with the base layer, and
each of the plurality of modified refractive index regions has a planar shape in which a width along a first direction on the design plane gradually decreases along a second direction intersecting the first direction on the design plane of the phase modulation layer.

14. The production method according to claim 11, wherein in the light-emitting device, each of the plurality of modified refractive index regions is a closed space defined by the base layer and one or more layers in contact with the base layer, and at least a portion of the first surface is inclined with respect to the second surface.

15. The production method according to claim 11, wherein in the light-emitting device, the light-emitting portion is an active layer provided on the substrate.

\* \* \* \* \*